US009921261B2

(12) United States Patent
Faifer et al.

(10) Patent No.: US 9,921,261 B2
(45) Date of Patent: Mar. 20, 2018

(54) METHOD AND APPARATUS FOR NON-CONTACT MEASUREMENT OF SHEET RESISTANCE AND SHUNT RESISTANCE OF P-N JUNCTIONS

(71) Applicant: KLA-Tencor Corporation, Milpitas, CA (US)

(72) Inventors: Vladimir N. Faifer, Santa Clara, CA (US); Ian Sierra Gabriel Kelly-Morgan, San Francisco, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 84 days.

(21) Appl. No.: 14/516,556

(22) Filed: Oct. 16, 2014

(65) Prior Publication Data

US 2015/0241512 A1 Aug. 27, 2015

Related U.S. Application Data

(60) Provisional application No. 61/892,375, filed on Oct. 17, 2013, provisional application No. 61/892,387, (Continued)

(51) Int. Cl.
*G01R 31/308* (2006.01)
*G01R 31/265* (2006.01)
(Continued)

(52) U.S. Cl.
CPC ..... *G01R 31/2656* (2013.01); *G01R 31/2648* (2013.01); *G01R 31/2831* (2013.01); *G01R 31/308* (2013.01)

(58) Field of Classification Search
CPC .............. G01R 31/265; G01R 31/2656; G01R 31/2648; G01R 31/2831; G01R 31/302; (Continued)

(56) References Cited

U.S. PATENT DOCUMENTS 4,015,203 A * 3/1977 Verkuil ................ G01R 31/308
324/236
4,152,639 A 5/1979 Chaffee
(Continued)

FOREIGN PATENT DOCUMENTS

CN 105849577 A * 8/2016
KR 20160071453 A * 6/2016 ......... G01R 31/2831
(Continued)

OTHER PUBLICATIONS

Verkuil et al., Contactless Method for High-Sensitivity Measurement of P-N Junction Leakage, IBM J. Res. Develop. vol. 24, No. 3. May 1980.*

(Continued)

*Primary Examiner* — Patrick Assouad
*Assistant Examiner* — Sean Curtis
(74) *Attorney, Agent, or Firm* — Suiter Swantz pc llo

(57) ABSTRACT

Non-Contact measurement of characteristics of p-n junctions includes illuminating an illumination area of a surface of a p-n junction with light, measuring a first junction photovoltage (JPV) signal from a first area of the p-n junction with a first electrode, measuring a second JPV signal from a second area with a second electrode, measuring a third JPV signal from a third area with a reference electrode, and determining a sheet resistance of the p-n junction top layer with a corrected first JPV signal, a corrected second JPV signal, a corrected first calibration JPV signal, a corrected second calibration JPV signal or the known sheet resistance of the calibration p-n junction.

21 Claims, 38 Drawing Sheets

Related U.S. Application Data filed on Oct. 17, 2013, provisional application No. 61/933,292, filed on Jan. 29, 2014, provisional application No. 62/048,677, filed on Sep. 10, 2014.

(51) Int. Cl.
*G01R 31/26* (2014.01)
*G01R 31/28* (2006.01)

(58) Field of Classification Search
CPC .. G01R 31/308; G01R 31/26; G01R 31/2601; G01R 31/2851; G01R 31/311; G01R 1/071; G01R 19/16519; G01R 19/16523; H01L 22/30
USPC .......... 324/754.23, 761.01, 762.05; 257/E33.045, E33.047, 48, 461; 361/91.5
See application file for complete search history.

(56) References Cited

U.S. PATENT DOCUMENTS

| | | | |
|---|---|---|---|
| 4,563,642 A | 1/1986 | Munakata et al. | |
| 4,564,808 A * | 1/1986 | Faughnan | H02S 50/10 324/761.01 |
| 4,598,249 A | 7/1986 | Goodman et al. | |
| 4,812,756 A * | 3/1989 | Curtis | G01R 15/165 250/492.2 |
| 5,216,362 A * | 6/1993 | Verkuil | G01R 31/2831 250/492.2 |
| 5,442,297 A * | 8/1995 | Verkuil | G01R 31/2656 257/E21.531 |
| 6,072,320 A * | 6/2000 | Verkuil | G01R 31/311 324/754.23 |
| 6,166,354 A | 12/2000 | Hause et al. | |
| 6,512,384 B1 * | 1/2003 | Lagowski | G01R 31/2648 324/754.23 |
| 7,019,513 B1 * | 3/2006 | Faifer | G01R 31/311 324/754.23 |
| 7,034,563 B1 * | 4/2006 | Souchkov | G01R 31/2831 324/750.23 |
| 7,362,088 B1 * | 4/2008 | Faifer | G01R 31/2656 324/702 |
| 7,414,409 B1 * | 8/2008 | Faifer | G01R 31/311 324/522 |
| 7,642,772 B1 * | 1/2010 | Faifer | G01R 31/2656 324/754.23 |
| 7,714,596 B2 * | 5/2010 | Chen | G01R 31/2648 324/715 |
| 7,737,680 B1 * | 6/2010 | Faifer | G01R 31/2656 324/754.23 |
| 7,737,681 B1 * | 6/2010 | Faifer | G01R 31/2656 324/754.23 |
| 7,741,833 B1 * | 6/2010 | Faifer | G01R 31/2656 324/754.23 |
| 7,804,294 B1 * | 9/2010 | Faifer | G01R 31/2656 324/750.3 |
| 8,364,428 B2 * | 1/2013 | Schaus | G01R 31/311 702/57 |
| 8,415,961 B1 * | 4/2013 | Zhao | G01R 31/2656 324/702 |
| 8,829,938 B2 * | 9/2014 | Carstensen | H02S 50/10 257/E21.523 |
| 9,075,107 B2 * | 7/2015 | Petersen | G01R 31/312 |
| 9,746,514 B2 * | 8/2017 | Kelly-Morgan | G01R 31/2648 |
| 2007/0035728 A1 | 2/2007 | Kekare et al. | |
| 2008/0018336 A1 | 1/2008 | Ichimura et al. | |
| 2008/0143354 A1 * | 6/2008 | Chen | G01R 31/2648 324/715 |
| 2009/0025788 A1 | 1/2009 | Rubin et al. | |
| 2010/0153033 A1 * | 6/2010 | Schaus | G01R 31/311 702/57 |
| 2011/0301892 A1 * | 12/2011 | Kamieniecki | G01R 31/2656 702/65 |
| 2011/0320144 A1 * | 12/2011 | Petersen | G01R 31/312 702/65 |
| 2012/0143545 A9 * | 6/2012 | Petersen | G01R 31/312 702/65 |
| 2013/0043393 A1 * | 2/2013 | Heaven | G01N 21/3563 250/341.4 |
| 2015/0061714 A1 * | 3/2015 | Kelly-Morgan | G01N 27/00 324/754.11 |
| 2015/0061715 A1 * | 3/2015 | Faifer | G01R 1/071 324/754.23 |
| 2015/0077741 A1 * | 3/2015 | Faifer | G01N 21/66 356/213 |
| 2015/0241512 A1 * | 8/2015 | Faifer | G01R 31/2831 324/754.23 |
| 2016/0313388 A1 * | 10/2016 | Howland | H02S 50/15 |

FOREIGN PATENT DOCUMENTS

| | | | | |
|---|---|---|---|---|
| WO | WO 2006062510 A1 * | 6/2006 | ......... | G01R 31/2656 |
| WO | WO 2007100319 A1 * | 9/2007 | ......... | G01R 31/2648 |
| WO | WO 2009007164 A2 * | 1/2009 | ........... | G01R 31/311 |
| WO | WO 2009007164 A3 * | 5/2009 | ........... | G01R 31/311 |
| WO | WO 2015058130 A2 * | 4/2015 | ........ | G01R 31/2831 |
| WO | WO 2015058130 A3 * | 10/2015 | ........ | G01R 31/2831 |

OTHER PUBLICATIONS

PCT International Search Report for International Application No. PCT/US2014/061212 dated Mar. 16, 2015, 27 pages.

* cited by examiner

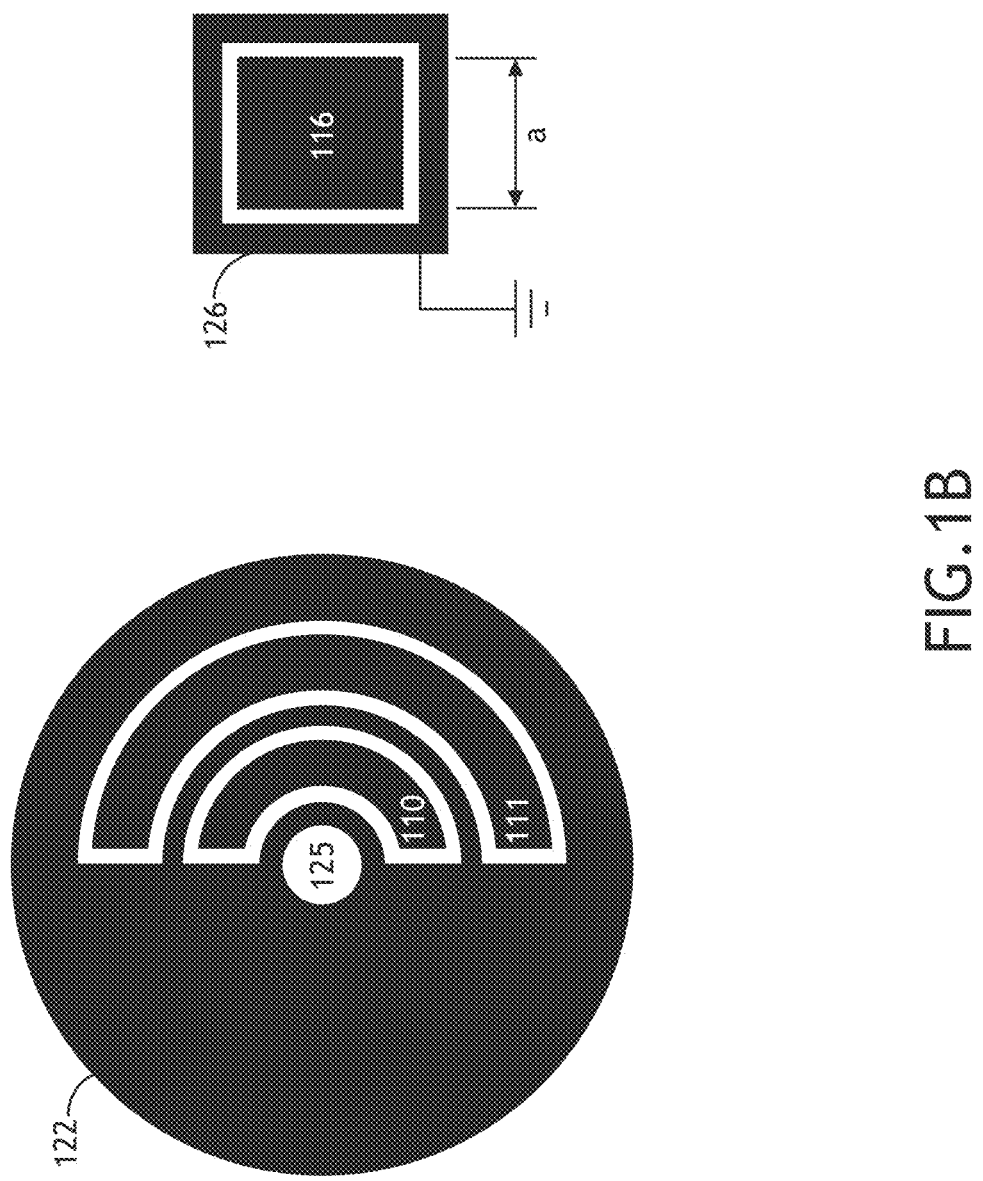

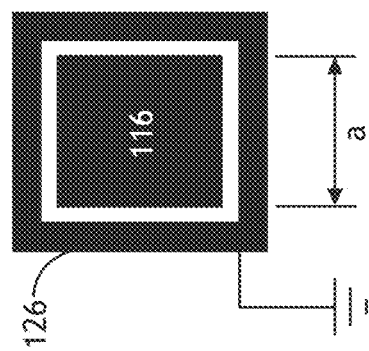
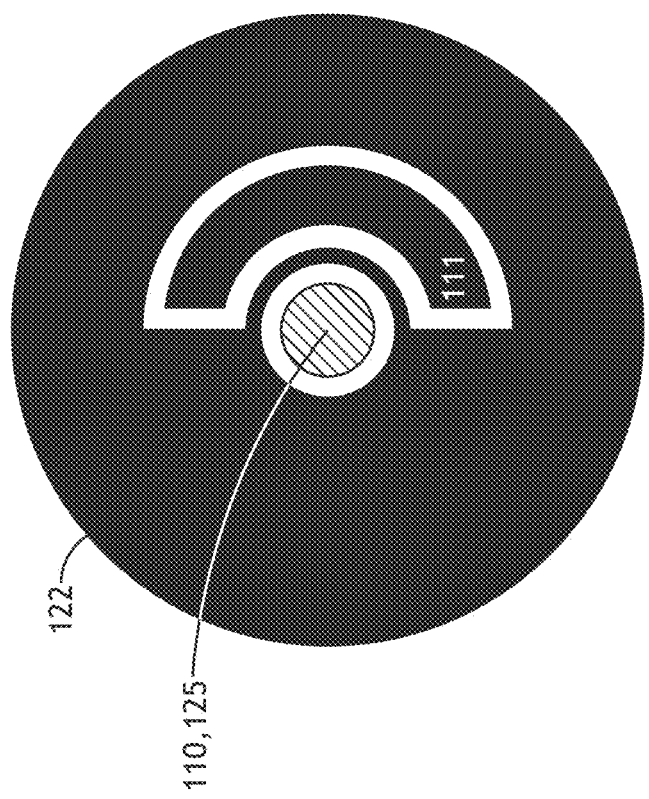
FIG. 1E

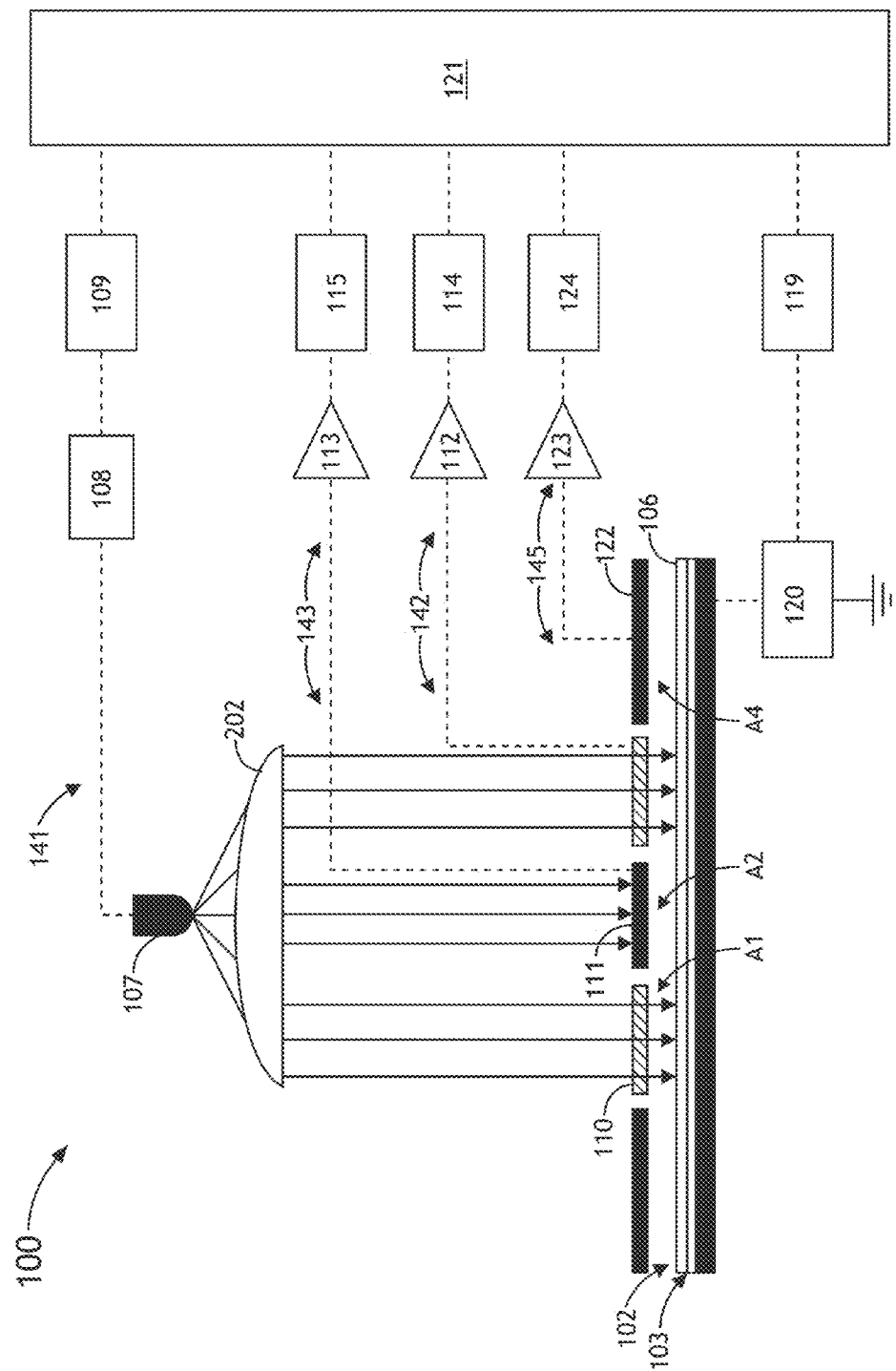

METHOD AND APPARATUS FOR NON-CONTACT MEASUREMENT OF SHEET RESISTANCE AND SHUNT RESISTANCE OF P-N JUNCTIONS

CROSS-REFERENCE TO RELATED APPLICATIONS

The present application claims the benefit under 35 U.S.C. § 119(e) of U.S. Provisional Application Ser. No. 61/892,375, filed Oct. 17, 2013; U.S Provisional Application Ser. No. 61/892,387, filed Oct. 17, 2013; U.S Provisional Application Ser. No. 61/933,292, filed Jan. 29, 2014; and U.S Provisional Application Ser. No. 62/048,677, filed Sep. 10, 2014. The U.S. Provisional Application Ser. No. 61/892,375; U.S Provisional Application Ser. No. 61/892,387; U.S Provisional Application Ser. No. 61/933,292; and U.S Provisional Application Ser. No. 62/048,677 are each incorporated herein by reference in their entirety.

TECHNICAL FIELD

The present invention generally relates to non-contact measurement of various electrical characteristics of p-n junctions of a semiconductor substrate, and, in particular, a non-contact junction photovoltage technique for measuring electrical characteristics of p-n junctions of a semiconductor substrate.

BACKGROUND

As the demand for improved semiconductor device performance continues to increase, so too does the need for improved semiconductor device characterization techniques. Semiconductor wafers, such as silicon wafers, play an important role in the fabrication of device structures. Improved monitoring of device characteristics is critical in the development of advanced semiconductor device fabrication techniques. Monitoring of characteristics includes monitoring of implant and anneal processes, monitoring of emitter sheet resistance, monitoring of shunt resistance or leakage current in Si solar cell, CCD/CMOS imagers, epitaxial layers for LED applications and implant monitoring. Of particular importance in the monitoring of device structures is the monitoring of sheet resistance and shunt resistance, conductance or leakage current in p-n junctions layers. Prior art approaches to p-n junction monitoring suffers from a number of drawbacks. Prior approaches utilized overly simplified models and often require additional measurement information (e.g., capacitance) to arrive at sheet resistance values. A primary disadvantage in previous approaches is that many prior techniques are based on the assumption that a top p-n junction layer sheet resistance is significantly higher than the sheet resistance of the corresponding substrate. In many settings, this assumption is not valid, leading to significant measurement error. An additional drawback of the prior art is that surface photovoltage (SPV) at the back side of a given wafer typically contributes to the measured JPV signal from the front side of the wafer, thereby resulting in systematic error. It is evident that the prior art includes a number of deficiencies. Therefore, it would be desirable to provide a method and system that cure these deficiencies of the prior art identified above.

SUMMARY

A method for contactless measurement of one or more characteristics of one or more p-n junctions is disclosed, in accordance with one embodiment of the present disclosure. In one illustrative embodiment, the method includes illuminating an illumination area of a surface of a p-n junction of a semiconductor substrate with at least one of intensity modulated light or pulsed light. In one illustrative embodiment, the method includes measuring a first junction photovoltage signal from a first area of the surface of the p-n junction with a first electrode, the first electrode proximate to the surface of the p-n junction, the first area within the illumination area or laterally proximate to the illumination area. In one illustrative embodiment, the method includes measuring a second junction photovoltage signal from a second area of the surface with a second electrode, the second electrode proximate to the surface of the p-n junction, the second area laterally proximate to the illumination area. In one illustrative embodiment, the method includes measuring a third junction photovoltage signal from a third area of the surface of the p-n junction with a reference electrode, the reference electrode proximate to the surface of the p-n junction, the third area outside of the illumination area. In one illustrative embodiment, the method includes determining at least one of a corrected first junction photovoltage signal or a corrected second junction photovoltage signal with at least one of the measured first junction photovoltage signal, the measured second junction photovoltage signal or the measured third junction photovoltage signal from the reference electrode. In one illustrative embodiment, the method includes acquiring at least one of a first calibration junction photovoltage signal for the first electrode from a calibration p-n junction, a second calibration junction photovoltage signal for the second electrode from the calibration p-n junction or a third calibration junction photovoltage signal for the reference electrode from the calibration p-n junction, the calibration p-n junction having a known sheet resistance. In one illustrative embodiment, the method includes determining at least one of a corrected first calibration junction photovoltage signal or a corrected second calibration junction photovoltage signal with at least one of the acquired first calibration junction photovoltage signal, the acquired second calibration junction photovoltage signal or the acquired third calibration junction photovoltage signal from the reference electrode. In one illustrative embodiment, the method includes determining a sheet resistance of the p-n junction top layer with at least one of the corrected first junction photovoltage signal, the corrected second junction photovoltage signal, the corrected first calibration junction photovoltage signal, the corrected second calibration junction photovoltage signal or the known sheet resistance of the calibration p-n junction.

A method for contactless measurement of one or more characteristics of one or more p-n junctions is disclosed, in accordance with one embodiment of the present disclosure. In one illustrative embodiment, the method includes illuminating an illumination area of a first surface of a p-n junction of a semiconductor substrate with at least one of intensity modulated light or pulsed light. In one illustrative embodiment, the method includes measuring a first junction photovoltage signal from a first area of the first surface of the p-n junction with a first transparent electrode positioned proximate to the first surface of the p-n junction. In one illustrative embodiment, the method includes measuring an additional junction photovoltage signal from an additional area of a second surface of the p-n junction with a reference electrode positioned proximate to the second surface of the p-n junction. In one illustrative embodiment, the method includes measuring a first junction photovoltage calibration signal corresponding with at least one of the first transparent electrode. In one illustrative embodiment, the method includes measuring an additional junction photovoltage calibration signal corresponding with the reference electrode. In one illustrative embodiment, the method includes determining a sheet resistance of the top layer of the p-n junction with at least one of the first junction photovoltage signal, the additional junction photovoltage signal, the first junction photovoltage calibration signal, the additional junction photovoltage signal, the sheet resistance of a substrate of the p-n junction or an effective sheet resistance of the p-n junction.

A method for contactless measurement of one or more characteristics of one or more p-n junctions is disclosed, in accordance with one embodiment of the present disclosure. In one illustrative embodiment, the method includes illuminating a rectangle-shaped illumination area of a surface of a p-n junction with intensity modulated light at a modulation frequency. In one illustrative embodiment, the method includes measuring a first junction photovoltage signal from a rectangle-shaped first area of the surface of the p-n junction within the rectangle-shaped illumination area with a first transparent electrode. In one illustrative embodiment, the method includes measuring a second junction photovoltage signal from a rectangle-shaped second area of the surface of the p-n junction with a second electrode, the second area outside of the illumination area and laterally proximate to the illumination area. In one illustrative embodiment, the method includes adjusting the modulation frequency of the intensity modulated light to attain an attenuation of the second junction photovoltage signal at or above a selected attenuation level. In one illustrative embodiment, the method includes determining a sheet resistance of a top layer of the p-n junction with at least one of the measured first junction photovoltage signal, the measured second junction photovoltage signal, a capacitance of the p-n junction or a distance of the rectangle illumination area from an edge of a semiconductor substrate.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with intensity modulated light at a modulation frequency. In one illustrative embodiment, the method includes forming one or more shadowed areas within the one or more illumination areas of the first surface of the p-n junction. In one illustrative embodiment, the method includes measuring a first junction photovoltage signal from at least one of a first area or an additional area of the first surface of the p-n junction corresponding with the illumination area with at least one of a first transparent electrode or an additional transparent electrode. In one illustrative embodiment, the method includes measuring a second junction photovoltage signal from a second area of the first surface of the p-n junction corresponding with the shadowed area of the first surface of the p-n junction with a second opaque electrode, the second opaque electrode surrounded by at least one of the first transparent electrode or the additional transparent electrode. In one illustrative embodiment, the method includes determining at least one of a sheet resistance of a top layer of the p-n junction or a shunt resistance of the p-n junction with at least one of the measured first junction photovoltage signal, the measured second junction photovoltage signal or a depletion width of the p-n junction.

A method for contactless measurement of one or more characteristics of one or more p-n junctions is disclosed, in accordance with one embodiment of the present disclosure.

In one illustrative embodiment, the method includes illuminating one or more illumination areas of a surface of a first surface of a p-n junction of a semiconductor substrate with intensity modulated light at a first modulation frequency. In one illustrative embodiment, the method includes forming one or more shadowed areas within the one or more illumination areas of the first surface of the p-n junction. In one illustrative embodiment, the method includes measuring, at the first modulation frequency, a first junction photovoltage signal from one or more first areas within the one or more illumination areas of the first surface of the p-n junction with one or more transparent electrodes. In one illustrative embodiment, the method includes measuring, at the first modulation frequency, a second junction photovoltage signal from one or more second areas within the one or more shadowed areas within the one or more illumination areas of the p-n junction with one or more opaque electrodes. In one illustrative embodiment, the method includes measuring, at the first modulation frequency, a third junction photovoltage signal from one or more third areas of the first surface of the p-n junction outside of the one or more illumination areas of the first surface of the p-n junction with one or more third electrodes. In one illustrative embodiment, the method includes illuminating the one or more illumination areas of a surface of the first surface of the p-n junction with intensity modulated light at a second modulation frequency. In one illustrative embodiment, the method includes measuring, at the second modulation frequency, an additional first junction photovoltage signal from the one or more first areas within the one or more illumination areas of the first surface of the p-n junction with the one or more transparent electrodes. In one illustrative embodiment, the method includes measuring, at the second modulation frequency, an additional second junction photovoltage signal from the one or more second areas within the one or more shadowed areas within the one or more illumination areas of the p-n junction with one or more opaque electrodes. In one illustrative embodiment, the method includes measuring, at the second modulation frequency, an additional third junction photovoltage signal from the one or more third areas of the first surface of the p-n junction outside of the one or more illumination areas of the first surface of the p-n junction with the one or more third electrodes. In one illustrative embodiment, the method includes determining a sheet resistance of a top layer of the p-n junction with at least one of the measured first junction photovoltage signal, the measured second junction photovoltage signal, the measured third junction photovoltage signal, the measured additional first junction photovoltage signal, the measured additional second junction photovoltage signal, the measured additional third junction photovoltage signal, an acquired conductance of the p-n junction or an acquired capacitance of the p-n junction.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with intensity modulated light at a modulation frequency. In one illustrative embodiment, the method includes forming one or more shadowed areas within the one or more illumination areas of the first surface of the p-n junction. In one illustrative embodiment, the method includes measuring, at the modulation frequency, a first junction photovoltage signal from one or more first areas within the one or more illumination areas of the first surface of the p-n junction with one or more transparent electrodes. In one illustrative embodiment, the method includes measuring, at the modulation frequency, a second junction photovoltage signal from one or more second areas within the one or more shadowed areas within the one or more illumination areas of the p-n junction with one or more opaque electrodes. In one illustrative embodiment, the method includes measuring, at the modulation frequency, a third junction photovoltage signal from one or more third areas of the first surface of the p-n junction outside of the one or more illumination areas of the first surface of the p-n junction with one or more third electrodes. In one illustrative embodiment, the method includes illuminating the one or more illumination areas of the first surface of the p-n junction with pulsed light of a selected pulse intensity and a selected pulse duration. In one illustrative embodiment, the method includes measuring a decay curve of a sum of at least two of an additional pulse-induced first junction photovoltage signal from the one or more first areas within the one or more illumination areas, an additional pulse-induced second junction photovoltage signal from the one or more second areas within the one or more shadowed areas or an additional pulse-induced third junction photovoltage signal from the one or more third areas outside of the one or more illumination areas. In one illustrative embodiment, the method includes determining a p-n junction conductance based on the measured decay curve. In one illustrative embodiment, the method includes determining a sheet resistance of a top layer of the p-n junction with at least one of the measured first junction photovoltage signal, the measured second junction photovoltage signal, the measured third junction photovoltage signal, the additional pulse-induced first junction photovoltage, the additional pulse-induced second junction photovoltage, the additional pulse-induced third junction photovoltage, the determined p-n junction conductance or an acquired capacitance of the p-n junction.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with intensity modulated light at a first modulation frequency. In one illustrative embodiment, the method includes forming one or more shadowed areas within the one or more illumination areas of the first surface of the p-n junction. In one illustrative embodiment, the method includes measuring, at the first modulation frequency, a first junction photovoltage signal from one or more first areas within the one or more illumination areas of the first surface of the p-n junction with one or more transparent electrodes. In one illustrative embodiment, the method includes measuring, at the first modulation frequency, a second junction photovoltage signal from one or more second areas of the first surface of the p-n junction outside of the one or more illumination areas of the first surface of the p-n junction with one or more second electrodes. In one illustrative embodiment, the method includes measuring, at the first modulation frequency, a third junction photovoltage signal from one or more third areas of the first surface of the p-n junction outside of the one or more illumination areas of the first surface of the p-n junction with one or more third electrodes, the one or more third areas outside of the one or more second areas. In one illustrative embodiment, the method includes illuminating the one or more illumination areas of the first surface of the p-n junction with intensity modulated light at a second modulation frequency. In one illustrative embodiment, the method includes measuring, at the second modulation frequency, an additional first junction photovoltage signal from the one or more first areas within the one or more illumination areas of the first surface of the p-n junction with one or more transparent electrodes. In one illustrative embodiment, the method includes measuring, at the second modulation frequency, an additional second junction photovoltage signal from the one or more second areas of the first surface of the p-n junction outside of the one or more illumination areas of the first surface of the p-n junction with one or more second electrodes. In one illustrative embodiment, the method includes measuring, at the second modulation frequency, an additional third junction photovoltage signal from the one or more third areas of the first surface of the p-n junction outside of the one or more illumination areas of the first surface of the p-n junction with one or more third electrodes. In one illustrative embodiment, the method includes determining a shunt resistance of the p-n junction with at least one of the measured first junction photovoltage signal, the measured second junction photovoltage signal, the measured third junction photovoltage signal, the measured additional first junction photovoltage signal, the measured additional second junction photovoltage signal, the measured additional third junction photovoltage signal. In one illustrative embodiment, the method includes determining a sheet resistance of a top layer of the p-n junction, when the first modulation frequency is larger than the second modulation frequency, with at least one of the measured first junction photovoltage signal, the measured second junction photovoltage signal, the measured third junction photovoltage signal, a conductance of the p-n junction and a depletion width of the p-n junction. In one illustrative embodiment, the method includes determining a sheet resistance of a top layer of the p-n junction, when the second modulation frequency is larger than the first modulation frequency, with the measured additional first junction photovoltage signal, the measured additional second junction photovoltage signal, the measured additional third junction photovoltage signal, the conductance of the p-n junction and the depletion width of the p-n junction.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with intensity modulated light at a modulation frequency. In one illustrative embodiment, the method includes measuring, at the modulation frequency, a first junction photovoltage signal from one or more first areas within the one or more illumination areas of the first surface of the p-n junction with one or more transparent electrodes. In one illustrative embodiment, the method includes measuring, at the modulation frequency, a second junction photovoltage signal from one or more second areas of the first surface of the p-n junction outside of the one or more illumination areas of the first surface of the p-n junction with one or more second electrodes. In one illustrative embodiment, the method includes measuring, at the modulation frequency, a third junction photovoltage signal from one or more third areas of the first surface of the p-n junction outside of the one or more illumination areas of the first surface of the p-n junction with one or more third electrodes, the one or more third areas outside of the one or more second areas. In one illustrative embodiment, the method includes illuminating the one or more illumination areas of the first surface of the p-n junction with pulsed light of a selected pulse intensity and a selected pulse duration. In one illustrative embodiment, the method includes measuring a decay curve of a sum of at least two of an additional pulse-induced first junction photovoltage signal from the one or more first areas within the one or more illumination areas, an additional pulse-induced second junction photovoltage signal from the one or more second areas outside of the one or more illumination areas or an additional pulse-induced third junction photovoltage signal from the one or more third areas outside of the one or more illumination areas. In one illustrative embodiment, the method includes determining a p-n junction conductance based on the measured decay curve. In one illustrative embodiment, the method includes determining a sheet resistance of a top layer of the p-n junction with at least one of the measured first junction photovoltage signal, the measured second junction photovoltage signal, the measured third junction photovoltage signal, the additional pulse-induced first junction photovoltage, the additional pulse-induced second junction photovoltage, the additional pulse-induced third junction photovoltage, the modulation frequency, the determined p-n junction conductance or an acquired capacitance of the p-n junction.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with intensity modulated light at a first modulation frequency, wherein the intensity of the light establishes a substantially linear relationship between a junction photovoltage signal and a light flux inducing the junction photovoltage signal. In one illustrative embodiment, the method includes measuring, at the first modulation frequency, a first junction photovoltage signal from one or more first areas covering the one or more illumination areas of the first surface of the p-n junction with one or more transparent electrodes. In one illustrative embodiment, the method includes illuminating one or more illumination areas of a first surface of a p-n junction of a semiconductor substrate with intensity modulated light at a second modulation frequency. In one illustrative embodiment, the method includes measuring, at the second modulation frequency, an additional first junction photovoltage signal from the one or more first areas covering the one or more illumination areas of the first surface of the p-n junction with the one or more transparent electrodes. In one illustrative embodiment, the method includes determining a p-n junction conductance with at least one of the first junction photovoltage signal, the additional first junction photovoltage signal, a sheet resistance of a top layer of the p-n junction or a capacitance of the p-n junction.

A method for contactless measurement of one or more characteristics of one or more p-n junctions is disclosed, in accordance with one embodiment of the present disclosure. In one illustrative embodiment, the method includes illuminating one or more illumination areas of a first surface of a p-n junction of a semiconductor substrate with pulsed light having a selected pulse intensity and a selected pulse duration, the selected pulse intensity establishes a substantially linear relationship between a junction photovoltage signal and a light flux inducing the junction photovoltage signal. In one illustrative embodiment, the method includes measuring a decay transient of a first junction photovoltage signal from one or more first areas covering the one or more illumination areas of the first surface of the p-n junction with one or more transparent electrodes. In one illustrative embodiment, the method includes determining a p-n junction conductance with at least one of the measured decay transient of the first junction photovoltage signal or a capacitance of the p-n junction.

An apparatus for contactless measurement of one or more characteristics of one or more p-n junction layers of a semiconductor substrate is disclosed, in accordance with one embodiment of the present disclosure. In one illustrative embodiment, the apparatus includes an illumination unit including an illumination source for illuminating an illumination area of a first surface of semiconductor substrate including a p-n junction with light including at least one of intensity modulated light or pulsed light. In one illustrative embodiment, the apparatus includes a first junction photovoltage measurement unit including at least a first electrode positioned proximate to the first surface of the p-n junction, the first electrode position within the illumination area or at least laterally proximate to the illumination area. In one illustrative embodiment, the apparatus includes a second junction photovoltage measurement unit including at least a second electrode positioned proximate to the first surface of the p-n junction, the second electrode laterally positioned proximate to the first electrode. In one illustrative embodiment, the apparatus includes a third junction photovoltage measurement unit including at least a reference electrode positioned proximate to the first surface of the p-n junction, the third electrode laterally positioned outside of the illumination area.

In one illustrative embodiment, the apparatus includes a controller communicatively coupled to at least one of the first junction photovoltage measurement unit, the second junction photovoltage measurement unit or the third junction photovoltage unit. In one illustrative embodiment, the controller may receive a first junction photovoltage signal for the p-n junction and a first calibration junction photovoltage signal for a calibration p-n junction from the first junction photovoltage measurement unit. In one illustrative embodiment, the controller may receive a second junction photovoltage signal for the p-n junction and a second calibration junction photovoltage signal for the calibration p-n junction from the second junction photovoltage measurement unit. In one illustrative embodiment, the controller may receive a third junction photovoltage signal for the p-n junction and a third calibration junction photovoltage signal for the calibration p-n junction from the third junction photovoltage measurement unit. In one illustrative embodiment, the controller may determine at least one of a corrected first junction photovoltage signal or a corrected second junction photovoltage signal with at least one of the received first junction photovoltage signal, the received second junction photovoltage signal or the received third junction photovoltage signal from the reference electrode. In one illustrative embodiment, the controller may determine at least one of a corrected first calibration junction photovoltage signal or a corrected second calibration junction photovoltage signal with at least one of the received first calibration junction photovoltage signal, the received second calibration junction photovoltage signal or the received third calibration junction photovoltage signal. In one illustrative embodiment, the controller may determine a sheet resistance of the p-n junction of the semiconductor substrate with at least one of the corrected first junction photovoltage signal, the corrected second junction photovoltage signal, the corrected first calibration junction photovoltage signal, the corrected second calibration junction photovoltage signal or the known sheet resistance of the calibration p-n junction.

An apparatus for contactless measurement of one or more characteristics of one or more p-n junction layers of a semiconductor substrate is disclosed, in accordance with one embodiment of the present disclosure. In one illustrative embodiment, the apparatus includes an illumination unit including an illumination source for illuminating an illumination area of a first surface of a p-n junction of a semiconductor substrate with at least one of intensity modulated light or pulsed light. In one illustrative embodiment, the apparatus includes a first junction photovoltage measurement unit including a first transparent electrode for measuring a first junction photovoltage signal from a first area of the first surface of the p-n junction. In one illustrative embodiment, the apparatus includes an additional junction photovoltage measurement unit including a reference electrode for measuring an additional junction photovoltage signal from an additional area of a second surface of the p-n junction.

In one illustrative embodiment, the apparatus includes a controller communicatively coupled to the first junction photovoltage measurement unit, the second junction photovoltage measurement unit or the additional junction photovoltage measurement unit. In one illustrative embodiment, the controller may receive the first junction photovoltage signal for the first area of the first surface of the p-n junction from the first junction photovoltage measurement unit. In one illustrative embodiment, the controller may receive a first junction photovoltage calibration signal for the first area of the first surface of a calibration p-n junction from the first junction photovoltage measurement unit. In one illustrative embodiment, the controller may receive an additional junction photovoltage signal for the additional area of the second surface of the p-n junction from the reference junction photovoltage measurement unit. In one illustrative embodiment, the controller may receive an additional junction photovoltage calibration signal for the additional area of a second surface of a calibration p-n junction from the reference junction photovoltage measurement unit. In one illustrative embodiment, the controller may determine a sheet resistance of the top layer of the p-n junction with at least one of the first junction photovoltage signal, the additional junction photovoltage signal, the first junction photovoltage calibration signal, the additional junction photovoltage signal, the sheet resistance of a substrate of the p-n junction or an effective sheet resistance of the p-n junction.

An apparatus for contactless measurement of one or more characteristics of one or more p-n junctions is disclosed, in accordance with one embodiment of the present disclosure. In one illustrative embodiment, the apparatus includes an illumination unit including an illumination source for illuminating rectangle-shaped illumination area of a surface of a p-n junction with intensity modulated light. In one illustrative embodiment, the apparatus includes a first junction photovoltage measurement unit including a first transparent electrode for measuring a first junction photovoltage signal from a rectangle-shaped first area of the surface of the p-n junction within the rectangle-shaped illumination area. In one illustrative embodiment, the apparatus includes a second junction photovoltage measurement unit including a second electrode for measuring a second junction photovoltage signal from a rectangle-shaped second area of the surface of the p-n junction, the second area outside of the illumination area and laterally proximate to the illumination area.

In one illustrative embodiment, the apparatus includes a controller communicatively coupled to the first junction photovoltage measurement unit and the second junction photovoltage measurement unit. In one illustrative embodiment, the controller may adjust a modulation frequency of the intensity modulated light emitted by the illumination source to attain an attenuation of the second junction photovoltage signal at or above a selected attenuation level. In one illustrative embodiment, the controller may determine a sheet resistance of a top layer of the p-n junction with at least one of the measured first junction photovoltage signal, the measured second junction photovoltage signal, and a capacitance of the p-n junction or a distance of the rectangle illumination area from an edge of the semiconductor substrate.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 1A-1C illustrate an apparatus for contactless measurement of one or more characteristics of a p-n junction, in accordance with one or more embodiments of the present disclosure.

FIGS. 1D-1F illustrate an apparatus for contactless measurement of one or more characteristics of a p-n junction, in accordance with one or more embodiments of the present disclosure.

FIG. 1O illustrates a method for contactless measurement of one or more characteristics of a p-n junction, in accordance with one or more embodiments of the present disclosure.

FIGS. 2A-2C illustrate an apparatus for contactless measurement of one or more characteristics of a p-n junction, in accordance with one or more embodiments of the present disclosure.

FIGS. 2F-2J illustrate methods for contactless measurement of one or more characteristics of a p-n junction, in accordance with one or more embodiments of the present disclosure.

FIGS. 3A-3I illustrate an apparatus for contactless measurement of one or more characteristics of a p-n junction, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A through 3N, a system and method for contactless measurement of one or more characteristics of a p-n junction is described in accordance with the present disclosure. Embodiments of the present disclosure are directed to a non-contact junction photovoltage (JPV) technique suitable for measuring sheet resistance shunt resistance, conductance and/or leakage current in p-n junction layers. Embodiments of the present disclosure, among other things, provide an advanced four electrode configuration for accurate measurements of top p-n junction layer sheet resistance $R_{s1}$, which is not affected by variation of substrate doping and its sheet resistance $R_{s2}$. In addition, embodiments of the present disclosure diminish the impact of back side wafer SPV on systematic error. Embodiments of the present invention also provide for measurements of sheet resistances $R_{s1}$ and $R_{s2}$ of both p-n junction layers.

Figure 1A:
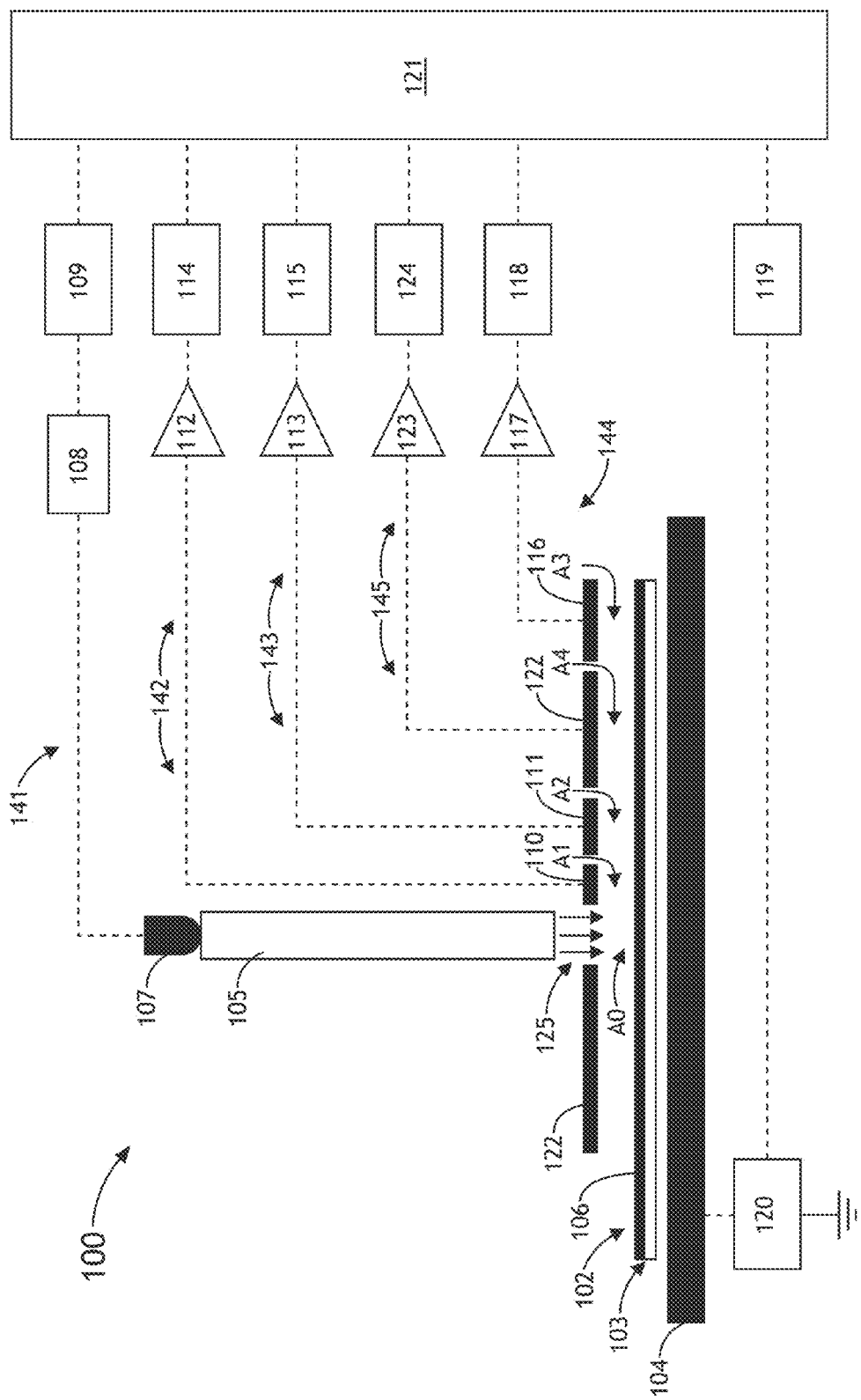
Figure 1C:
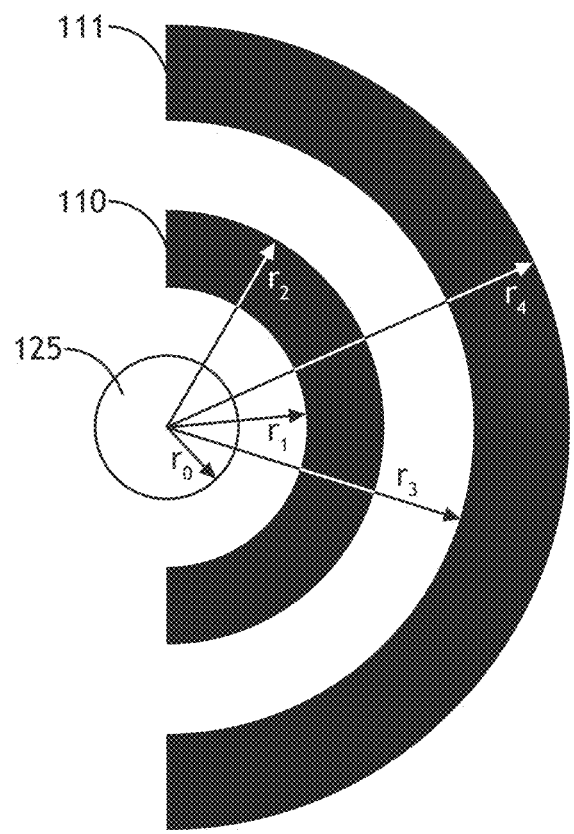

FIGS. 1A-1C illustrate a system 100 for measuring one or more characteristics of one or more p-n junctions, in accordance with one or more embodiments of the present disclosure. In some embodiments, the non-contact measurement techniques of the present disclosure may provide, but are not limited to, a measurement of a sheet resistance of a p-n junction and/or a shunt resistance of a p-n junction based on one or more junction photovoltage (JPV) measurements at various regions of a surface of a p-n junction of a semiconductor substrate. V. Faifer et al. describe the calibration of JPV measurements in U.S. patent application Ser. No. 14/475,025, filed on Sep. 2, 2014, which is incorporated herein by reference in the entirety.

Referring now to FIG. 1A, in one embodiment, the system 100 includes an illumination unit 141. In another embodiment, the system 100 includes a first junction JPV measurement unit 142. In another embodiment, the system 100 includes a second JPV measurement unit 143. In another embodiment, the system 100 includes a third JPV measurement unit 144. In another embodiment, the system 100 includes a fourth JPV measurement unit 145. In another embodiment, the system 100 includes a controller 121 communicatively coupled to the illumination unit 141, the first JPV measurement unit 142, the second measurement unit 143, the third JPV measurement unit 144 and/or the fourth JPV measurement unit 145. It is noted herein that the embodiments of the present disclosure do not require each of the JPV measurement units 142-145 depicted in FIG. 1A. As such, embodiments including one, two or all of JPV measurement units 142-145 are contemplated to be within the scope of the present invention.

In one embodiment, the controller 121 is configured to direct the illumination unit 141 to illuminate a semiconductor substrate including a p-n junction 103 with light having one or more selected characteristics (e.g., intensity, modulation frequency, pulse intensity, pulse duration and the like). In turn, the controller 121 may receive measurements of various response characteristics of the p-n junction 103, such as, but not limited to, a first JPV signal from JPV measurement unit 142, a second JPV signal from JPV measurement unit 143, a third JPV signal from JPV measurement unit 144 and/or a fourth JPV signal from JPV measurement unit 145. Further, the controller 121 may determine the sheet resistance and/or the shunt resistance of the p-n junction 103 based on the measured characteristics and the various relationships described throughout the present disclosure.

In one embodiment, the illumination unit 141 includes one or more illumination sources 107. In one embodiment, the one or more illumination sources 107 are arranged to illuminate an area of a semiconductor substrate including a p-n junction 103 with light 125 (e.g., intensity modulated light or pulsed light). For example, the illumination source 107 may be arranged to illuminate a first illumination area A0 of the surface 106 of the substrate 102 (e.g., semiconductor wafer including a p-n junction 103).

In another embodiment, the illumination source 107 illuminates the surface 106 of the p-n junction 103 with light at one or more selected intensities. In another embodiment, the illumination source 107 illuminates the surface of the p-n junction 103 with light at one or more selected modulation frequencies. For example, the illumination source 107 may output a light signal modulated at a selected modulation frequency. For instance, the modulation frequency of the light may correspond to a steady-state condition (e.g., low modulation frequency) or a non-steady-state condition (e.g., high modulation frequency). By way of another example, the illumination source 107 may output a pulsed light signal. In another embodiment, the illumination unit 141 illuminates the surface of the p-n junction 103 with light including a selected wavelength or range of wavelengths.

In one embodiment, the illumination unit 141 illuminates an area of a semiconductor substrate including the p-n junction 103 with light. In another embodiment, the illumination unit 141 illuminates the surface of the p-n junction 103 with light at one or more selected intensities. In another embodiment, the illumination unit 141 illuminates the surface of the p-n junction103 with light at one or more selected modulation frequencies. For example, the illumination source 107 may output a modulated light signal modulated at a selected modulation frequency. By way of another example, the illumination source 107 may output a pulsed light signal. In another embodiment, the illumination unit 141 illuminates the surface of the p-n junction 103 with light including a selected wavelength or range of wavelengths.

The illumination source 107 may include any illumination source known in the art suitable for providing modulated or pulsed light. For example, the illumination unit 141 may include an illumination source 107, such as, but not limited to, a light emitting diode (LED), multiple LEDs, one or more lasers, a flashlamp (e.g., filtered flashlamp), or a shuttered lamp. For the remainder of the present disclosure, the illumination source 107 of the illumination unit 141 is described in the context of an LED. It is noted herein that the illumination source 107 is not limited to an LED and this simplification is provided merely for purposes of clarity and it is contemplated herein that the illumination source 107 may include any additional type of light source (e.g., a laser).

In another embodiment, the illumination unit 141 includes one or more optical fiber bundles 105. In another embodiment, the one or more optical fiber bundles 105 serve to optically couple an output of the illumination source 107 and an illumination area A0 of the front surface of the substrate 102. For example, a first end (i.e., the input) of the optical fiber bundle 107 may be coupled to the output of the illumination source 107, while a second end (i.e., the output) of the optical fiber bundle 107 is arranged to deliver illumination 125 traveling through the one or more optical bundles 105 to the illumination area A0 of the front surface 106 of the substrate 102.

In another embodiment, the illumination unit 141 includes a signal generator 109 and/or driver 108 (e.g., LED driver) coupled to the illumination source 107 and the controller 121. In this regard, the controller 121 may direct the signal generator 109 to drive the illumination source 107 in order to generate a desired illumination output. For example, the signal generator 109 may cause the illumination source 107 to output a modulated light signal having a selected modulation frequency. By way of another example, the signal generator 109 may cause the illumination source 107 to output one or more light pulses of a selected duration (i.e., pulsed light signal). By way of another example, the signal generator 109 may cause the illumination source 107 to output one or more light pulses of a selected intensity. For example, the signal generator 109 may cause the illumination source 107 to output a modulated light signal having a modulation frequency sufficiently low to cause a steady-state condition in the stimulated JPV signal of the p-n junction 103. By way of another example, the signal generator 109 may cause the illumination source 107 to output a modulated light signal having a modulation frequency sufficiently high to cause a non-steady-state condition in the stimulated JPV signal of the p-n junction.

In one embodiment, the first JPV measurement unit includes a first electrode 110 for measuring a JPV signal for a selected area of the p-n junction 103. In one embodiment, the first electrode 110 is positioned near the front surface 106 of the semiconductor substrate 102 including a p-n junction 103. In another embodiment, the second JPV measurement unit includes a second electrode 111 for measuring a second JPV signal for a selected area of the p-n junction 103. In one embodiment, the second electrode 111 is also positioned near the front surface 106 of the semiconductor substrate 102 including a p-n junction 103.

As shown in FIGS. 1A-1C, in one embodiment, the first electrode 110 and the second electrode 111 are laterally positioned proximate to the illumination A0. In this regard, the illumination 125 from the illumination source 107 is transmitted via the optical bundle 105 so as not substantially impinge on the first electrode 110 or the second 111 electrode. In one embodiment, the first electrode 110 may be arranged concentrically with respect to the illumination area A0 receiving illumination 125. In this regard, the first electrode 110 may measure, or pick up, a first JPV signal associated with the first area, A1, of the p-n junction 103 such that the first area A1 is not within the illumination area A0. In another embodiment, the second electrode 111 may be arranged concentrically with the first electrode 110. In this regard, the second electrode 111 may measure, or pick up, a second JPV signal associated with a second area, A2, of the p-n junction 103. For example, as shown in FIGS. 1B and 1C, the first electrode 110 may include, but is not limited to, an opaque arc-shaped electrode (e.g., metal electrode) arranged concentrically with respect to the illumination 125 impinging on the illumination area 125. By way of another example, as shown in FIGS. 1B and 1C, the second electrode 111 may include, but is not limited to, an opaque arc-shaped electrode (e.g., metal electrode) arranged concentrically with respect to the first electrode 110. For instance, as shown in FIG. 1C, the area of illumination 125 may have a radius of $r_0$, while the first electrode 110 has an inner radius of $r_1$ and an outer radius of $r_2$. Further, the second electrode 111 may have an inner radius of $r_3$ and an outer radius of $r_4$, where $r_4 > r_3 > r_2 > r_1 > r_0$.

It is further noted herein that the first electrode 110 and the second electrode 111 may take on any suitable shape known in the art. For example, the first and second electrodes 110 may take on an arc shape, an open partial rectangle shape, an open partial square, an open partial oval shape, an open partial polygon shape and the like.

In another embodiment, the third JPV measurement unit 144 includes a reference electrode 116. In one embodiment, the reference electrode 116 is positioned near the surface layer 106 of the semiconductor substrate 102. In another embodiment, the reference electrode 116 is positioned along the lateral direction (i.e., within the plane of the defined by the electrodes) at a selected distance away from the illumination area A0, the first electrode 110 and the second electrode 111. In this regard, the reference electrode 116 may measure a reference signal from a third area, A3, of the surface 106 of the p-n junction 103. For example, the reference electrode 116 may be positioned at a distance approximately equal to the radius of substrate 102 (e.g., wafer). It is noted herein that the reference electrode 116 may be used to provide corrections to the first and second JPV signals measured with the first electrode 110 and second electrode 111 respectively, as described in greater detail further herein. In one embodiment, the reference electrode 116 includes an opaque electrode.

The reference electrode 116 may take on any suitable shape known in the art such as, but not limited to, a square, a rectangle, a circle, an oval, a polygon and the like. For example, as shown in FIG. 1B, the reference electrode 116 may have a square shape with a dimension "a." In another embodiment, a grounded electrode 126 may surround reference electrode 116. It is noted herein that the grounded electrode 126 may serve to diminish electrostatic effects induced by the edge of the substrate 102. In another embodiment, although not shown, the first electrode 110 and/or the second electrode 111, may be surrounded by a grounding electrode.

In another embodiment, the fourth JPV measurement unit 145 includes a fourth electrode 122. In one embodiment, the fourth electrode 122 is also positioned near the surface layer 106 of the semiconductor substrate 102. In another embodiment, the fourth electrode 122 surrounds the first electrode 110 and the second electrode 111, as shown in FIGS. 1A and 1B. In this regard, the fourth electrode 122 may measure a fourth JPV signal from a fourth area, A4, of the p-n junction 103. It is noted herein that the electrode 122 may be used to improve accuracy when measuring shunt resistance, or conductance, in the p-n junction. In addition, the surrounding electrode 122 may provide corrections to sheet resistance measurements, as described in greater detail further herein. In one embodiment, the reference electrode 116 includes an opaque electrode.

In another embodiment, one or more of the junction photovoltage measurement units 142-145 may include one or more signal processing elements configured to process a measured signal prior to transmission to the controller 121. For example, the measurement units 142, 143, 144 and 145 may include, but are not limited to, preamplifiers 112, 113, 123 and 117, respectively, for amplifying the signals from the electrodes 110, 111, 122, and 116. By way of another example, the measurement units 142, 143, 144 and 145 may include, but are not limited to, demodulators/detectors 114, 115, 124 and 118, respectively, for demodulating and/or detecting the signals from the electrodes 110, 111, 122, and 116. Further, upon amplification, demodulation and/or detection, the signals from the electrodes 110, 111, 112, and 116 may be received by the controller 121 via an interface.

In one embodiment, the semiconductor substrate 102 including one or more p-n junctions 103 is disposed on a chuck 104. In another embodiment, the chuck 104 includes a conducting chuck (e.g., metal chuck). In another embodiment, the chuck 104 includes a metal chuck connected to ground. In another embodiment, the system 100 includes a signal generator 119 coupled to the wafer chuck 104 through switch 120. For example, the switch 120 may be directly coupled to the chuck 104. In another embodiment, the switch 120 is couple to ground. In another embodiment, the signal generator 119 is coupled to controller 121, whereby the controller 121 may direct the signal generator 119 to apply a selected signal to the chuck 104. In one embodiment, the signal generator 119 may apply one or more calibration signals (e.g., impulses) to aid in measuring accurate signals of the present disclosure (e.g., JPV signal). For example, the signal generator 119 may be used to apply an AC signal to the chuck 104 through switch 120 in order to calibrate one or more photovoltage signals. It is noted herein that V. Faifer et al. describe the calibration of JPV measurements in U.S. patent application Ser. No. 14/475,025, filed on Sep. 2, 2014, which is incorporated above in the entirety.

It is noted herein that the chuck is not limited to a conducting or metal chuck and the description above is provided merely for illustrative purposes. For example, the chuck 104 may include a non-conducting chuck. In one embodiment, one or more calibrating signals of the present disclosure may be applied to the edge of the substrate 102 (rather than through the chuck 104, as described previously herein).

In another embodiment, the controller 121 is configured to receive one or more measurements (e.g., measurement of test wafer or measurement of calibration wafer) from the JPV measurement units 142-145. Based on those measurements the controller 121 is further configured to determine or more characteristics associated with the p-n junction 103. In one embodiment, the controller 121 receives a first junction photovoltage signal for the p-n junction 103 and a first calibration junction photovoltage signal for a calibration p-n junction from the first junction photovoltage measurement unit 142. In another embodiment, the controller 121 receives a second junction photovoltage signal for the p-n junction and a second calibration junction photovoltage signal for the calibration p-n junction from the second junction photovoltage measurement unit 143. In another embodiment, the controller 121 receives a third junction photovoltage signal for the p-n junction and a third calibration junction photovoltage signal for the calibration p-n junction from the third junction photovoltage measurement unit 144. In another embodiment, the controller 121 determines at least one of a corrected first junction photovoltage signal or a corrected second junction photovoltage signal with at least one of the received first junction photovoltage signal, the received second junction photovoltage signal or the received third junction photovoltage signal. In another embodiment, the controller 121 determines at least one of a corrected first calibration junction photovoltage signal or a corrected second calibration junction photovoltage signal with at least one of the received first calibration junction photovoltage signal, the received second calibration junction photovoltage signal or the received third calibration junction photovoltage signal. In another embodiment, the controller 121 determines a sheet resistance of the p-n junction layers of the semiconductor substrate with at least one of the corrected first junction photovoltage signal, the corrected second junction photovoltage signal, the corrected first calibration junction photovoltage signal, the corrected second calibration junction photovoltage signal or the known sheet resistance of the calibration p-n junction.

In one embodiment, the system 100 may acquire at least one of a first calibration junction photovoltage for the first electrode from a calibration p-n junction, a second calibration junction photovoltage for the second electrode from the calibration p-n junction or a third calibration junction photovoltage for the reference electrode from the calibration p-n junction. In another embodiment, JPV calibration signal may be acquired by: illuminating an illumination area of a surface of the calibration p-n junction of a semiconductor substrate with at least one of intensity modulated light or pulsed light. Then, measuring a first junction photovoltage signal from a first area of the surface of the calibration p-n junction with the first electrode. Then, measuring a second junction photovoltage signal from a second area of the surface of the calibration p-n junction with the second electrode. Then, measuring a third junction photovoltage signal from a third area of the surface of the calibration p-n junction with the reference electrode.

In another embodiment, calibration of the JPV signals may be achieved through the application of calibration voltage signals via the generator 119 and switch 120 described throughout the present disclosure.

It is noted that procedures for the calibration and correction of the first junction photovoltage signal, the second junction photovoltage signal and the third calibration signal are described in greater detail further herein.

In another embodiment, the controller 121 receives a fourth junction photovoltage signal for the fourth area of the surface of p-n junction from the fourth electrode 122. In another embodiment, the controller 121 sums the first junction photovoltage, the second junction photovoltage and the fourth junction photovoltage to form a summed junction photovoltage signal. In another embodiment, the controller 121 determines a shunt resistance of the p-n junction based on the frequency dependence of the summed junction photovoltage signal, as described in greater detail further herein. In another embodiment, the controller 121 determines a shunt resistance of the p-n junction based on the decay of the summed junction photovoltage signal generated via pulsed light.

Figure 1D:
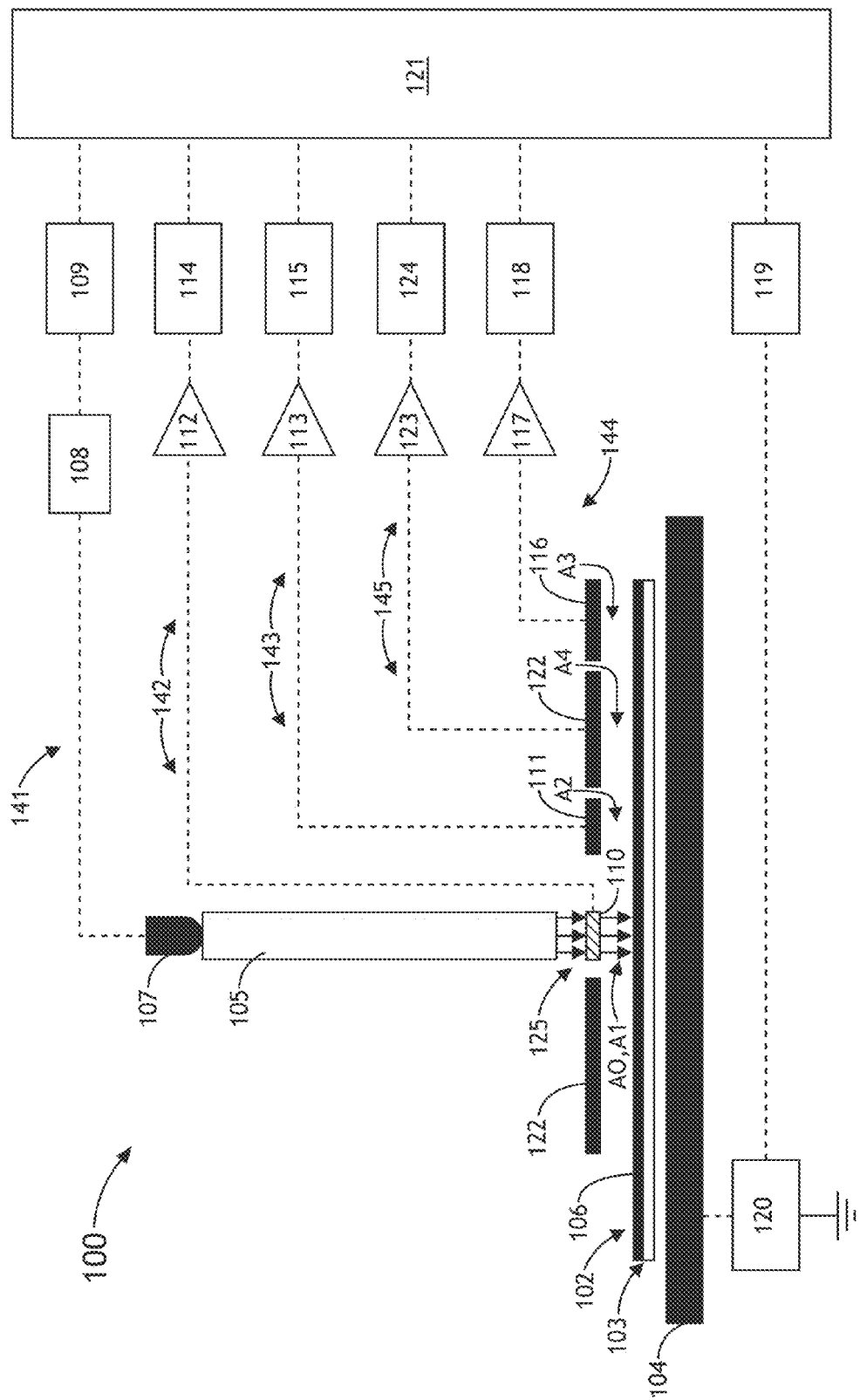
Figure 1F:
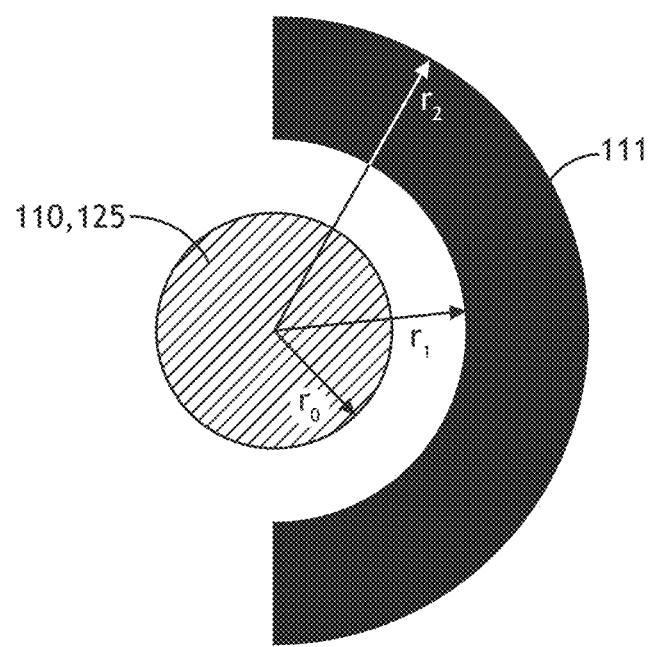

FIGS. 1D-1F illustrate system 100 equipped with a transparent first electrode 110, in accordance with one or more embodiments of the present disclosure. As shown in FIG. 1D, the first electrode 110 may include a transparent electrode 110 (rather than the opaque first electrode depicted in FIG. 1A). In one embodiment, the transparent electrode 110 is configured to transmit illumination 125 from the illumination source 107 to the illumination area A0 on the surface 106 of the p-n junction 103. In one embodiment, as depicted in FIG. 1D, the first transparent electrode 110 is coextensive with the illumination area A0. In this regard, the area A1 associated with first transparent electrode 110 is coextensive with the illumination area A0, as shown in FIGS. 1D and 1E. In another embodiment, the first transparent electrode 110 is inside of the illumination area A0 such that the electrode 110 is smaller than the illumination area. In another embodiment, the first transparent electrode 110 covers the illumination area A0 such that the illumination area A0 is smaller than the electrode 110.

In another embodiment, the first transparent electrode of FIG. 1D-1E includes a transparent conducting oxide (TCO) coating disposed on a transparent substrate. For example, the transparent substrate may include, but is not limited to, quartz, sapphire or a glass substrate. In another embodiment, the first transparent electrode 110 includes a wire mesh suspended above the surface of the p-n junction. In another embodiment, the first transparent electrode 110 includes a wire mesh disposed on a transparent plate. In another embodiment, the first transparent electrode 110 a nanowire coating.

It is further noted herein that the first electrode 110 may take on any suitable shape known in the art such as, but not limited to, circular disk shape, a square, a rectangle, an oval a polygon and the like. For example, as shown in FIG. 1E, the first transparent electrode 110 may have a circular disk shape. For instance, as shown in FIG. 1F, the area of illumination 125 and the first transparent electrode 110 may each have a radius of $r_0$, while the second electrode 111 has an inner radius of $r_1$ and an outer radius of $r_2$, where $r_2 > r_1 > r_0$.

Figure 1G:
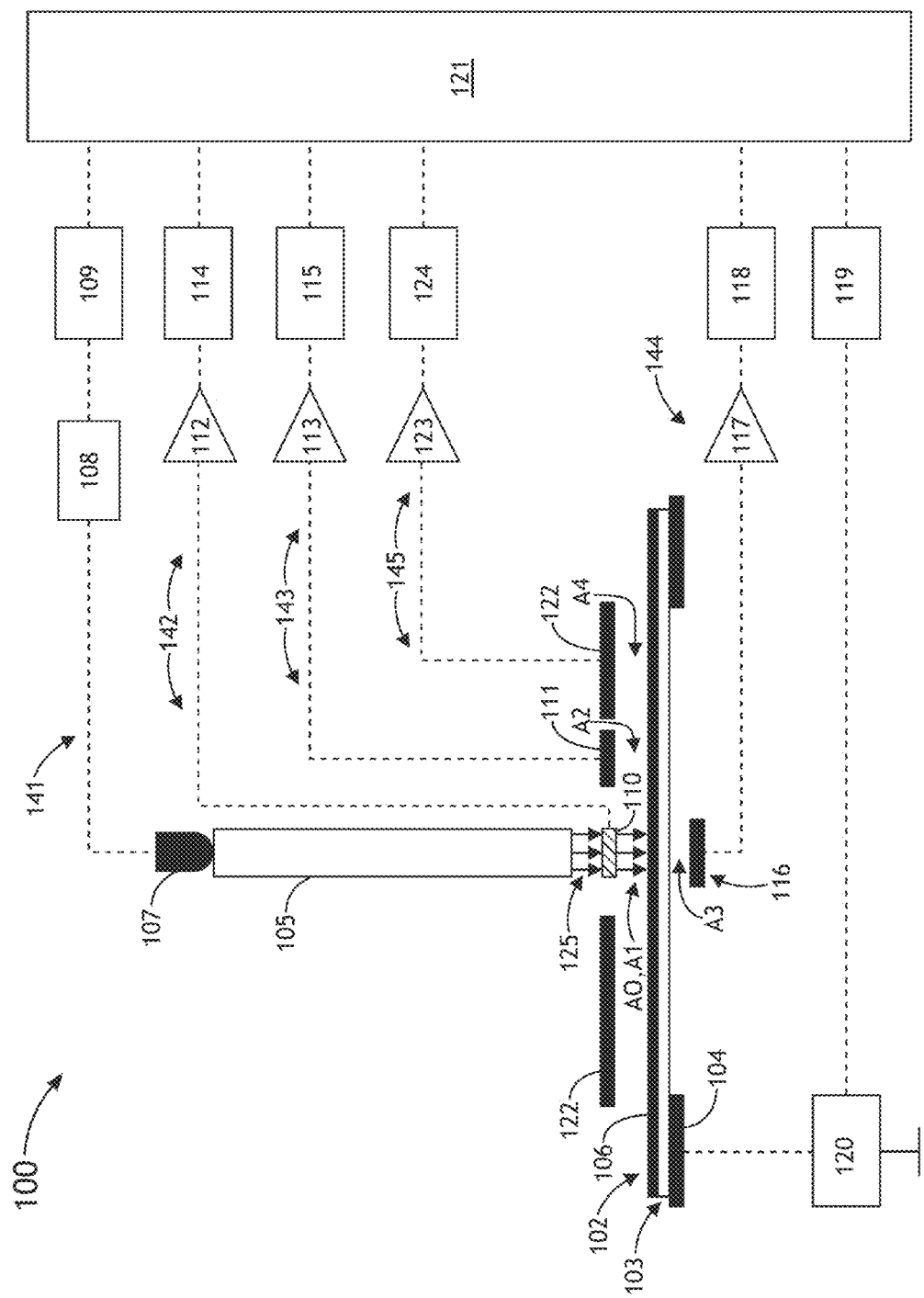
FIG. 1G illustrates an apparatus for contactless measurement of one or more characteristics of a p-n junction, in accordance with one or more embodiments of the present disclosure.

FIG. 1G illustrates system 100 with the reference electrode 116 positioned on the backside of the semiconductor substrate 102, in accordance with one or more embodiments of the present invention. In one embodiment, the reference electrode 116 of the third measurement system 144 is positioned within a gap in the chuck 104 and proximate to the backside surface of the semiconductor substrate 102.

In one embodiment, as shown in FIG. 1G, the system 100 includes a first transparent electrode 110 optically coupled with the illumination 125 so as to transmit the illumination 125 to the illumination area A0, as described previously herein. In another embodiment, the first transparent electrode 110 is coextensive with the illumination area A0. In another embodiment, the first transparent electrode 110 has an area inside the illumination area A0. In another embodiment, the first transparent electrode 110 covers the illumination area A0 so that the illumination area A0 is inside the area of the first transparent electrode 110.

In one embodiment, the reference electrode 116 is opaque. In another embodiment, the opaque reference electrode 116 is positioned opposite of the first transparent electrode 110 so that they are substantially aligned. In another embodiment, the opaque reference electrode 116 has substantially the same area (e.g., same diameter in case of circular geometry) as the first transparent electrode 110.

The reference electrode 116 and/or the first transparent electrode 110 may take on any shape known in the art such as, but not limited to, a ring shape or a disk shape.

In another embodiment, also shown in FIG. 1G, the system 100 includes a second opaque electrode 111 positioned outside of the illumination area A0 to measure a second signal, or additional signal, outside of the illumination area A0, thereby allowing for the determination of the sheet resistance of both the p-n junction layers.

It is noted herein that system 100 may be utilized to determine sheet resistance of the p-n junction 103 of substrate 102 through the photoexcitation of excess carriers in the p-n junction 103 with illumination 125 and the subsequent comparison of the JPV signals V1 and V2 associated with electrodes 110 and 111 to the JPV signal V3 with the reference electrode 116. JPV distributions under local optical excitation of silicon wafers with p-n junctions where $R_{s1} \gg R_{s2}$ is described in detail in V. Faifer et. al., *Proceedings of 24$^{th}$ ESSDERC' 94*, Edinburgh, p. 601 (1994); and V. N. Faifer et. al., Appl. Phys. Let., 89, 151123 (2006), which are each incorporated herein by reference in the entirety.

Figure 1H:
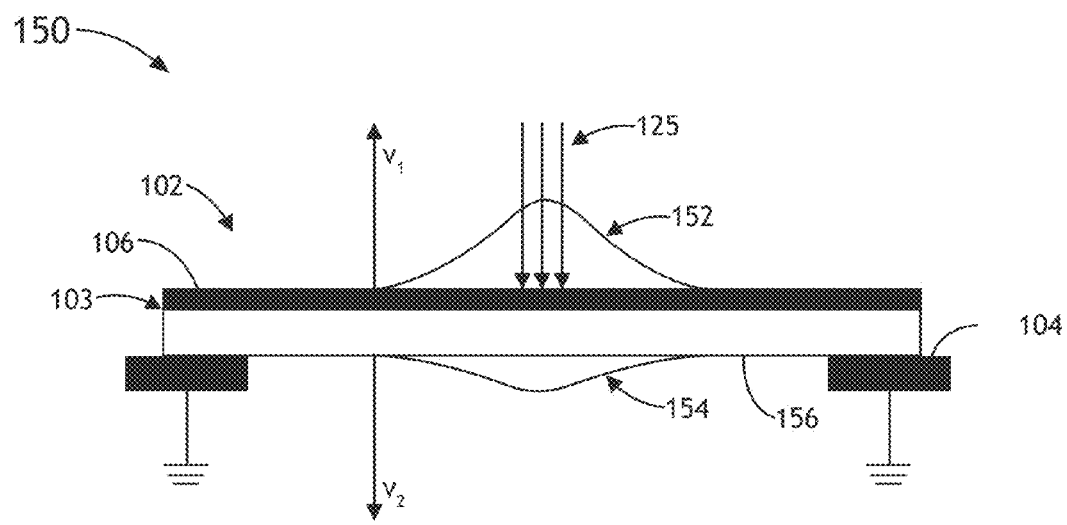
FIGS. 1H-1I illustrate a set of junction photovoltage spatial distributions, in accordance with one or more embodiments of the present disclosure.
Figure 1I:
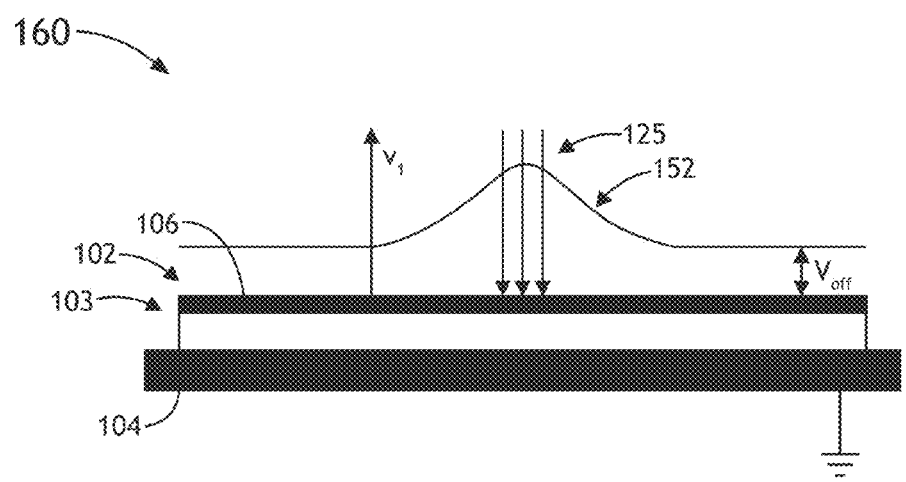

FIG. 1H depicts a conceptual view 150 of spatial JPV distributions on the frontside and backside of semiconductor substrate disposed on a grounded chuck 104 that includes a hole or gap. For instance, FIG. 1H illustrates a first spatial JPV, $v_1$, distribution 152 generated on the front side 106 of the semiconductor substrate 102 and a second spatial JPV, $v_2$, distribution 154 generated on the backside of the semiconductor substrate 102, which are generated in response to illumination 125. FIG. 1I depicts a conceptual view 160 of a spatial JPV, $v_1$, distribution of a semiconductor substrate disposed on a grounded chuck 104 that does not include a hole or gap. For instance, FIG. 1I illustrates a spatial JPV, $v_1$, distribution 152 generated on the front side 106 of the semiconductor substrate 102 disposed on a grounded chuck 104 without a hole or gap. It is noted herein that such an arrangement includes a JPV offset voltage, $V_{OFF}$, which is stimulated by the interaction of the backside JPV distribution 154 with the chuck 104.

In the event $R_{s1}$ is the same order of magnitude as $R_{s2}$ and substrate 102 is placed on a chuck 104 including a pass through hole or gap, as show in FIG. 1H, the relationship for the JPV values $v_1(x,y)$ 152 at front surface layer 106 of wafer 102 and the JPV value $v_2(x,y)$ 154 at back side 156 of said wafer 102 as function of x-y position is given by:

$$\frac{\partial^2 v_1}{\partial x^2} + \frac{\partial^2 v_1}{\partial y^2} = (R_{s1} + R_{s2})C_{pn}\frac{\partial v_1}{\partial t} + (R_{s1} + R_{s2})G_{pn}v_1 - q(1-R)R_{s1}\Phi \quad (1)$$

$$\frac{\partial^2 v_2}{\partial x^2} + \frac{\partial^2 v_2}{\partial y^2} = (R_{s1} + R_{s2})C_{pn}\frac{\partial v_2}{\partial t} + (R_{s1} + R_{s2})G_{pn}v_2 - q(1-R)R_{s2}\Phi \quad (2)$$

Where the distribution $v_1(x,y,t)$ 152 represents the JPV value at the top layer 106 as a function of x-y position, the distribution $v_2(x,y,t)$ 154 is the JPV value at bottom surface 156 of wafer 102 as a function of coordinates x-y position, $\Phi(x,y,t)$ is the effective intensity of light flux, $R_{s1}$ is the sheet resistance of the upper layer 106 of the p-n junction 103, $R_{s2}$ is the sheet resistance of the bottom layer 156 of the p-n junction, $C_{pn}$ is the capacitance of p-n junction per unit area, $G_{pn}$ is the conductance of p-n junction per unit area and R is reflectivity of semiconductor material of the p-n junction. Further, the conductance of the p-n junction can be determined as:

$$G_{pn} = \frac{I_0 \cdot q}{n \cdot k \cdot T} + 1/R_{SH} \quad (3)$$

Where q is charge of the electron; k is Boltzman's constant; T is temperature; $R_{sh}$ is the shunt resistance of the p-n junction; Io and n are the prefactor and ideality factor represented in the following relation between current, I, and voltage, V, of the p-n junction:

$$I = I_0 \cdot [\exp(q \cdot V/n \cdot kT) - 1] \quad (4)$$

The photovoltage signals $V_1$ and $V_2$ captured b electrodes 110 and 111 can be calculated using the formulas:

$$V_1(t) = C_1 \iint_{S_1} v_1(x, y, t) dx dy \quad (5)$$

$$V_2(t) = C_2 \iint_{S_2} v_1(x, y, t) dx dy \quad (6)$$

Where $S_1$ and $S_2$ are the areas of electrodes 110 and 111, $C_1$ and $C_2$ are constants which depend on the gain of amplification of the preamplifiers 112 and 113 and other parameters. In the case of sinusoid modulated light, the JPV signal can be represented as:

$$V_1(t) = V_1 \cdot \exp(j\omega \cdot t) \quad (7)$$

$$V_2(t) = V_2 \cdot \exp(j\omega \cdot t) \quad (8)$$

Where $V_1$, $V_2$ are the magnitudes of JPV signals, $\omega = 2\pi f$, f is light modulating frequency.

Using equations (1-6), the magnitudes of JPV signals from arc electrode 110, $V_1$, and arc electrode 111, $V_2$, for probe configuration depicted in FIGS. 1A-1C is given by:

$$V_1 = C_1 \frac{2q(1-R)\Phi_0 R_{s1}}{k^2 r_0} I_1(kr_0)[r_1 K_1(kr_1) - r_2 K_1(kr_2)] \quad (9)$$

$$V_2 = C_2 \frac{2q(1-R)\Phi_0 R_{s1}}{k^2 r_0} I_1(kr_0)[r_3 K_1(kr_3) - r_4 K_1(kr_4)] \quad (10)$$

where $$k = \sqrt{(R_{s1} + R_{s2})G_{pn} + 2\pi i f (R_{s1} + R_{s2})C_{pn}} \quad (11)$$

$$i = \sqrt{-1} \quad (12)$$

Where $I_0(z)$ and $I_1(z)$ are the modified Bessel function of the first kind; $K_0(z)$ and $K_1(z)$ are the modified Bessel function of the second kind; $r_0$ is the radius of light beam 125, $r_1$, $r_2$ are the inner and outer radii of electrode 110, respectively, and $r_3$, $r_4$ are the inner and outer radii of electrode 111, respectively; and $\Phi_0$ is the effective light flux.

It is further noted that constants $C_1$ and $C_2$ depend on the gain of amplification of the preamplifiers 112 and 113 an can be calibrated by the controller 121 using signal generator 119 and switch 120.

Further, parameter k can be determined by the controller 121 using the ratio of measured JPV signals and the following relationship:

$$\frac{V_1}{V_2} = \frac{C_1}{C_2} \frac{r_1 K_1(kr_1) - r_2 K_1(kr_2)}{r_3 K_1(kr_3) - r_4 K_1(kr_4)} \quad (13)$$

In another embodiment, the sheet resistance $R_{SM}$ of measured wafer can be determined by the controller 121 using measured JPV signals $V_{1M}$ and $V_{2M}$ from electrodes 110 and 111 for measured wafer and JPV signals $V_{1C}$ and $V_{2C}$ from the said electrodes for calibrated wafer with known sheet resistance $R_{SC}$ and formula:

$$R_{SM} = R_{SC} \frac{V_{1M}}{V_{1C}} \frac{k_M^2}{k_C^2} \frac{I_1(k_C r_0)[r_1 K_1(k_C r_1) - r_2 K_1(k_C r_2)]}{I_1(k_M r_0)[r_1 K_1(k_M r_1) - r_2 K_1(k_M r_2)]} \quad (14)$$

Where parameters $k_C$ and $k_M$ may be calculated by the controller 121 using equations:

$$\frac{V_{1M}}{V_{2M}} = \frac{C_1}{C_2} \frac{r_1 K_1(k_M r_1) - r_2 K_1(k_M r_2)}{r_3 K_1(k_M r_3) - r_3 K_1(k_M r_4)} \quad (15)$$

$$\frac{V_{1C}}{V_{2C}} = \frac{C_1}{C_2} \frac{r_1 K_1(k_C r_1) - r_2 K_1(k_C r_2)}{r_3 K_1(k_C r_3) - r_4 K_1(k_C r_4)} \quad (16)$$

In the case of system 100, shown in FIGS. 1D-1F, equations (1-6) above can be used to derive the magnitudes of the JPV signals from transparent and conducting electrode 110, $V_1$, and arc electrode 111, $V_2$:

$$V_1 = C_1 \frac{q(1-R)\Phi_0 R_{S1}}{k^2} [1 - 2I_1(kr_0)K_1(kr_0)] \quad (17)$$

$$V_2 = C_2 \frac{2q(1-R)\Phi_0 R_{S1}}{k^2 r_0} I_1(kr_0)[r_1 K_1(kr_1) - r_2 K_1(kr_2)] \quad (18)$$

Where $$k = \sqrt{(R_{s1} + R_{s2})G_{pn} + 2\pi i f (R_{s1} + R_{s2})C_{pn}} \quad (19)$$

and $I_0(z)$, $I_1(z)$, are the modified Bessel function of the first kind; $K_0(z)$, $K_1(z)$ are the modified Bessel function of the second kind; $r_0$ is the radius of electrode 110, $r_1$ and $r_2$ are inner and outer radiuses of electrode 111 and $\Phi_0$ is the effective light flux.

It is again noted that constants $C_1$ and $C_2$ depend on the gain of amplification of the preamplifiers 112 and 113 and can be calibrated by the controller 121 using signal generator 119 and switch 120.

In addition, parameter k can be determined by the controller 121 using ratio of measured JPV signals and the follow equation:

$$\frac{V_1}{V_2} = \frac{C_1}{C_2} \frac{r_0}{I_1(kr_0)} \frac{1 - 2I_1(kr_0)K_1(kr_0)}{r_1 K_1(kr_1) - r_2 K_1(kr_2)} \quad (20)$$

Further, the sheet resistance $R_{S1M}$ of measured wafer can be determined by controller 121 using measured JPV signals $V_{1M}$ and $V_{2M}$ from electrodes 110 and 111 for measured wafer and JPV signals $V_{1C}$ and $V_{2C}$ from the electrodes for a calibration wafer with known sheet resistance $R_{S1C}$ and formula:

$$R_{S1M} = R_{S1C} \frac{V_{1C}}{V_{1M}} \frac{k_M^2}{k_C^2} \frac{1 - 2I_1(k_C r_0)K_1(k_C r_0)}{1 - 2I_1(k_M r_0)K_1(k_M r_0)} \quad (21)$$

where parameters $k_C$ and $k_M$ are calculated using equations:

$$\frac{V_{1M}}{V_{2M}} = \frac{C_1}{C_2} \frac{r_0}{I_1(k_M r_0)} \frac{1 - 2I_1(k_M r_0)K_1(k_M r_0)}{r_1 K_1(k_M r_1) - r_2 K_1(k_M r_2)} \quad (22)$$

-continued $$\frac{V_{1C}}{V_{2C}} = \frac{C_1}{C_2} \frac{r_0}{I_1(k_C r_0)} \frac{1 - 2I_1(k_C r_0)K_1(k_C r_0)}{r_1 K_1(k_C r_1) - r_2 K_1(k_C r_2)} \quad (23)$$

It is noted herein that a chuck 104, as shown in FIG. 1G, including a hole or making contact to part of the wafer 102, can be difficult to use for mapping of an entire wafer. In the case of chuck without hole, as shown in FIG. 1A and FIG. 1D, the JPV and SPV at the back side of the wafer 102 generate a JPV offset at front side of the wafer $v_{off}$ (see FIG. 1I). $v_{off}$ can be determined using the following formula:

$$v_{off} = C_3 \frac{q(1-R)\Phi_0 R_{S2}}{k^2 \pi R_W^2} \quad (24)$$

Where $R_W$ is the wafer radius.

Corrected JPV signals from electrodes 110 and 111 can be calculated by the controller 121 using measured offset the JPV signal from electrode 116, $V_3$, and formulas:

$$V_{1COR} = V_1 - \frac{S_1}{S_3} V_3 \quad (25)$$

$$V_{2COR} = V_2 - \frac{S_2}{S_3} V_3 \quad (26)$$

$$V_3 = C_3 S_3 v_{off} = \frac{q(1-R)\Phi_0 R_{S2}}{k^2 \pi R_W^2} S_3 \quad (27)$$

Where $S_1$, $S_2$, $S_3$ are the areas of electrodes 110, 111 and 116, respectively.

Sheet resistance $R_{S1M}$ of measured wafer can be determined using said corrected with formulas (25, 26) JPV signals $V_{1MCOR}$ and $V_{2MCOR}$ from electrodes 110 and 111 for measured wafer and JPV signals $V_{1CCOR}$ and $V_{2CCOR}$ from the said electrodes for calibrated wafer with known sheet resistance $R_{S1C}$ and formulas (14-16) for electrode configuration at FIG. 1A-1C or formulas (21-23) for electrode configuration at FIG. 1D-1F.

In the case of GaInN or AlGaInP LEDs, the capacitance of the p-n junction is determined by thickness of the undoped active layer, d, and can be determined using formula:

$$C_{pn} = \frac{\varepsilon_S \varepsilon_0}{d} \quad (28)$$

Where $\varepsilon_S$ and $\varepsilon_0$ are again the permittivity of semiconductor and vacuum.

Capacitance of the p-n junction, Cpn, can be determined using the corrected JPV signals $V_{1CCor}$, $V_{2CCor}$ measured on a calibration p-n junction with known sheet resistances $R_{SC1}$ and $R_{SC2}$ and the following relationships:

$$\frac{V_1 CCor}{V_2 CCor} = \frac{C_1}{C_2} \frac{r_0}{I_1(k_C r_0)} \frac{1 - 2I_1(k_C r_0)K_1(k_C r_0)}{r_1 K_1(k_C r_1) - r_2 K_1(k_C r_2)} \quad (29)$$

$$k_C = \sqrt{2\pi i f (R_{SC1} + R_{SC2}) C_{pn}} \quad (30)$$

Using said measured capacitance, $C_{pn}$, and measured JPV signals on tested p-n junction $V_{1M}$, $V_{2M}$, $V_{3M}$ sheet resistances $R_{S1}$ and $R_{S2}$ can be determined using set of equations $$\frac{V_{1MCor}}{V_{2MCor}} = \frac{C_1}{C_2} \frac{r_0}{I_1(kr_0)} \frac{1 - 2I_1(kr_0)K_1(kr_0)}{r_1 K_1(kr_1) - r_2 K_1(kr_2)} \quad (31)$$

$$\frac{V_{1MCor}}{V_{3MCor}} = \frac{C_1}{C_3} \frac{R_{S1}}{R_{S2}} \frac{\pi R_W^2}{S_3} [1 - 2I_1(kr_0)K_1(kr_0)] \quad (32)$$

$$k = \sqrt{2\pi i f (R_{S1} + R_{S2}) C_{pn}} \quad (33)$$

Where $V_{1MCor}$, $V_{2MCor}$ are corrected measured photovoltages based on formulas (25) and (26).

In the case of system 100 depicted in FIG. 1G, using measurements of signals $V_{11}$, $V_{22}$, and $V_{33}$ from electrodes 110, 116 and 111, generated from signal generator 119, and switch 120 and the electrode-chuck 104 with a hole and JPV signals $V_1$, $V_2$, $V_3$ from a tested p-n junction $V_{1C}$, $V_{2C}$, $V_{3C}$ from a calibration p-n junction with known sheet resistances $R_{SC1}$ and $R_{SC2}$ the sheet resistances $R_{S1}$ and $R_{S2}$ of said tested p-n junction can be determined using the following relationships:

$$\frac{R_{S1}}{R_{S2}} = \frac{V_1 V_{22}}{V_2 V_{11}} \quad (34)$$

$$\frac{V_1}{V_3} = \frac{V_{33}}{V_{11}} \frac{1 - 2I_1(kr_0)K_1(kr_0)}{I_1(kr_0)[r_1 K_1(kr_1) - r_2 K_1(kr_2)]} \quad (35)$$

$$\frac{V_{1C}}{V_{3C}} = \frac{V_{33}}{V_{11}} \frac{1 - 2I_1(k_C r_0)K_1(k_C r_0)}{I_1(k_C r_0)[r_1 K_1(k_C r_1) - r_2 K_1(k_C r_2)]} \quad (36)$$

$$k = \sqrt{2\pi i f (R_{S1} + R_{S2}) C_{pn}} \quad (37)$$

$$k_C = \sqrt{2\pi i f (R_{SC1} + R_{SC2}) C_{pn}} \quad (38)$$

In the event the substrate sheet resistance is unknown, in addition to the JPV technique, an Eddy current technique can be used for measurements of sheet resistances $R_{S1}$ and $R_{S2}$.

In the case of the eddy current technique, absorbed electromagnetic power $P_a$ is determined by the controller 121 using formula:

$$P_a = Const \int_0^t \sigma(x) dx = Const \frac{R_{S1} R_{S2}}{R_{S1} + R_{S2}} = Const R_{SP} \quad (39)$$

Where $\sigma(x)$ is a depth distribution of conductivity, t is a wafer thickness, $R_{SP}$ is an effective sheet resistance of the p-n junction measured using eddy current technique. Sheet resistance, $R_{s1}$, can be determined using said JPV signals $V_1$, $V_2$, calibration signals $V_{1C}$, $V_{2C}$, and effective sheet resistance of the p-n junction, $R_{SP}$, and formula:

$$R_{S1} = \left(1 + \frac{V_1 V_{22}}{V_2 V_{11}}\right) R_{SP} \quad (40)$$

Figure 1J:
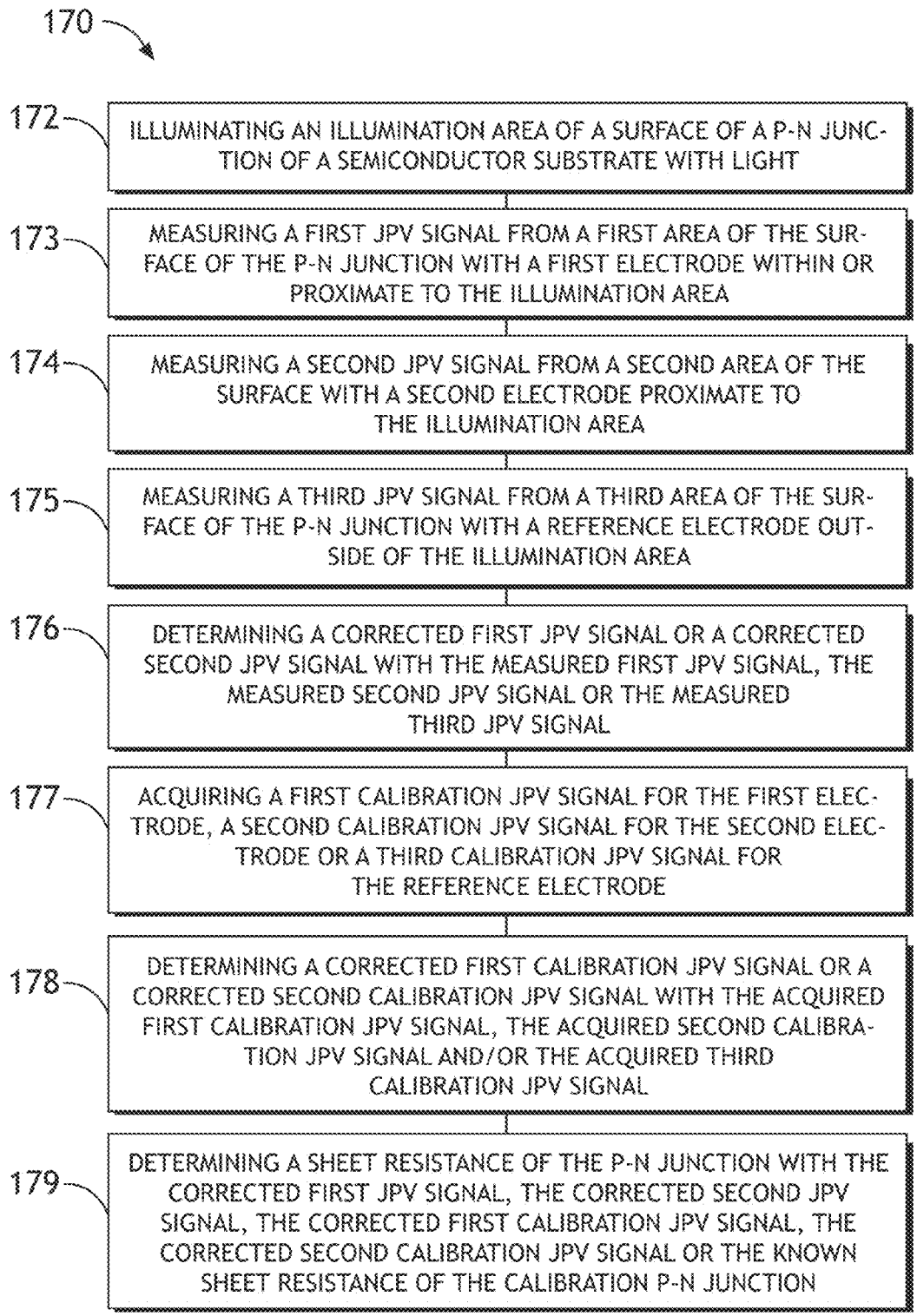
FIGS. 1J-1K illustrate methods for contactless measurement of one or more characteristics of a p-n junction, in accordance with one or more embodiments of the present disclosure.

FIG. 1J illustrates a flow diagram 170 depicting a method for contactless measurement of one or more characteristics of one or more p-n junction layers of a semiconductor substrate, in accordance with one or more embodiments of the present disclosure.

Step 172 includes illuminating an illumination area of a surface of a p-n junction of a semiconductor substrate with light. Step 173 includes measuring a first junction photovoltage signal from a first area of the surface of the p-n junction with a first electrode within or proximate to the illumination area. Step 174 includes measuring a second junction photovoltage signal from a second area of the surface with a second electrode proximate to the illumination area. Step 175 includes measuring a third junction photovoltage signal from a third area of the surface of the p-n junction with a reference electrode outside of the illumination area. Step 176 includes determining a corrected first junction photovoltage signal or a corrected second junction photovoltage signal with the measured first junction photovoltage signal, the measured second junction photovoltage signal or the measured third junction photovoltage signal. Step 177 includes acquiring a first calibration junction photovoltage signal for the first electrode, a second calibration junction photovoltage signal for the second electrode or a third calibration junction photovoltage signal for the reference electrode. Step 178 includes determining a corrected first calibration junction photovoltage signal or a corrected second calibration junction photovoltage signal with the acquired first calibration junction photovoltage signal, the acquired second calibration junction photovoltage signal and/or the acquired third calibration junction photovoltage signal. Step 179 includes determining a sheet resistance of the p-n junction of the semiconductor substrate with the corrected first junction photovoltage signal, the corrected second junction photovoltage signal, the corrected first calibration junction photovoltage signal, the corrected second calibration junction photovoltage signal or the known sheet resistance of the calibration p-n junction.

Figure 1K:
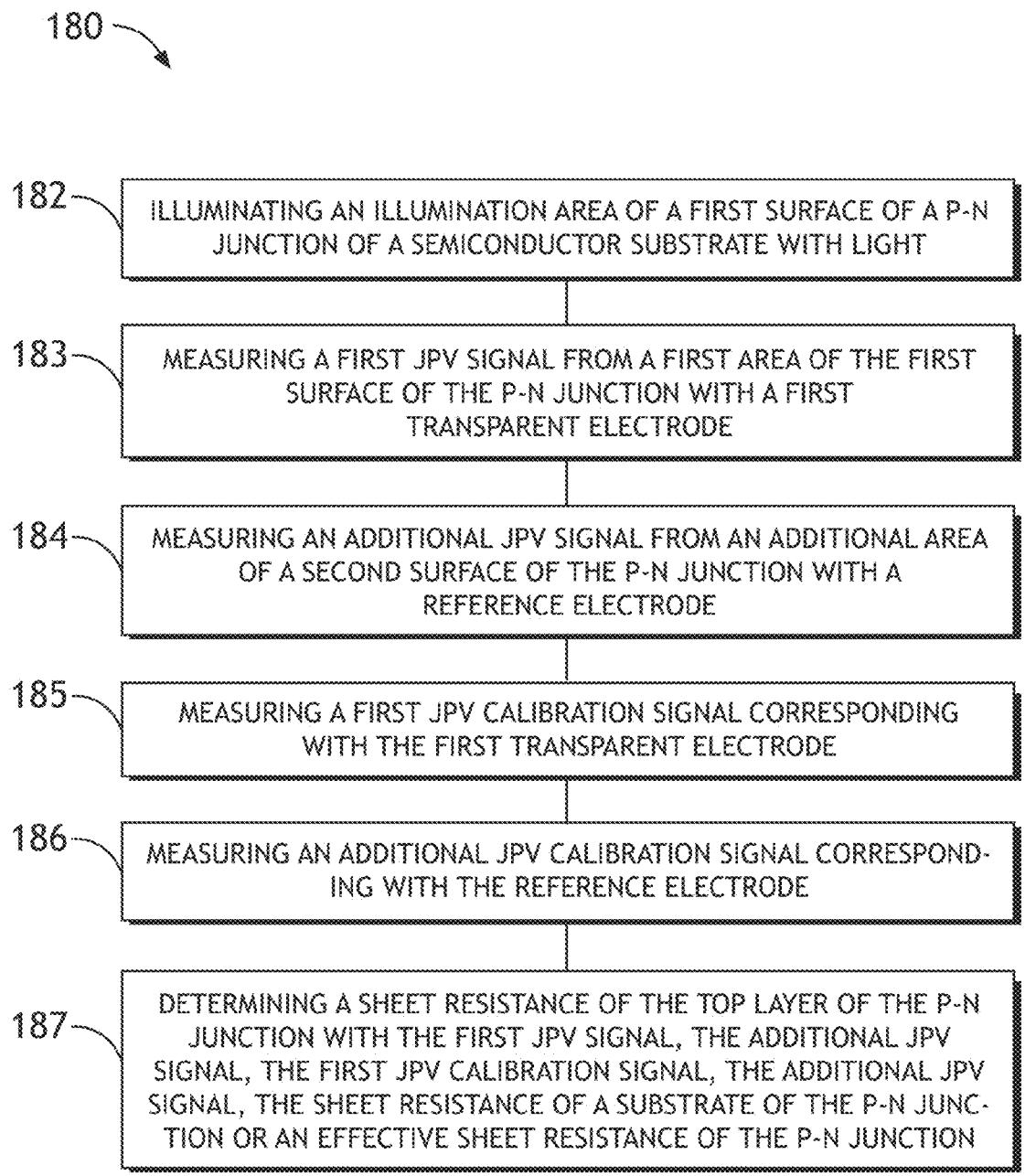

FIG. 1K illustrates a flow diagram 180 depicting a method for contactless measurement of one or more characteristics of one or more p-n junction layers of a semiconductor substrate, in accordance with one or more embodiments of the present disclosure. Step 182 includes illuminating an illumination area of a first surface of a p-n junction of a semiconductor substrate with light. Step 183 includes measuring a first junction photovoltage signal from a first area of the first surface of the p-n junction with a first transparent electrode. Step 184 includes measuring an additional junction photovoltage signal from an additional area of a second surface of the p-n junction with a reference electrode. Step 185 includes measuring a first junction photovoltage calibration signal corresponding with the first transparent electrode. Step 186 includes measuring an additional junction photovoltage calibration signal corresponding with the reference electrode. Step 187 includes determining a sheet resistance of the top layer of the p-n junction with the first junction photovoltage signal, the additional junction photovoltage signal, the first junction photovoltage calibration signal, the additional junction photovoltage signal, the sheet resistance of a substrate of the p-n junction or an effective sheet resistance of the p-n junction.

Figure 1L:
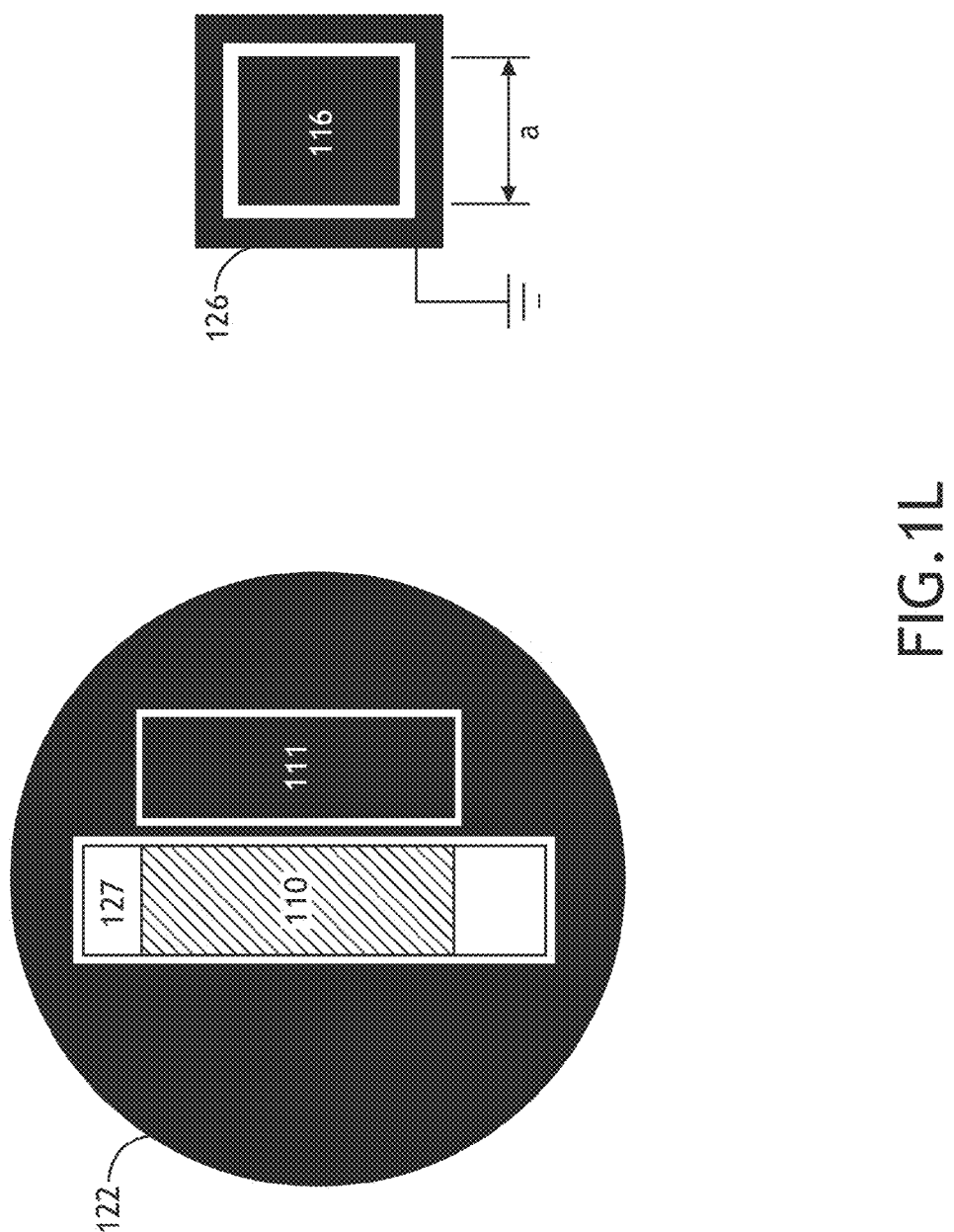
FIGS. 1L-1N illustrate an apparatus for contactless measurement of one or more characteristics of a p-n junction, in accordance with one or more embodiments of the present disclosure.
Figure 1M:
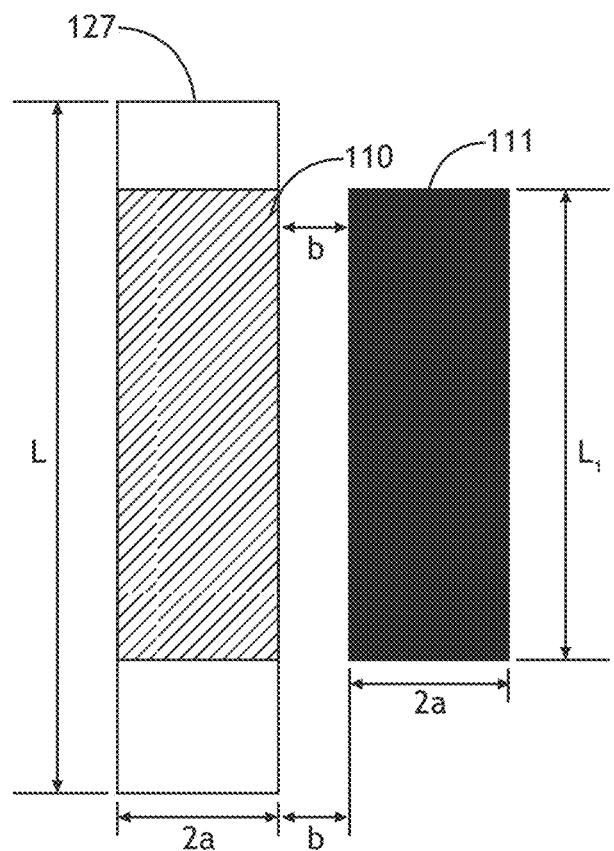
Figure 1N:
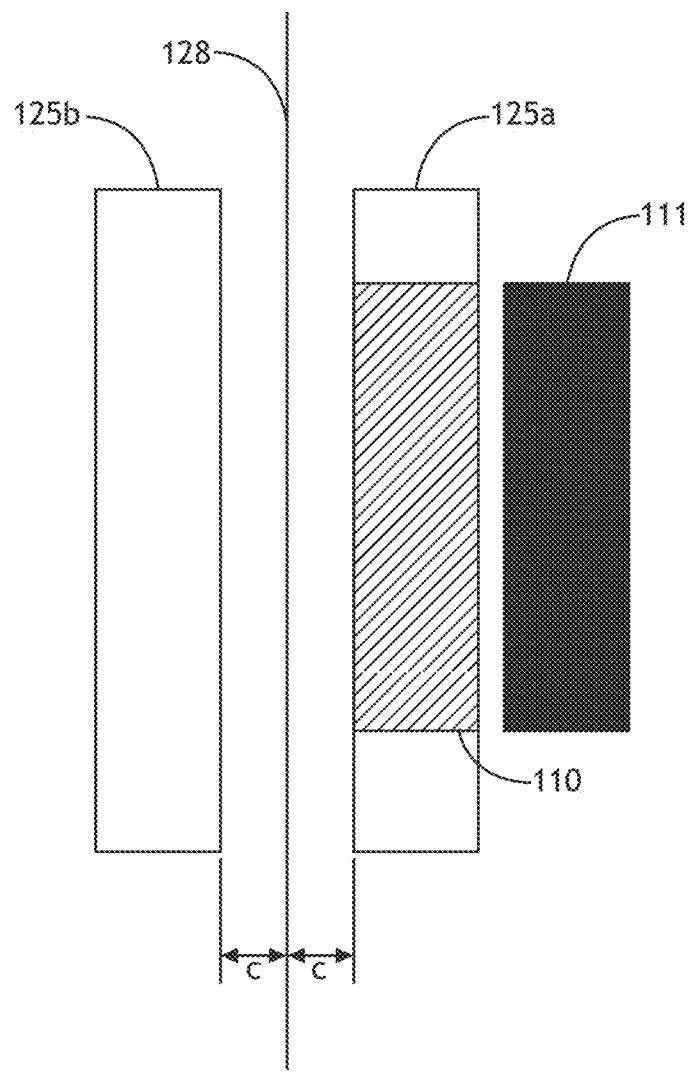
Figure 10:
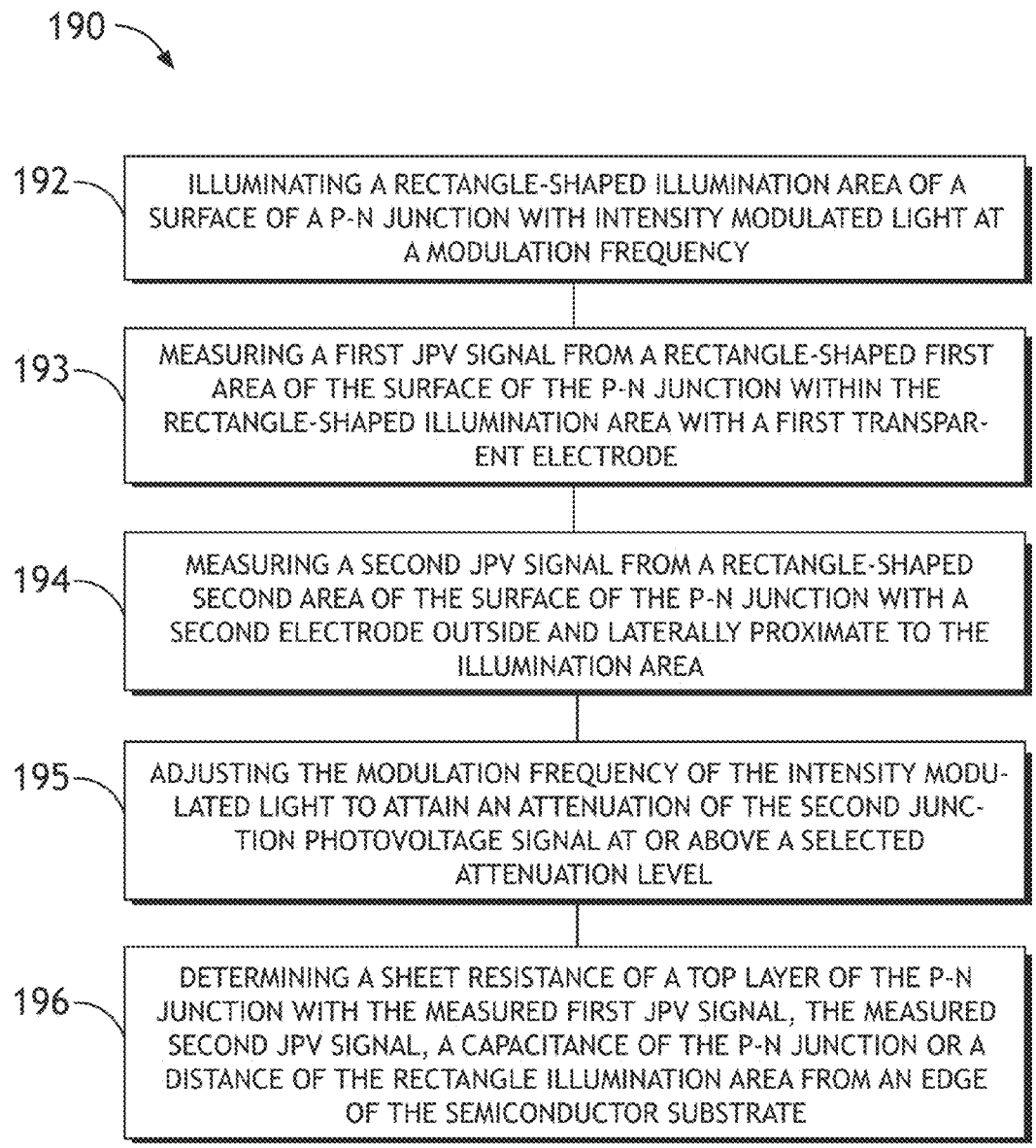

FIGS. 1L-1N illustrate a rectangular illumination and electrode configuration for measuring one or more JPV signals, in accordance with one or more embodiments of the present invention. In one embodiment, the illumination unit 141 including illumination source 107 is configured to produce a rectangle-shaped illumination area 125 on the surface 106 of the p-n junction 103.

In another embodiment, the first transparent electrode 110 is configured to measure a JPV signal from a rectangle-shaped first area of the p-n junction surface 106. In another embodiment, the second electrode 111 is configured to measure a JPV signal from a second rectangle-shape area of the surface 106 of the p-n junction 103. In one embodiment, the opaque second electrode 111 (e.g., metal electrode) is outside of the illumination area 127 and is proximate to the first transparent electrode 110.

In one embodiment, the first transparent electrode 110 is rectangle-shaped. For example, as shown in FIG. 1M, the electrode 110 has a length, L1, and a width, 2a, and is deposited on a transparent rectangle-shaped plate 127 (e.g., glass, quartz or sapphire plate) having a length L (where L>L1) and width, 2a. In another embodiment, the second electrode 111 is oriented parallel to the first transparent electrode 110 and is a distance, b, from the transparent electrode 110. In addition, the second electrode 111 has also has a length, L1, and width, 2a. In this regard, such a configuration may provide one dimensional JPV spreading near the transparent electrode 110.

In one embodiment, the illumination area may have a length at least four times the width of the illumination area. In another embodiment, the measured rectangle-shaped first area may have a width equal to the illumination area and a length at least two times smaller than the length of the illumination area. In another embodiment, the measured rectangle-shaped second area has a length and width substantially the same as the length and width of the measured rectangle-shaped first area.

In another embodiment, the first transparent electrode 110 is optically coupled to one or more optical fibers 105 having dimensions substantially similar to the transparent plate 127. In this case, the one or more optical fibers 105 may have a length of L and a width of 2a, as shown in FIG. 1M.

In another embodiment, the first transparent electrode 110 includes a transparent conducting material disposed on the transparent plate 127. For example, the transparent electrode 110 may include, but is not limited to, a TCO coating deposited on the transparent electrode 110. For example, the TCO may include, but is not limited to, a conducting indium-tin-oxide (ITO) coating, an aluminum dope ZnO coating, an aluminum coating and the like.

In another embodiment, as shown in FIG. 1L, and described previously herein, the rectangle-shaped transparent electrode 110 and rectangle-shaped opaque electrode 110 may be surrounded by a fourth electrode 122, allowing for the determination of the shunt resistance of the p-n junction, as described throughout the present disclosure.

In one embodiment, the system 100 may include a first transparent plate 125 and a second transparent plate. It is noted herein that the JPV signal from the opaque second electrode 111 may be increased by including an identical transparent plate 125 positioned on the opposite side of the transparent electrode 110 from the opaque electrode 111, with the second transparent plate 125 being optically coupled to a bifurcated fiber 105 and the illumination source 107.

In another embodiment, the rectangle-shaped illumination area 127 may be oriented such that the length of the rectangle-shaped illumination area 127 is substantially parallel to a nearest tangent of an edge of the substrate 102.

FIG. 1N illustrates the electrode configuration with respect to edge 128 of the substrate 102. In FIG. 1N, c represents the distance between edges of the illumination area 125a and the illumination image 125b and the substrate edge 128. It is noted herein that the illumination area 125a and the illumination area image 125b are symmetrical with respect to the edge 128. It is noted herein that this mathematical imaging approach may be used for correction of JPV signals in cases where a JPV probe is near a wafer edge in order to implement edge correction.

In another embodiment, the controller 121 is configured to adjust a modulation frequency of the intensity modulated light emitted by the illumination source 107 to attain an attenuation of the second junction photovoltage signal from the second rectangle-shaped electrode 111 at or above a selected attenuation level. In another embodiment, the controller 121 is configured to determine a sheet resistance of a top layer of the p-n junction with at least one of the measured first junction photovoltage signal, the measured second junction photovoltage signal, a capacitance of the p-n junction or a distance of the rectangle illumination area from an edge of the semiconductor substrate.

It is further noted that the controller 121 may also apply one or more of the various calibration, correction, exclusion or shunt resistance calculation procedures described throughout the present disclosure in the context of the electrode/illumination configuration of FIGS. 1L-1N.

It is noted herein that system 100 may a rectangular electrode configuration, as shown in FIG. 1L-1N, to analyze the case where the sheet resistance of the p-n junction 103 is high. In addition, the rectangular electrode configuration, as shown in FIG. 1L-1N, may incorporate the edge exclusion correction technique, described previously herein (e.g., see equations 1-8). In the case where the transparent electrode 110 and the non-transparent electrode 111 are rectangular in shape, the magnitudes of JPV signals from transparent electrode 110, $V_1$, and the non-transparent electrode 111, $V_2$, can be expressed as:

$$V_1 = C_1 q (1-R) \Phi_0 R_S a \left[ 1 - 2 \frac{\sinh(ka)}{ka \exp(ka)} \right] \quad (41)$$

$$V_2 = C_2 2 q (1-R) \Phi_0 R_S \frac{\exp(-kb)[1 - \exp(ka)]}{k[1 + \coth(ka)]} \quad (42)$$

Where k is written as:

$$k = \sqrt{R_s G_{pn} + 2\pi i f R_s C_{pn}} \quad (43)$$

$$j = \sqrt{-1} \quad (44)$$

Where $\Phi_0$ represents the total light flux. Further, the capacitance, $C_{pn}$, of p-n junction is given by:

$$C_{pn} = \frac{\varepsilon_0 \varepsilon_S}{d} \quad (45)$$

Where $\epsilon_0$ and $\epsilon_S$ are the permittivity of vacuum and the permittivity of the semiconductor material respectively and d is thickness of p-n junction depletion region. In the case of LED structures d is thickness of active region within the associated quantum wells. In one embodiment, accurate measurements may be provided via light modulation with high enough frequency to diminish the contribution of p-n junction conductance below a selected threshold. In another embodiment, constants $C_1$ and $C_2$, which depend on the gain of amplification of the preamplifiers 112 and 113, may be calibrated using a signal generator connected to the wafer chuck 104.

In another embodiment, an edge exclusion correction may be implemented utilizing an image approach, as depicted in FIG. 1N. In the case where an edge exclusion correction is applied, the JPV signals from the transparent electrode 110, $V_{1C}$, and the non-transparent electrode 111, $V_{2C}$, may be represented by:

$$V_{1C} = \\ C_1 q (1-R) \Phi_0 R_S \left\{ a \left[ 1 - 2 \frac{\sinh(ka)}{ka \exp(ka)} \right] + \frac{\exp(-2kc)[1 - \exp(ka)]}{k[1 + \coth(ka)]} \right\} \quad (46)$$

$$V_{2C} = C_2 2 q (1-R) \Phi_0 R_S \\ \left\{ \frac{\exp(-kb)[1 - \exp(ka)]}{k[1 + \coth(ka)]} + \frac{\exp(-2kc)[1 - \exp(ka)]}{k[1 + \coth(ka)]} \right\} \quad (47)$$

In addition, the corrected JPV signals for electrodes 110 and 111 may be determined using an offset JPV signal, $V_3$, from electrode 116 via the following:

$$V_{1COR} = V_{1C} - \frac{S_1}{S_3} V_3 \quad (48)$$

$$V_{2COR} = V_{2C} - \frac{S_2}{S_3} V_3 \quad (49)$$

Where $S_1$, $S_2$, $S_3$ are the areas of electrodes 110, 111 and 116. For example, in the case of GaInN or AlGaInP LEDs, the capacitance of the p-n junction is determined by thickness of the undoped active layer, d, and can be determined again using formula:

$$C_{pn} = \frac{\varepsilon_S \epsilon_0}{d} \quad (50)$$

In one embodiment, the capacitance of the p-n junction, Cpn, may be determined using corrected JPV signals $V_{1CCor}$ and $V_{2CCor}$ acquire from a calibration p-n junction having a known sheet resistances $R_{SC1}$ by the following relationships:

$$\frac{V_{1CCor}}{V_{2CCor}} = \frac{C_1}{C_2} \frac{a \left[ 1 - 2 \frac{\sinh(k_C a)}{ka \exp(k_C a)} \right] + \frac{\exp(-2k_C c)[1 - \exp(k_C a)]}{k[1 + \coth(k_C a)]}}{\frac{\exp(-k_C b)[1 - \exp(k_C a)]}{k_C [1 + \coth(k_C a)]} + \frac{\exp(-2k_C c)[1 - \exp(k_C a)]}{k[1 + \coth(k_C a)]}} \quad (51)$$

$$k_C = \sqrt{2\pi i f R_{SC1} C_{pn}} \quad (52)$$

Further, the top p-n junction layer sheet resistance $R_{S1}$ of the measured, or test, p-n junction 103 may be found using the measured capacitance, $C_{pn}$, and the JPV signals $V_{1M}$, $V_{2M}$, $V_{3M}$ from the measured p-n junction and the following relationships:

$$\frac{V_{1Mcor}}{V_{2Mcor}} = \frac{C_1}{C_2} \frac{a \left[ 1 - 2 \frac{\sinh(ka)}{ka \exp(ka)} \right] + \frac{\exp(-2kc)[1 - \exp(ka)]}{k[1 + \coth(ka)]}}{\frac{\exp(-kb)[1 - \exp(ka)]}{k[1 + \coth(ka)]} + \frac{\exp(-2kc)[1 - \exp(ka)]}{k[1 + \coth(ka)]}} \quad (53)$$

$$k = \sqrt{2\pi i f R_{S1} C_{pn}} \quad (54)$$

Where $V_{1MCor}$, $V_{2MCor}$ represent the corrected photovoltage signals from (48) and (49) described previously herein.

FIG. 1O illustrates a flow diagram 190 depicting a method for contactless measurement of one or more characteristics of one or more p-n junctions with a rectangular illumination area, in accordance with one or more embodiments of the present invention. Step 192 includes illuminating a rectangle-shaped illumination area of a surface of a p-n junction with intensity modulated light at a modulation frequency. Step 193 includes measuring a first junction photovoltage signal from a rectangular-shaped first area of the surface of the p-n junction within the rectangle-shaped illumination area with a first transparent electrode. Step 194 includes measuring a second junction photovoltage signal from a rectangle-shaped second area of the surface of the p-n junction with a second electrode outside and laterally proximate to the illumination area. Step 195 includes adjusting the modulation frequency of the intensity modulated light to attain an attenuation of the second junction photovoltage signal at or above a selected attenuation level. Step 196 includes determining a sheet resistance of a top layer of the p-n junction with the measured first junction photovoltage signal, the measured second junction photovoltage signal, a capacitance of the p-n junction or a distance of the rectangle illumination area from an edge of the semiconductor substrate.

Figure 2B:
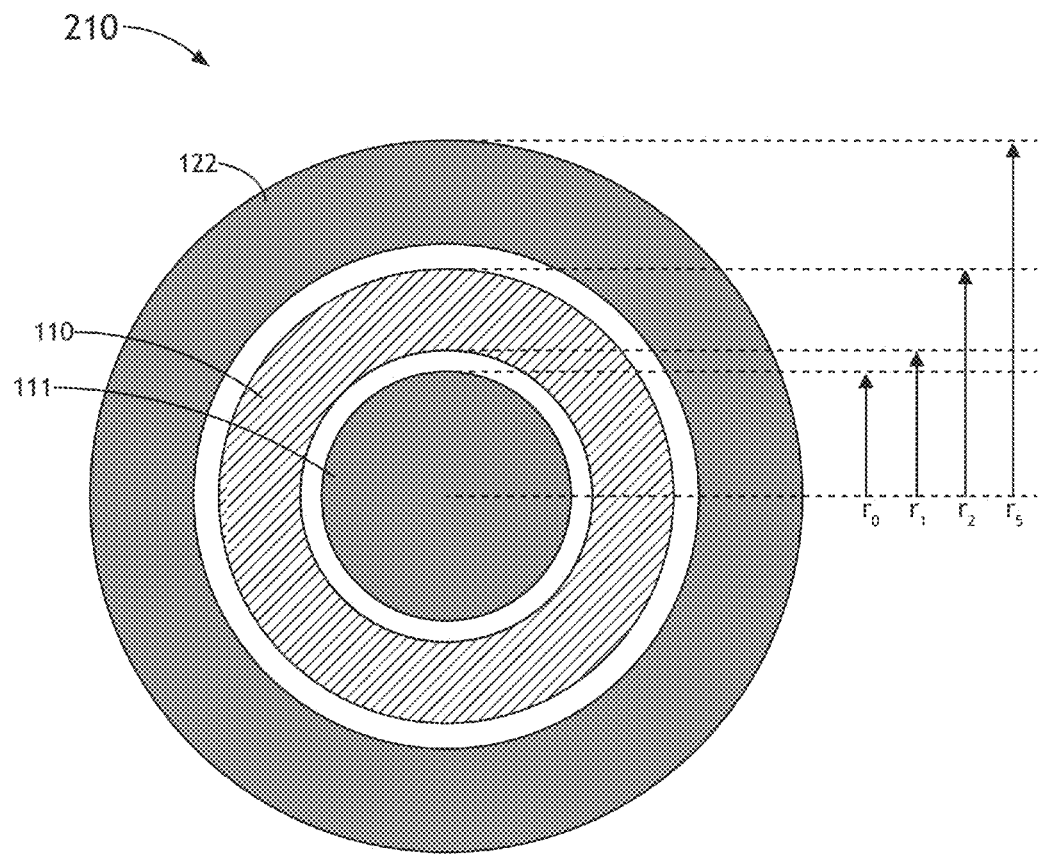
Figure 2C:
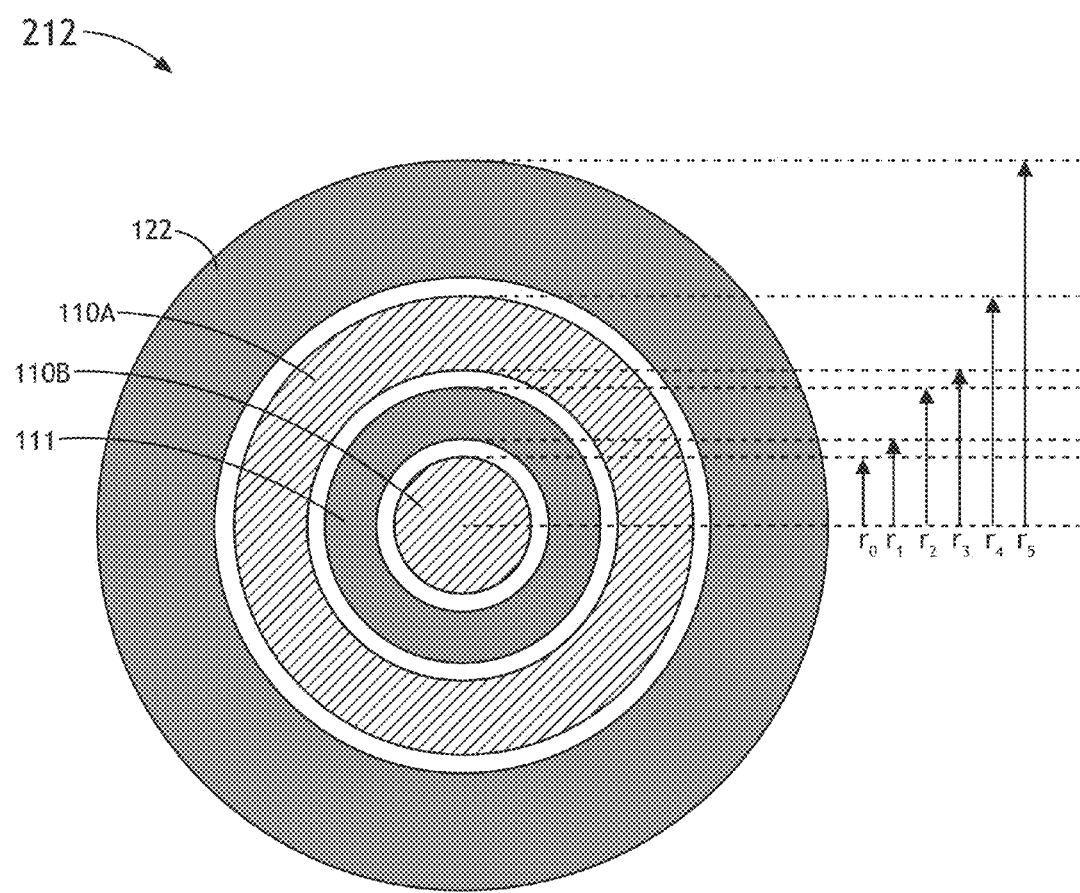

FIGS. 2A-C illustrate the system 100 equipped with a lens 202 to form a ring-type illumination area, in accordance with one or more embodiments of the present disclosure. In one embodiment, as shown in FIG. 2A, the lens 202 is configured to couple the output of the illumination source 107 to the surface 106 of the p-n junction 103. In another embodiment, the use of one or more opaque electrodes 111 serves to form one or more shadowed areas A2 within the one or more illumination areas A1 of the first surface of the p-n junction 103. In another embodiment, the use of one or more transparent electrodes 110 serves to form one or more illumination areas A1 on the first surface of the p-n junction 103. In another embodiment, the ring-type illumination area(s) may be formed between the opaque electrode(s) 111 and the opaque surrounding electrode 122 (described previously herein).

It is noted herein that such a configuration is useful in carrying out non-contact sheet resistance measurements on layers with very large sheet resistance, such as, but not limited to, p-GaN layers.

In one embodiment, the one or more illumination areas A1 encompass the one or more shadowed areas A2. In one or more embodiments, some of the one or more shadowed areas A2 may encompass one or more illumination areas A1. In another embodiment, the one or more illumination areas A1 include a first illumination area and a second illumination, where the second illumination area surrounds the first illumination area. In another embodiment, a shadowed area is located between the first illumination area and the second illumination. It is noted herein that the various illumination area/shadowed area configurations may be implemented via a corresponding transparent electrode 110 (e.g., TCO coated transparent substrate)/opaque electrode 111 (e.g., metal electrode) arrangement.

In one embodiment, as shown in FIG. 2B, an opaque disk-shaped electrode 111 is surrounded by a transparent ring-shaped electrode 110. Further, a ring-shaped third electrode 122 may surround both electrodes 110 and 111. For example, as shown in FIG. 2B, the opaque disk-shaped electrode 111 may have a radius $r_0$, while the surrounding ring-shaped electrode 110 has an inner radius of $r_1$ and an outer radius of $r_2$ and the additional opaque electrode 122 (for detecting the JPV signal outside of the illumination area) has an outer radius $r_5$, where $r_0 < r_1 < r_2 < r_5$.

In one embodiment, as shown in FIG. 2C, an opaque ring-shaped electrode 111 is located between a first transparent ring-shaped electrode 110A and a second disc-shaped electrode 110B. Again, a ring-shaped third electrode 122 may surround the electrodes 110A, 110B and 111. For example, as shown in FIG. 2C, the transparent disk-shaped electrode 110B may have a radius $r_0$, the surrounding ring-shaped opaque electrode 111 has an inner radius of $r_1$ and an outer radius of $r_2$, the outer transparent ring-shaped electrode 110A has an inner radius of $r_3$ and an outer radius of $r_4$ and the additional opaque electrode 122 has an outer radius $r_5$, where $r_0 < r_1 < r_2 < r_3 < r_4 < r_5$.

It is further noted that the controller 121 may also apply one or more of the various calibration, correction, edge exclusion, or shunt resistance calculation procedures described throughout the present disclosure in the context of the electrode/illumination configuration of FIGS. 2A-2C.

In another embodiment, the controller 121 may utilize one or more measurements from the first JPV measurement unit 142 including one or more transparent electrodes 110, the second JPV measurement unit 143 including one or more opaque electrodes 111, the additional JPV measurement unit 145 including one or more opaque electrodes 122 to determine one or more characteristics of the p-n junction 103. Various characteristics determined utilizing the JPV measurements are described further herein.

Figure 2D:
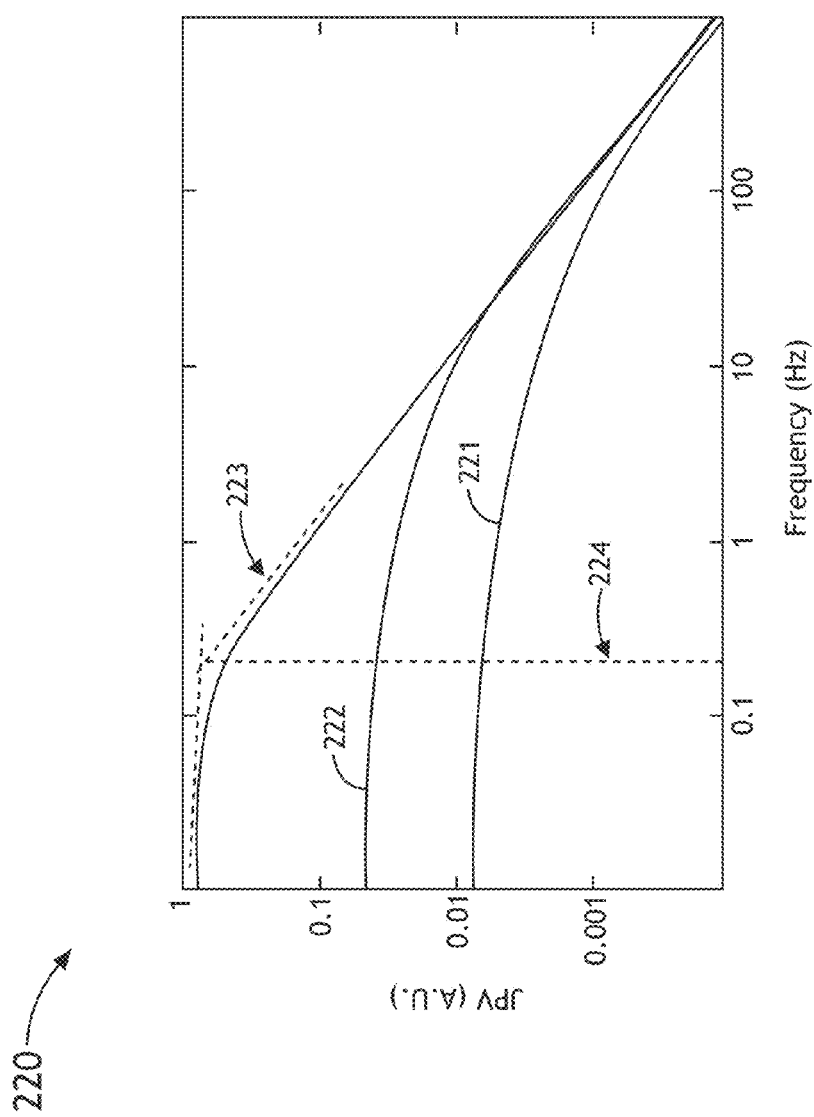
FIG. 2D illustrates a graph depicting a JPV signal acquired from a series of electrode configurations as a function of frequency, in accordance with one or more embodiments of the present disclosure.

FIG. 2D illustrates a graph 220 of the frequency dependence of the sum of the JPV signals from the electrodes 110, 111 and 122 for different radii of electrode 122 ($R_{EL}=r_5$), in accordance with one or more embodiments of the present disclosure. The curves 221-223 were derived assuming a p-n junction capacitance per unit area of $C_{p-n}=10^{-7}$ F/cm², a p-n junction shunt resistance of $R_{SH}=10^7$ ohm cm², a p-type layer 106 sheet resistance $R_S$ of $5*10^5$ Ohm/sq, which are typical for GaN LED structures. See, e.g., S. W. Lee, et al, Appl. Phys. Lett., 89, 132117, 2006; C. H. Cuo, et al, IEEE Electron. Dev. Lett., 23, 240, 2002. In simulating curves 221-223 it was assumed that light beam radius $r_0=0.35$ cm and the wafer radius $R_W=7.5$ cm. Curve 221 represents the sum of the signals $V_{sum}$ as a function of light modulating frequency for an electrode radius $R_{EL}=0.35$. Curve 222 corresponds to an electrode radius of $R_{EL}=1$ cm and curve 223 corresponds to an electrode radius of $R_{EL}=8$ cm. The dotted line 224 represents the cutoff frequency $F_C=0.12$ Hz for curve 223.

Figure 2E:
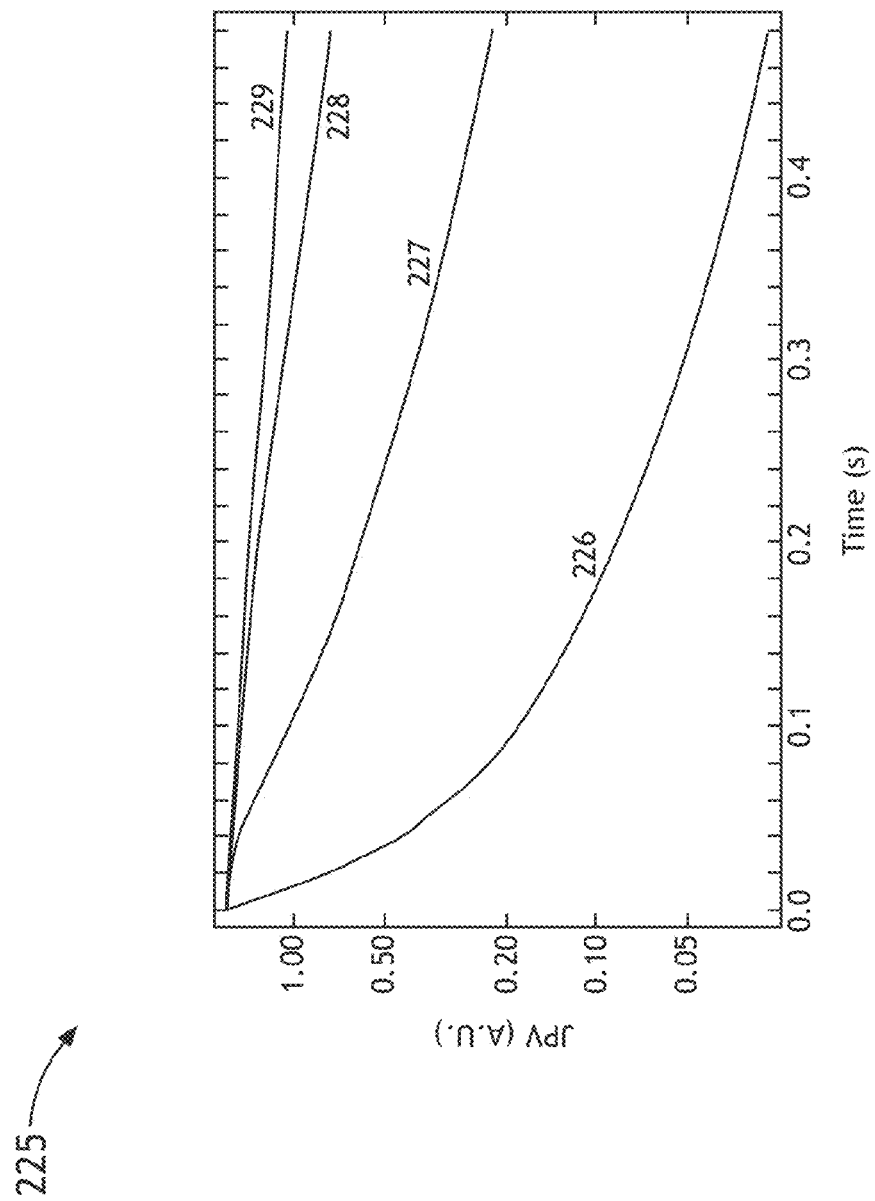
FIG. 2E illustrates a graph depicting a JPV signal acquired from a series of electrode configurations as a function of time, in accordance with one or more embodiments of the present disclosure.

FIG. 2E illustrates a graph 225 of the simulated two dimensional (2D) JPV transient (decay in logarithmic scale) of sum $V_{SUM}$ signals from electrodes 110, 111, 122 as function of outer radius of electrode 122 $R_{EL}=r_5$ following a short light impulse, in accordance with one or more embodiments of the present invention. The curves 226-229 were derived assuming a p-n junction capacitance per unit area of $C_{p-n}=10^{-7}$ F/cm², a p-n junction shunt resistance of $R_{SH}=10^7$ ohm cm², a p-type layer 106 sheet resistance $R_S$ of $5*10^5$ Ohm/sq, which, again, are typical for GaN LED structures. In simulating curves 226-229 it was assumed that light beam radius $r_0=0.35$ cm and the wafer radius $R_W=7.5$ cm. Curve 226 represents the $V_{sum}$ transient measured by electrodes 110, 111 and 122 for an electrode radius $R_{EL}=1$ cm. Curve 227 corresponds to an electrode radius of $R_{EL}=3$ cm. Curve 228 corresponds to an electrode radius $R_{EL}=5$ cm and curve 229 corresponds to an electrode radius of $R_{EL}=8$ cm, which coincides with the one-dimensional simulation.

It is noted herein that with equations (1-8) the magnitudes of JPV signals from transparent ring electrode 110, $V_1$, and non-transparent disc electrode 111, $V_2$ for associated with the embodiment of system 100 depicted in FIGS. 2A-2C (useful in high sheet resistance measurement) are given by:

$$V_1 = \quad (55)$$
$$C_1 \frac{q(1-R)\Phi_0 R_S}{k^2}\left[1 - 2\frac{2}{r_2^2 - r_1^2}\{r_1 I_1(kr_1)[r_1 K_1(kr_1) - r_2 K_1(kr_2)] + \right.$$
$$\left. r_2 K_1(kr_2)[r_1 I_1(kr_2) - r_2 I_1(kr_0)]\}\right]$$

$$V_2 = C_2 \frac{2q(1-R)\Phi_0 R_S}{k^2(r_2^2 - r_1^2)} r_0 I_1(kr_0)[r_2 K_1(kr_1) - r_1 K_1(kr_2)] \quad (56)$$

Where $$k = \sqrt{R_s G_{pn} + 2\pi i f R_s C_{pn}} \quad (57)$$

$I_0(z)$, $I_1(z)$, are modified Bessel functions of the first kind;
$K_0(z)$, $K_1(z)$ are modified Bessel functions of the second kind;
$\Phi_0$ is the total light flux.

Capacitance of p-n junction can be determined using formula:

$$C_{pn} = \frac{\varepsilon_0 \varepsilon_S}{d} \quad (58)$$

Where $\varepsilon_0$, $\varepsilon_S$ are permittivity of vacuum and the semiconductor material and d is thickness of p-n junction depletion region. In the case of LED structures, d is again the thickness of the active region within quantum wells. It is noted herein that to improve the accuracy of measurement the light modulation frequency should be high enough to diminish contribution of p-n junction conductance to a selected level and constants $C_1$ and $C_2$, which, again, depend on the gain of amplification of the preamplifiers 114 and 115 should be calibrated using signal generator 119 and switch 210.

In the case of the probe configuration depicted in FIG. 2C, additional relationships may be used. In this case, based on equations (1-8), the magnitudes of the JPV signals from transparent electrodes 110A and 110B, $V_1 = V_{11} + V_{12} + V_{31} + V_{32}$, and the opaque electrode 111, $V_2 = V_{21} + V_{22}$, is provided by:

$$V_{11} = \quad (59)$$
$$C_1 \frac{q(1-R)\Phi_0 R_S}{k^2}\left[1 - 2\frac{2}{r_2^2 - r_1^2}\{r_1 I_1(kr_1)[r_1 K_1(kr_1) - r_2 K_1(kr_2)] + \right.$$
$$\left. r_2 K_1(kr_2)[r_1 I_1(kr_2) - r_2 I_1(kr_0)]\}\right]$$

$$V_{12} = C_1 \frac{2q(1-R)\Phi_d R_S}{k^2 r_0} I_1(kr_0)[r_4 K_1(kr_3) - r_3 K_1(kr_4)] \quad (60)$$

$$V_{21} = C_2 \frac{2q(1-R)\Phi_d R_S}{k^2 r_0} I_1(kr_0)[r_1 K_1(kr_1) - r_2 K_1(kr_2)] \quad (61)$$

$$V_{22} = C_2 \frac{2q(1-R)\Phi_r R_S}{k^2(r_3^2 - r_2^2)} [r_3 K_1(kr_2) - r_2 K_1(kr_3)][r_2 I_1(kr_2) - r_1 I_1(kr_0)] \quad (62)$$

$$V_{31} = C_3 \frac{2q(1-R)\Phi_r R_S}{k^2(r_4^2 - r_3^2)} r_0 I_1(kr_0)[r_4 K_1(kr_3) - r_3 K_1(kr_4)] \quad (63)$$

$$V_{32} = C_3 \frac{q(1-R)\Phi_d R_S}{k^2}[1 - 2I_1(kr_0) r_1 K_1(kr_0)] \quad (64)$$

Where $\Phi_r$ and $\Phi_d$ are light fluxes directed from ring 110A and disk 110B electrodes onto wafer 102.

In the case where $G_{p-n} \ll 2\pi f C_{p-n}$, sheet resistance of the top layer 106 can be determined by the controller 121 using measured JPV signals $V_1$, $V_2$, capacitance of p-n junction (58) and formulas (55) and (56) for the electrode configuration depicted at FIG. 2B or (59)-(64) for the electrode configuration depicted in FIG. 2C and (57).

In addition, a calibration procedure can be used to determine the p-n junction capacitance. This procedure includes the measurement of $V_{1C}$, $V_{2C}$ for a calibration wafer with known sheet resistance $R_{SC}$ and the calculation of the p-n junction capacitance using (55) and (56) for electrode configuration depicted in FIG. 2B or (59)-(64) for electrode configuration depicted at FIG. 2C and (57). Assuming that thickness d of p-n junction depletion region, and, thus, the capacitance of p-n junctions, are the same for measured wafers, the capacitance value can be used for calculation of sheet resistance of measured layers 106.

In addition, corrected JPV signals for JPV signal from electrodes 110 and 111 can be calculated using offset JPV signal from electrode 106, $V_3$, and formulas:

$$V_{1COR} = V_{1C} - \frac{S_1}{S_3} V_3 \quad (65)$$

$$V_{2COR} = V_{2C} - \frac{S_2}{S_3} V_3 \quad (66)$$

Where $S_1$, $S_2$, $S_3$ are the areas of electrodes 110, 111 and 116.

In the case of GaInN or AlGaInP LEDs, capacitance of pn junction is again determined by thickness of the undoped active layer, d, and can be determined using formula:

$$C_{pn} = \frac{\varepsilon_S \varepsilon_0}{d} \quad (67)$$

Where $\varepsilon_S$ and $\varepsilon_0$ are the permittivity of semiconductor material and vacuum. The capacitance of the p-n junction, Cpn, can be determined using corrected JPV signals $V_{1CCor}$, $V_{2CCor}$ measured on a calibration p-n junction with known sheet resistances $R_{SC1}$ and the following relationships:

$$\frac{V_{1CCor}}{V_{2CCor}} = \quad (68)$$
$$\frac{C_1}{C_2}(r_2^2 - r_1^2) \frac{1 - 2\frac{2}{r_2^2 - r_1^2}\{r_1 I_1(k_C r_1)[r_1 K_1(k_C r_1) - r_2 K_1(k_C r_2)] + r_2 K_1(k_C r_2)[r_1 I_1(k_C r_2) - r_2 I_1(k_C r_0)]\}}{r_0 I_1(k_C r_0)[r_2 K_1(k_C r_1) - r_1 K_1(k_C r_2)]}$$

$$k_C = \sqrt{2\pi i f R_{SC1} C_{pn}} \quad (69)$$

Based on the measured capacitance, $C_{pn}$, and the measured JPV signals on tested p-n junction $V_{1M}$, $V_{2M}$, $V_{3M}$, the sheet resistances $R_{S1}$ can be determined using the following:

$$\frac{V_{1MCor}}{V_{2MCor}} = \quad (70)$$
$$\frac{C_1}{C_2}(r_2^2 - r_1^2) \frac{1 - 2\frac{2}{r_2^2 - r_1^2}\{r_1 I_1(kr_1)[r_1 K_1(kr_1) - r_2 K_1(kr_2)] + r_2 K_1(kr_2)[r_1 I_1(kr_2) - r_2 I_1(kr_0)]\}}{r_0 I_1(kr_0)[r_2 K_1(kr_1) - r_1 K_1(kr_2)]}$$

$$k = \sqrt{2\pi i f R_{S1} C_{pn}} \tag{71}$$

Where $V_{1MCor}$, $V_{2MCor}$ represent corrected photovoltages based on formulas (65) and (66).

According to formula (57), in the case where conductance of the p-n junction is large ($G_{p-n} > 2\pi f C_{p-n}$), then p-n junction conductance $G_{p-n}$ should be measured for accurate measurements of sheet resistance. $G_{p-n}$ should may then be used in formula (57) to calculate $R_S$ using equations (68) and (70). In this case, the procedure may also include measurement of p-n junction conductance. As it will be shown below, p-n junction conductance can be accurately measured using frequency dependent JPV or pulse illumination and transient approaches using a large JPV probe that covers the spreading JPV area. This procedure may utilized the measurement of the sum of JPV signals from all electrodes 110, 111, 122 (FIG. 1A-2C), $V_{SUM} = V_1 + V_2 + V_3$ (where $V_3$ is from the outer electrode 122), at least at two different frequencies (or by analyzing the tangent of the decay signal of the sum of the JPV signals $V_{SUM}$ from all electrodes under impulse illumination).

As shown at FIG. 2D, depicting simulated curves 221, 222 and 223, an increase of electrode radius $r_5$ leads to increased dependence of the quantity $V_{SUM}(f)$ on light modulating frequency and leads to the appearance of a clear cut-off frequency fc, 224 when $r_5 = R_{EL} > R_W$, where $R_W$ is radius of wafer 102. In the case where radius $r_5$ of electrode 122 is larger than radius $R_W$ of wafer 102 ($r_5 > R_W$), the JPV signal as function of light modulating frequency f is:

$$|V_{SUM}(f, C_{pn}, G_{pn})| = \frac{q(1-R)\Phi_0}{G_{pn}\sqrt{1 + 4\pi^2 f^2 C_{pn}^2/G_{pn}^2}} = \frac{q(1-R)\Phi_0}{G_{pn}\sqrt{1 + f^2/f_C^2}} \tag{72}$$

Where cut-off frequency, $f_C = G_{p-n}/(2\pi C_{p-n})$. Using the measured sum of JPV signals $V_{SUM1}$ and $V_{SUM2}$ at frequencies $f_1$ and $f_2$ and formula (19) the p-n junction conductance can be determined as:

$$C_{pn} = 2\pi C_{pn} \sqrt{\frac{f_2^2 V_{SUM2}^2 - f_1^2 V_{SUM1}^2}{V_{SUM1}^2 - V_{SUM2}^2}} \tag{73}$$

Junction conductance may also be determined using the system 100 and measurements of the sum of the JPV transient $V_{SUM}(t)$ under light impulse. As shown in FIG. 2E, in the case where the diameter of electrode is larger than diameter of wafer, the JPV decay, in logarithmic scale 229, is determined by a one-dimensional solution. If $R_{EL} < R_W$ (curves 226, 227 and 228) the initial part of decay (at low $t < t_M$) is also determined by a one dimensional solution and $Gp\text{-}n = R_{SH}^{-1}$, but if $t > t_M$ decay also depends on sheet resistance $R_S$. If the diameter of electrode is lower than diameter of the wafer, then $R_{SH}$ can be determined from the slope B of tangent 229 Tan(t)=A+B(t-$t_0$) to curves $V_{SUM}(t)$ 227 and 228 in logarithmic scale crossing initial value JPV decay at t=0:

$$R_{SH} = \frac{1}{BC_{pn}} \tag{74}$$

The tangent method and formula (74) may also be used for mapping of shunt resistance and p-n junction conductance with spatial resolution not limited by the electrode dimensions.

Sheet resistance of a top p-type Mg doped layer of different GaN LED structures before and after anneal has been measured. Typical values of sheet resistance of such layer of annealed wafers were found to be in the range $0.2 \times 10^6$ Ohm/sq-$10^6$ Ohm/sq and about $10^7$ Ohm/sq for unannealed wafers.

Figure 2F:
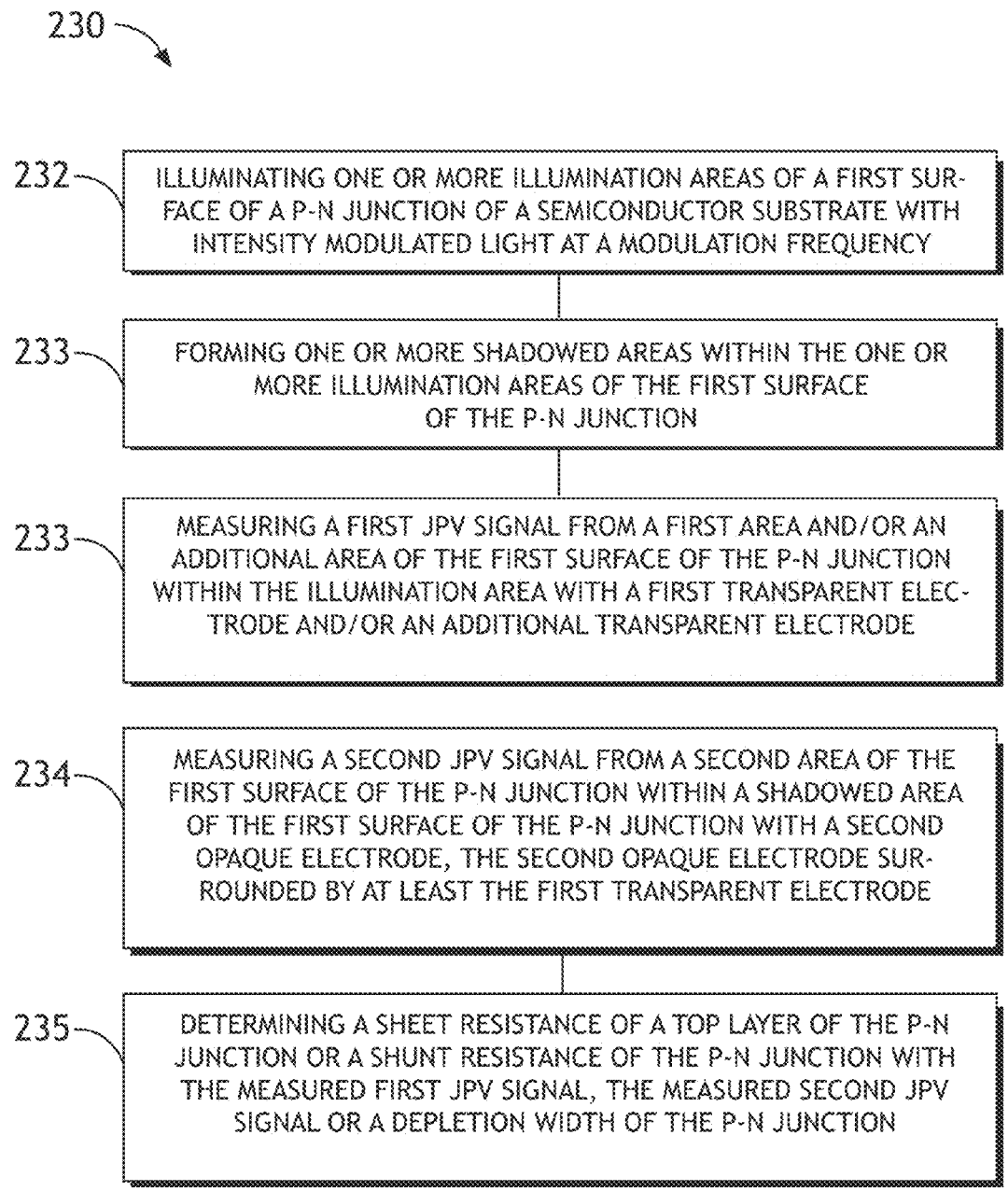

FIG. 2F illustrates a flow diagram depicting a method 230 for contactless measurement of one or more characteristics of one or more p-n junctions, in accordance with one or more embodiments of the present invention. Step 232 includes illuminating one or more illumination areas of a first surface of a p-n junction of a semiconductor substrate with intensity modulated light at a modulation frequency. Step 233 includes forming one or more shadowed areas within the one or more illumination areas of the first surface of the p-n junction. Step 233 includes measuring a first junction photovoltage signal from a first area and/or an additional area of the first surface of the p-n junction within the illumination area with a first transparent electrode and/or an additional transparent electrode. Step 234 includes measuring a second junction photovoltage signal from a second area of the first surface of the p-n junction within a shadowed area of the first surface of the p-n junction with a second opaque electrode, the second opaque electrode surrounded by at least the first transparent electrode. Step 235 includes determining a sheet resistance of a top layer of the p-n junction or a shunt resistance of the p-n junction with the measured first junction photovoltage signal, the measured second junction photovoltage signal or a depletion width of the p-n junction.

Figure 2G:
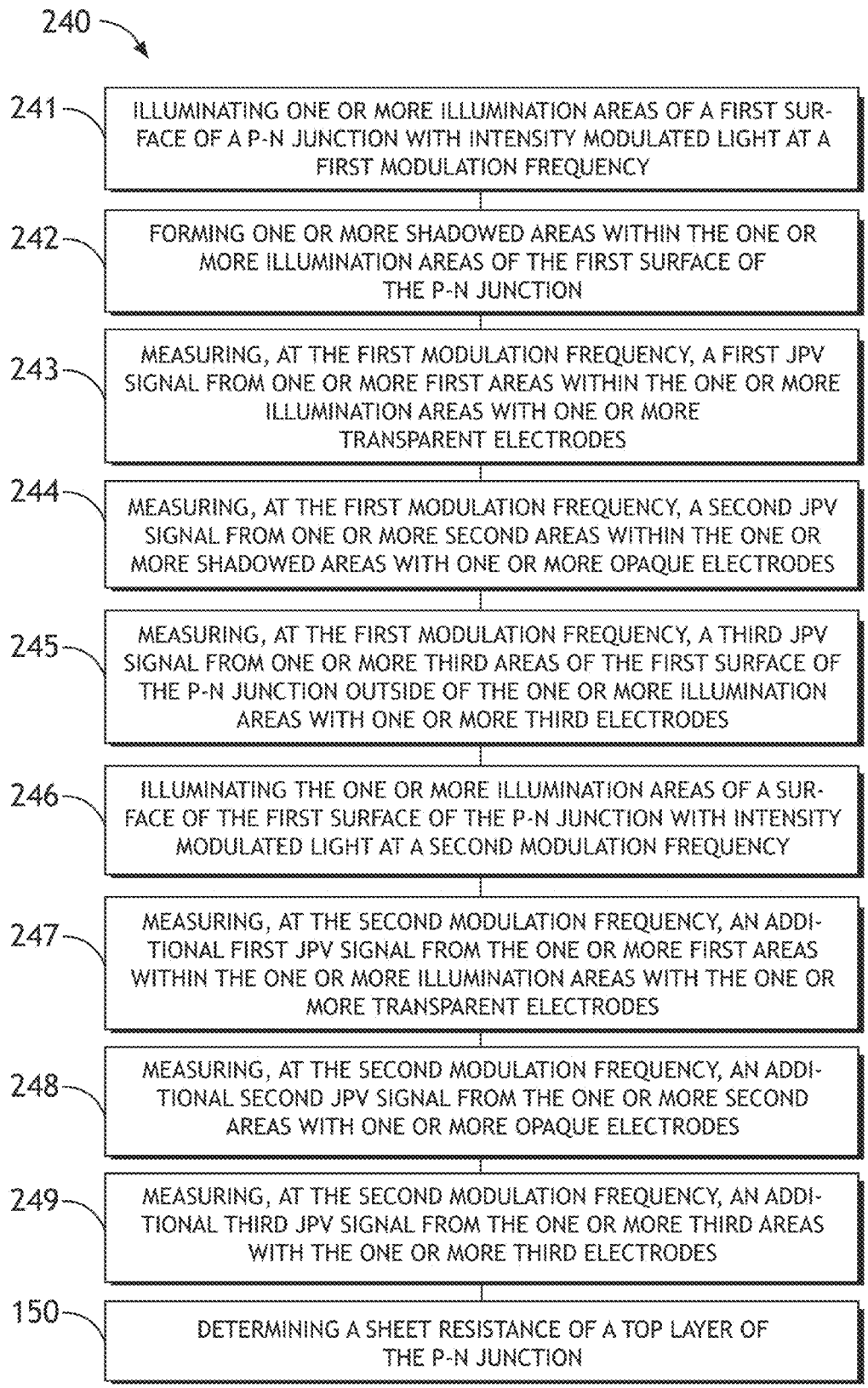

FIG. 2G illustrates a flow diagram depicting a method 240 for contactless measurement of one or more characteristics of one or more p-n junctions, in accordance with one or more embodiments of the present invention. Step 241 includes illuminating one or more illumination areas of a first surface of a p-n junction with intensity modulated light at a first modulation frequency Step 242 forming one or more shadowed areas within the one or more illumination areas of the first surface of the p-n junction. Step 243 measuring, at the first modulation frequency, a first junction photovoltage signal from one or more first areas within the one or more illumination areas with one or more transparent electrodes. Step 244 measuring, at the first modulation frequency, a second junction photovoltage signal from one or more second areas within the one or more shadowed areas with one or more opaque electrodes. Step 245 measuring, at the first modulation frequency, a third junction photovoltage signal from one or more third areas of the first surface of the p-n junction outside of the one or more illumination areas with one or more third electrodes. Step 246 illuminating the one or more illumination areas of a surface of the first surface of the p-n junction with intensity modulated light at a second modulation frequency. Step 247 measuring, at the second modulation frequency, an additional first junction photovoltage signal from the one or more first areas within the one or more illumination areas with the one or more transparent electrodes. Step 248 measuring, at the second modulation frequency, an additional second junction photovoltage signal from the one or more second areas with one or more opaque electrodes. Step 249 measuring, at the second modulation frequency, an additional third junction photovoltage signal from the one or more third areas with the one or more third electrodes. Step 250 determining a sheet resistance of a top layer of the p-n junction.

Figure 2H:
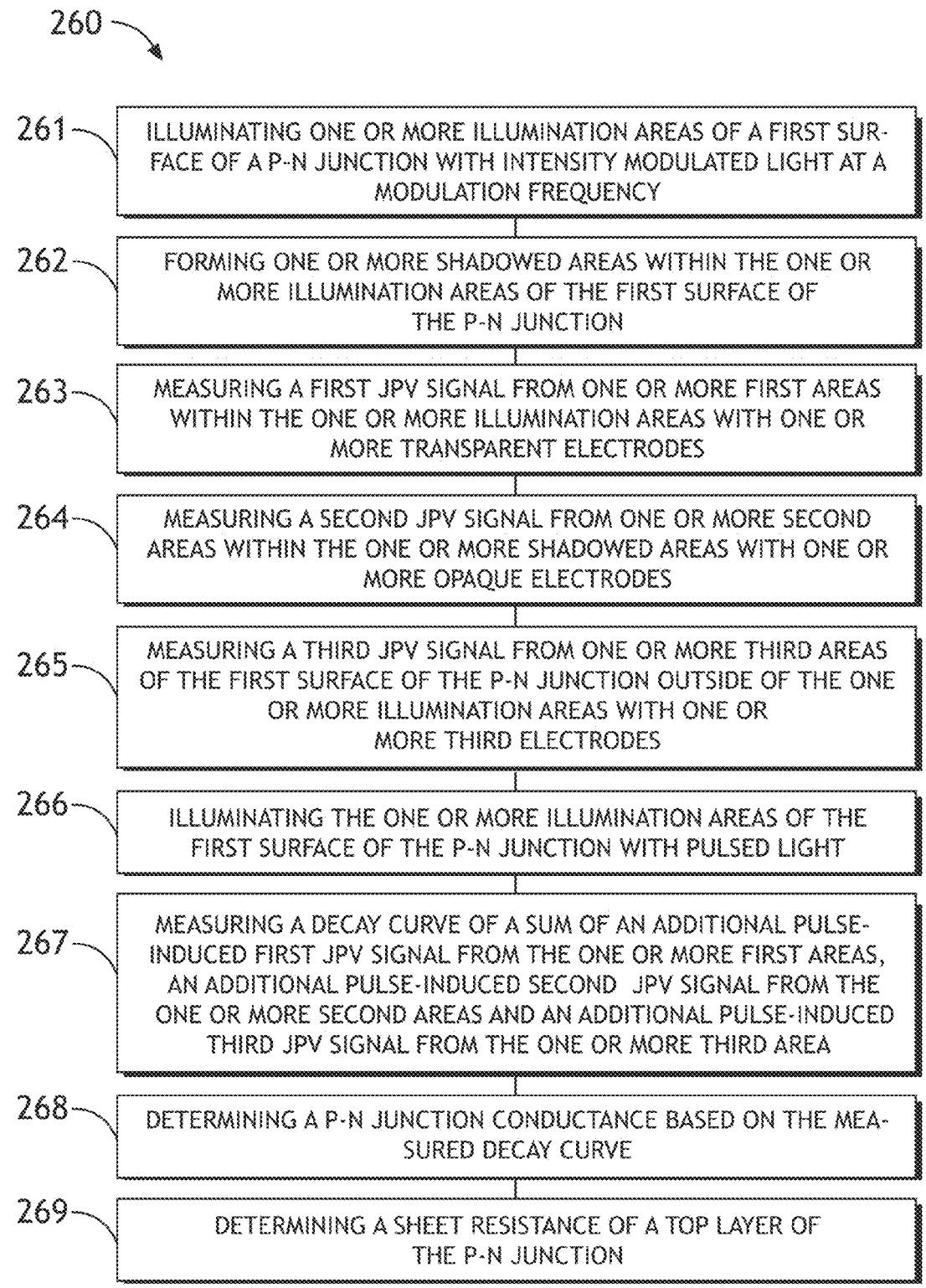
Figure 21:
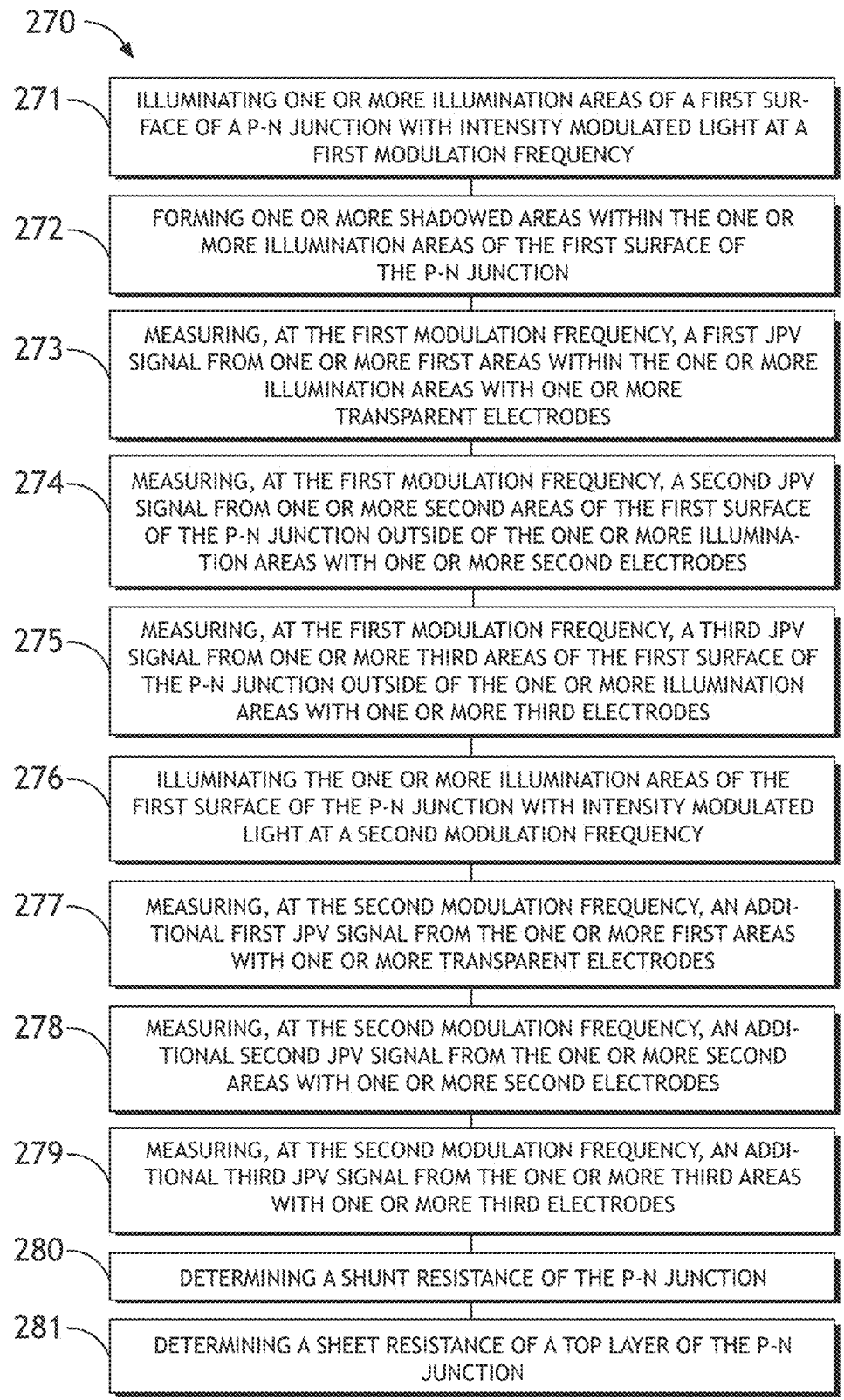

FIG. 2H illustrates a flow diagram depicting a method 260 for contactless measurement of one or more characteristics of one or more p-n junctions, in accordance with one or more embodiments of the present invention. Step 261 includes illuminating one or more illumination areas of a first surface of a p-n junction with intensity modulated light at a modulation frequency. Step 262 includes forming one or more shadowed areas within the one or more illumination areas of the first surface of the p-n junction. Step 263 includes measuring a first junction photovoltage signal from one or more first areas within the one or more illumination areas with one or more transparent electrodes. Step 264 includes measuring a second junction photovoltage signal from one or more second areas within the one or more shadowed areas with one or more opaque electrodes. Step 265 includes measuring a third junction photovoltage signal from one or more third areas of the first surface of the p-n junction outside of the one or more illumination areas with one or more third electrodes. Step 266 includes illuminating the one or more illumination areas of the first surface of the p-n junction with pulsed light. Step 267 includes measuring a decay curve of a sum of an additional pulse-induced first junction photovoltage signal from the one or more first areas, an additional pulse-induced second junction photovoltage signal from the one or more second areas and an additional pulse-induced third junction photovoltage signal from the one or more third areas. Step 268 includes determining a p-n junction conductance based on the measured decay curve. Step 269 includes determining a sheet resistance of a top layer of the p-n junction.

FIG. 2I illustrates a flow diagram depicting a method 270 for contactless measurement of one or more characteristics of one or more p-n junctions, in accordance with one or more embodiments of the present invention. Step 271 includes illuminating one or more illumination areas of a first surface of a p-n junction with intensity modulated light at a first modulation frequency. Step 272 includes forming one or more shadowed areas within the one or more illumination areas of the first surface of the p-n junction. Step 273 includes measuring, at the first modulation frequency, a first junction photovoltage signal from one or more first areas within the one or more illumination areas with one or more transparent electrodes. Step 274 includes measuring, at the first modulation frequency, a second junction photovoltage signal from one or more second areas of the first surface of the p-n junction outside of the one or more illumination areas with one or more second electrodes. Step 275 includes measuring, at the first modulation frequency, a third junction photovoltage signal from one or more third areas of the first surface of the p-n junction outside of the one or more illumination areas with one or more third electrodes. Step 276 includes illuminating the one or more illumination areas of the first surface of the p-n junction with intensity modulated light at a second modulation frequency. Step 277 includes measuring, at the second modulation frequency, an additional first junction photovoltage signal from the one or more first areas with one or more transparent electrodes. Step 278 includes measuring, at the second modulation frequency, an additional second junction photovoltage signal from the one or more second areas with one or more second electrodes. Step 279 includes measuring, at the second modulation frequency, an additional third junction photovoltage signal from the one or more third areas with one or more third electrodes. Step 280 includes determining a shunt resistance of the p-n junction. Step 281 includes determining a sheet resistance of a top layer of the p-n junction.

Figure 2J:
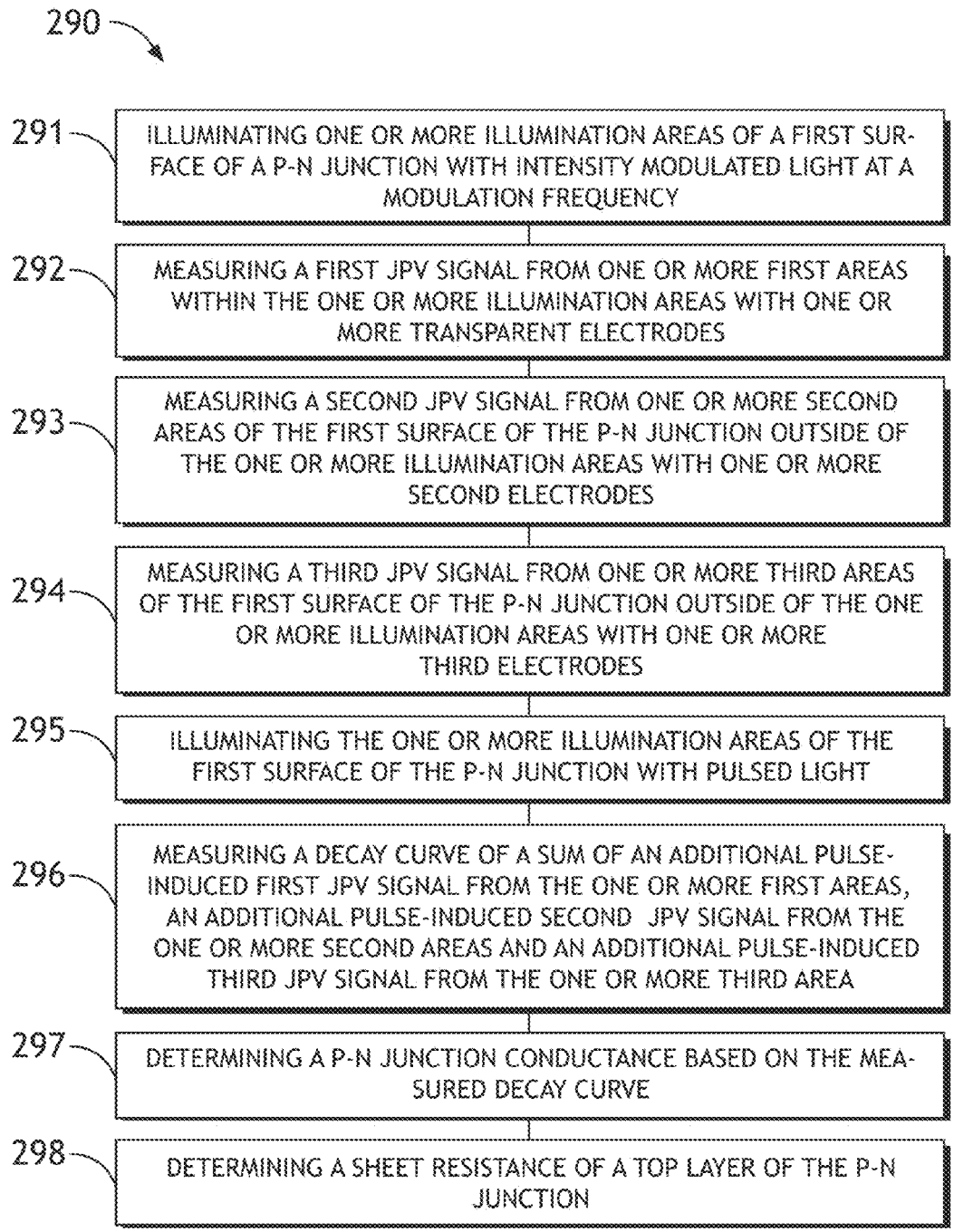
Figure 3A:
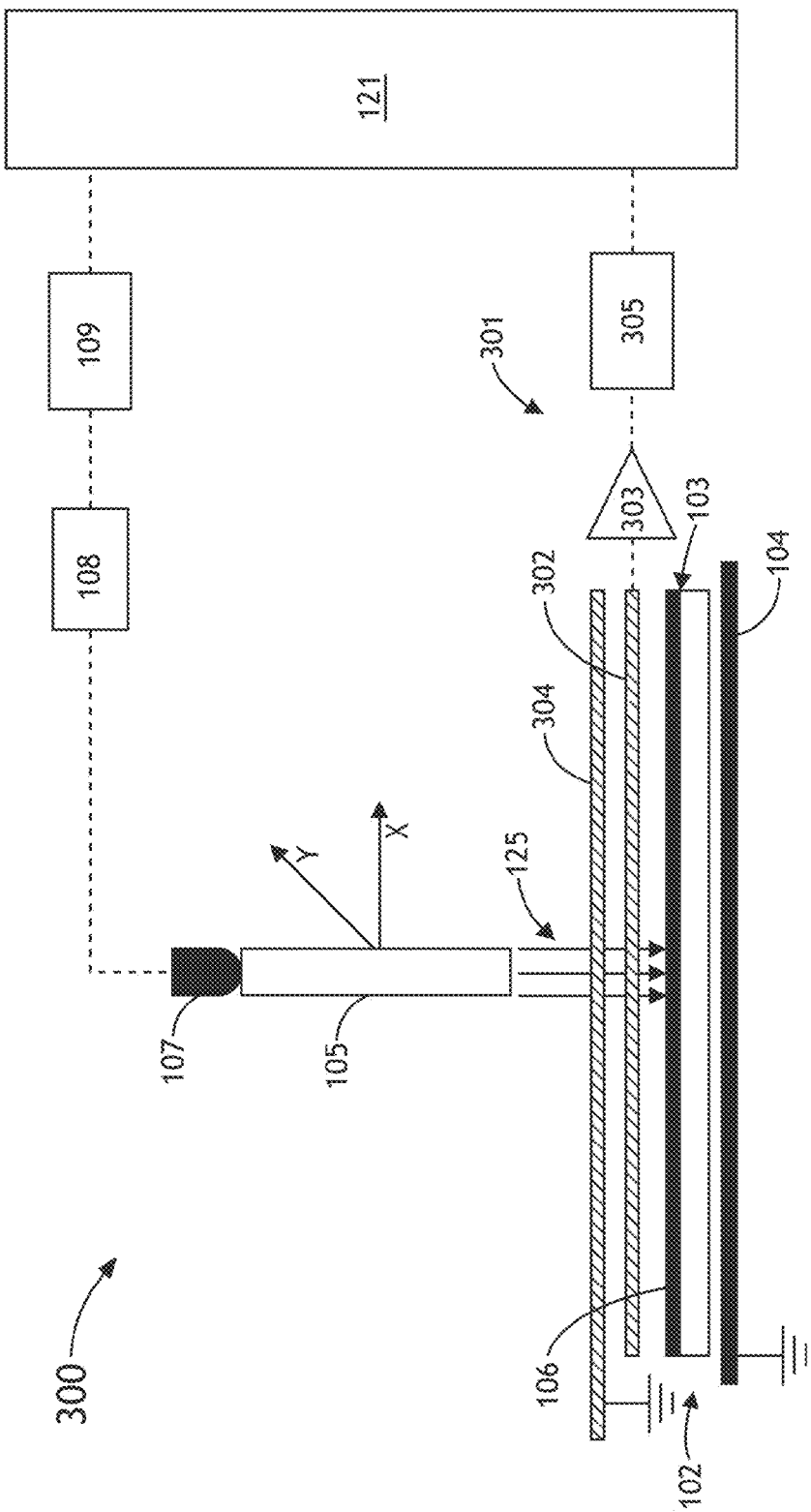
Figure 3B:
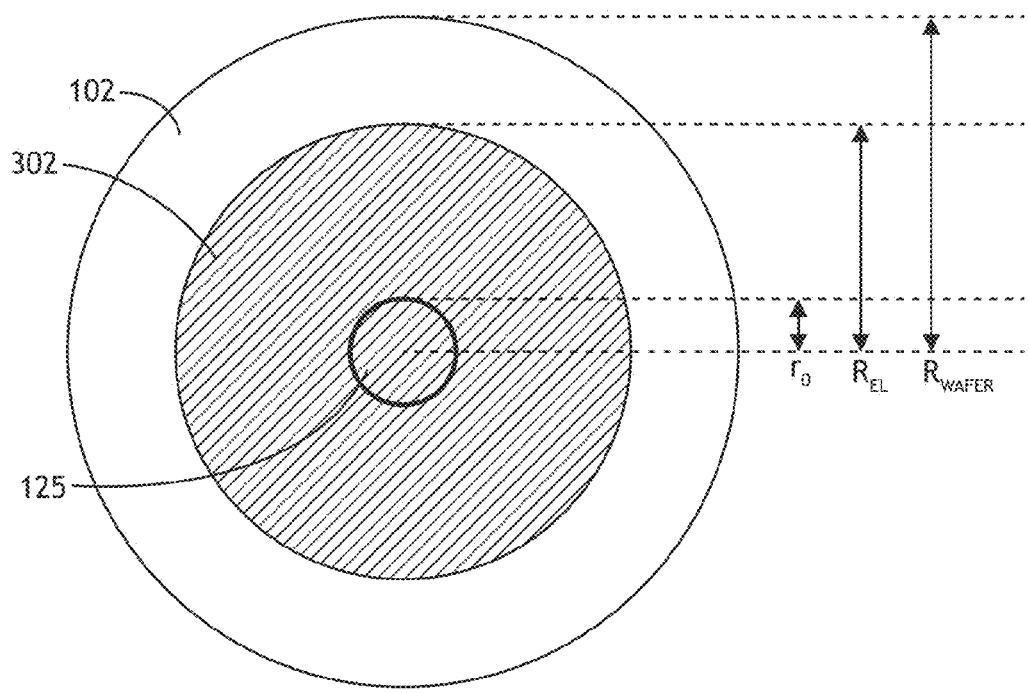
Figure 3C:
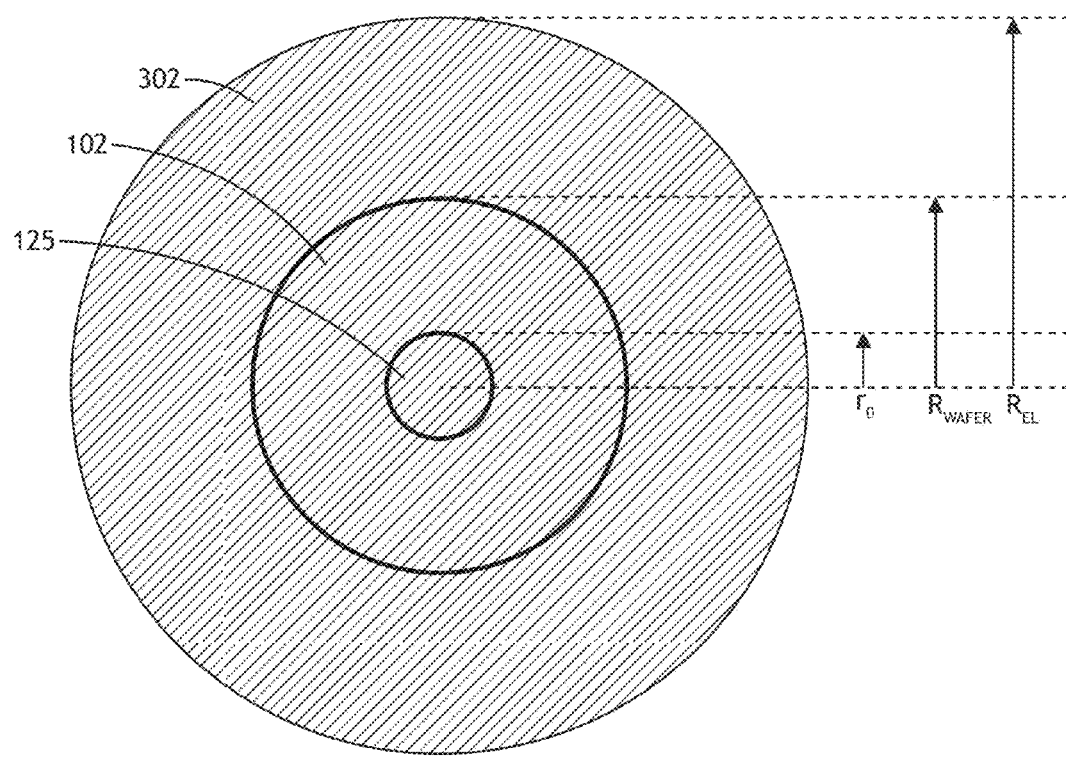

FIG. 2J illustrates a flow diagram depicting a method 230 for contactless measurement of one or more characteristics of one or more p-n junctions, in accordance with one or more embodiments of the present invention. Step 291 includes illuminating one or more illumination areas of a first surface of a p-n junction with intensity modulated light at a modulation frequency. Step 292 includes measuring a first junction photovoltage signal from one or more first areas within the one or more illumination areas with one or more transparent electrodes. Step 293 includes measuring a second junction photovoltage signal from one or more second areas of the first surface of the p-n junction outside of the one or more illumination areas with one or more second electrodes. Step 294 includes measuring a third junction photovoltage signal from one or more third areas of the first surface of the p-n junction outside of the one or more illumination areas with one or more third electrodes. Step 295 includes illuminating the one or more illumination areas of the first surface of the p-n junction with pulsed light. Step 296 includes measuring a decay curve of a sum of an additional pulse-induced first junction photovoltage signal from the one or more first areas, an additional pulse-induced second junction photovoltage signal from the one or more second areas or an additional pulse-induced third junction photovoltage signal from the one or more third areas. Step 297 includes determining a p-n junction conductance based on the measured decay curve. Step 298 includes determining a sheet resistance of a top layer of the p-n junction FIGS. 3A-3C illustrate a system 300 for non-contact measurement of one or more characteristics of one or more p-n junctions, in accordance with one or more embodiments of the present invention. For example, system 300 may be utilized to measure conductance, leakage current or shunt resistance $R_{sh}$ of a p-n junction 103. It is noted herein that the previous description with respect to the various embodiments, processes and components associated with system 100 (and the related methods) should be interpreted to extend to system 300, unless otherwise noted.

In one embodiment, the system 300 includes a grounded chuck 104 suitable for securing the substrate 102, as described previously herein. In another embodiment, the system 300 includes a JPV measurement unit 301 includes a transparent electrode 302. In another embodiment, the transparent electrode 302 is positioned proximate to the semiconductor wafer 102 including a doped layer 106 having sheet resistance, $R_{s1}$.

In another embodiment, the transparent electrode is optically coupled through a fiber bundle 105 (or lens) with the illumination source 107 (e.g., LED or laser diode). In another embodiment, the illumination source 107 is coupled to an illumination source drive 108 (e.g., LED driver). In another embodiment, a signal generator 109 is used to supply a modulated or pulsed signal to the illumination source driver 108. In another embodiment, fiber bundle 105 (or lens) and light source 107 are actuatable in the x- and y-directions. In one embodiment, the system 300 includes two linear stages to provide linear motion along both the x- and y-directions (e.g., linear scanning). In another example, the system 300 includes a rotational stage and a linear stage to provide motion control along r, θ directions (e.g., spiral scanning). In this regard, the system 300 may scan the wafer 102 at multiple points across the wafer 102, thereby forming a map of the p-n junction conductance. This process is particularly useful as it allows for the generation of a conductance map without movement of the electrode 302 and the wafer 102.

In another embodiment, the chuck 104 is actuatable in x- and y-directions to provide measurements at different spots of wafer 102, allowing the system 300 to map the p-n junction conductance of the wafer 102. In another embodiment, the electrode 302 is connected a preamplifier 303, which is coupled to a signal demodulator or pulse transient detector 305, as described previously herein. In another embodiment, the generator 109 and the demodulator 305 are communicatively coupled to the controller 121, as described previously herein.

In another embodiment, the system 300 includes a generator and electrical switch, as described previously herein, may include a generator and electrical switch, which selectably connects the chuck 104 to electrical ground or the signal generator. In another embodiment, the system 300 may include an additional transparent electrode 304, which is conducting and grounded so as to diminish parasitic electrical signals. In one embodiment, the electrode 302 and electrode 304 may include a conducting TCO coatings, such as, but not limited to, ITO or Al:ZnO coatings, disposed on the bottom and top surfaces of a transparent plate (e.g., glass, quartz or sapphire plate) (i.e., one conductive coating on each side of a single plate). In another embodiment, the electrode 302 and the electrode 304 may be formed on separate transparent plates. The transparent electrode 302 and/or transparent electrode 304 may take on any shape known in the art, such as, but not limited to, a disc shape, a square shape, a rectangle shape, an oval shape, a ring shape, a polygon and the like.

FIG. 3B-3C depict a set of non-limiting JPV probe dimensions with respect to wafer diameter and sample dimensions, in accordance with one or more embodiments of the present disclosure. For example, as shown in FIG. 3B, the electrode radius $R_{EL}$ of the transparent electrode 302 is larger than the radius, $r_0$, of the light beam 125 (i.e., illumination area) and smaller than the radius, $R_W$, of the wafer 102. By way of another example, as shown in FIG. 3C, the electrode radius $R_{EL}$ of the transparent electrode 302 is larger than both the radius, $r_0$, of the light beam 125 and the radius, $R_W$ of the wafer 102.

Figure 3D:
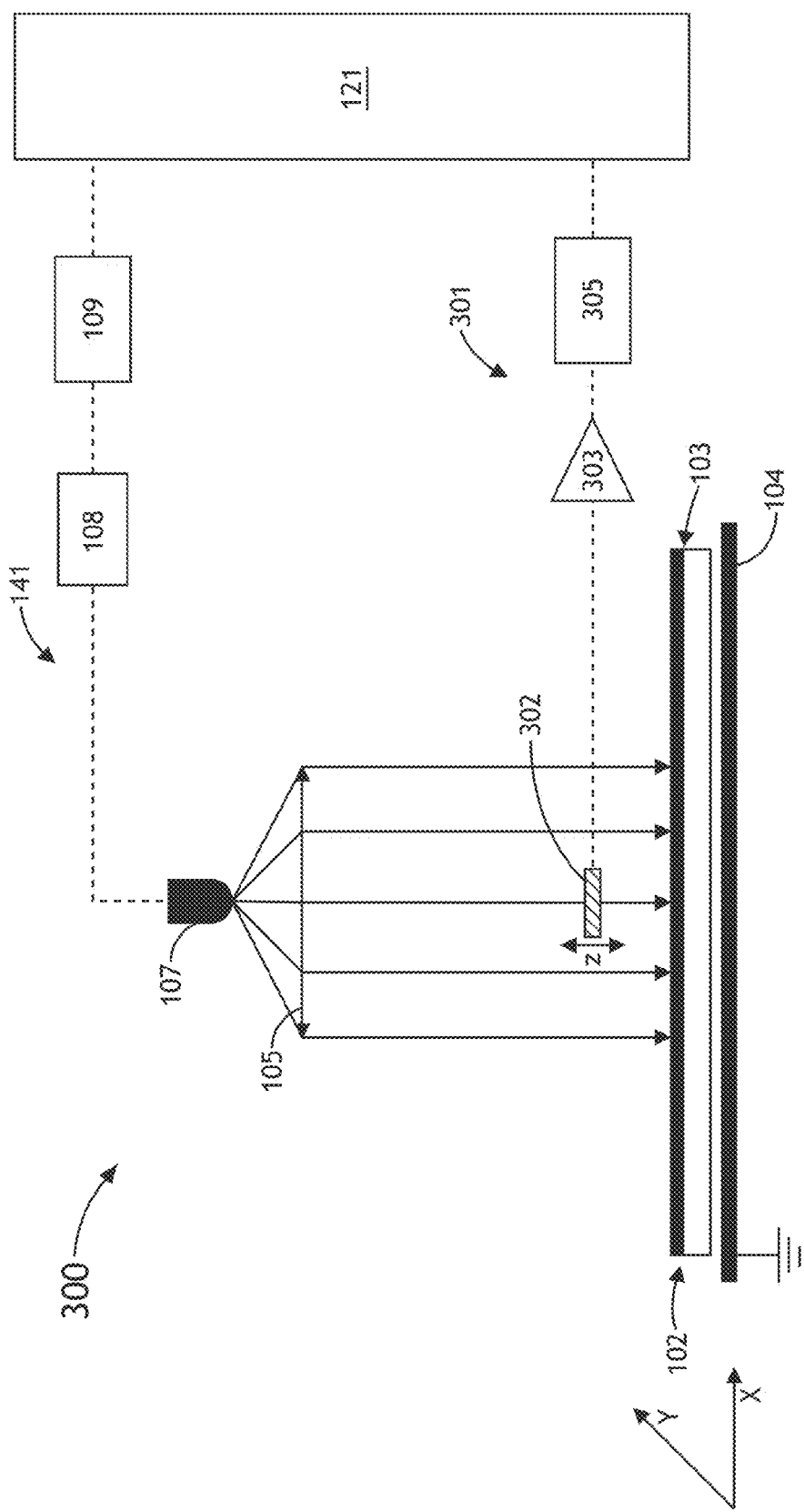
Figure 3E:
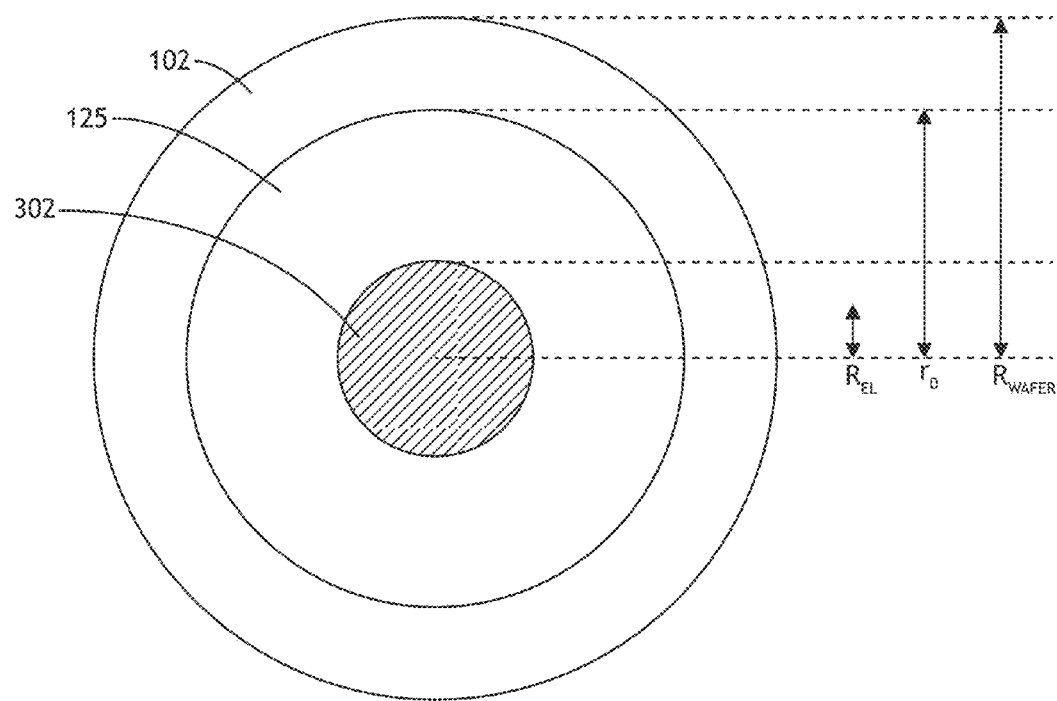
Figure 3F:
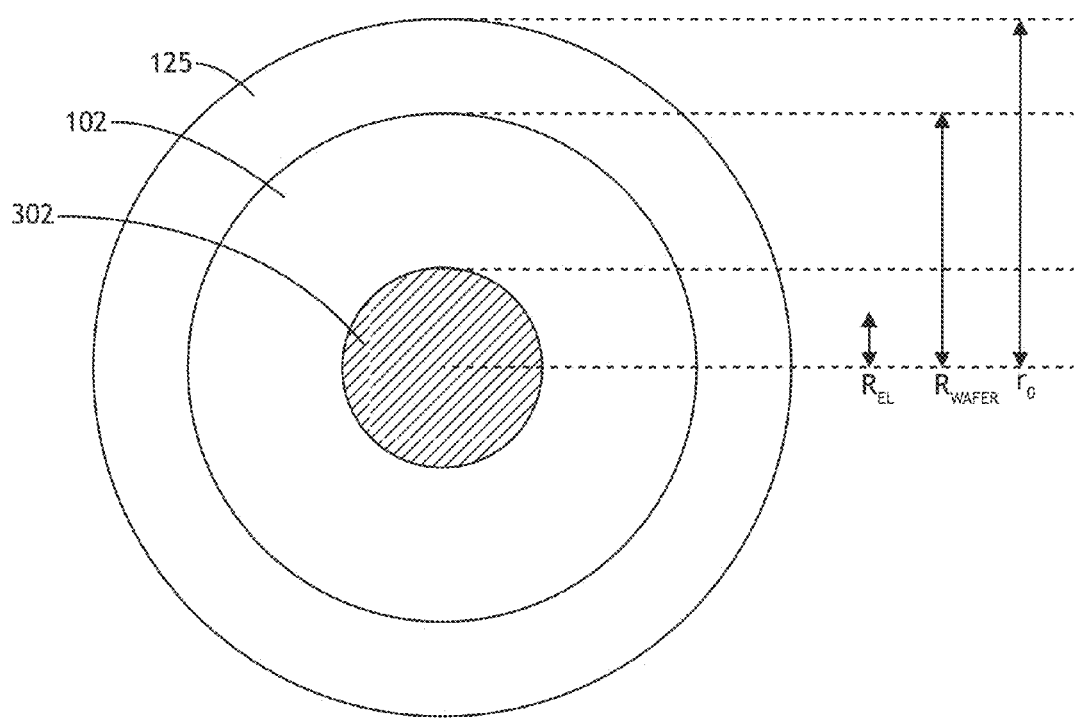

FIGS. 3D-3F illustrate the system 300 for non-contact measurement of one or more characteristics of one or more p-n junctions equipped with a vibrating electrode 302, in accordance with one or more embodiments of the present invention. In one embodiment, the lens 105 of system 300 is larger than the electrode 302, which provides for straightforward measurement of the JPV signal inside of the illumination area. In one embodiment, the electrode 302 is configured to vibrate in the z-direction. In this regard, the electrode can operate in a Kelvin probe configuration, providing dc measurements of surface potential.

FIGS. 3E and 3F depict a set of non-limiting JPV probe dimensions with respect to wafer diameter and sample dimensions, in accordance with one or more embodiments of the present disclosure. For example, as shown in FIG. 3E, the electrode radius $R_{EL}$ of the transparent electrode 302 is smaller than the radius, $r_0$, of the light beam 125 (i.e., illumination area) and smaller than the radius, $R_W$, of the wafer 102. By way of another example, as shown in FIG. 3F, the electrode radius $R_{EL}$ of the transparent electrode 302 is smaller than both the radius, $r_0$, of the light beam 125 and the radius, $r_0$, of the light beam is larger than the radius, $R_W$, of the wafer 102.

Figure 3G:
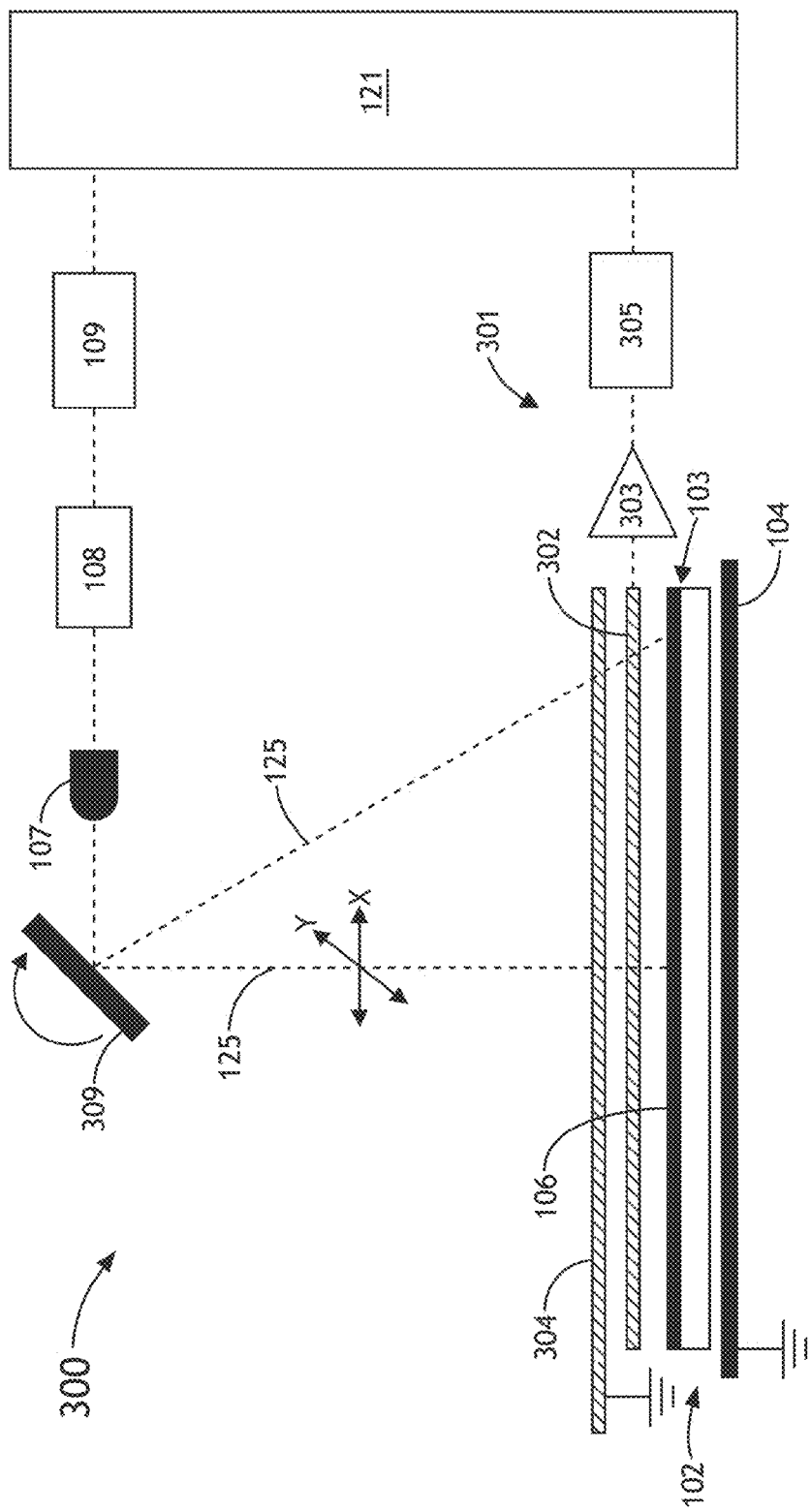

FIG. 3G illustrates the system 300 for non-contact measurement of one or more characteristics of one or more p-n junctions including one or more rotatable mirrors 309, in accordance with one or more embodiments of the present invention. In one embodiment, the system 300 includes one or more rotatable mirrors 309 arranged so as to provide scanning of the illumination beam 125 across the surface 106 of the wafer 102. For example, the rotatable mirrors 309 may be controlled by the controller 121 so as to scan the beam 125 in a selected pattern in the x- and y-directions, allowing the system 300 to map the conduction of the p-n junction 103 as a function of x- and y-positions.

Figure 3H:
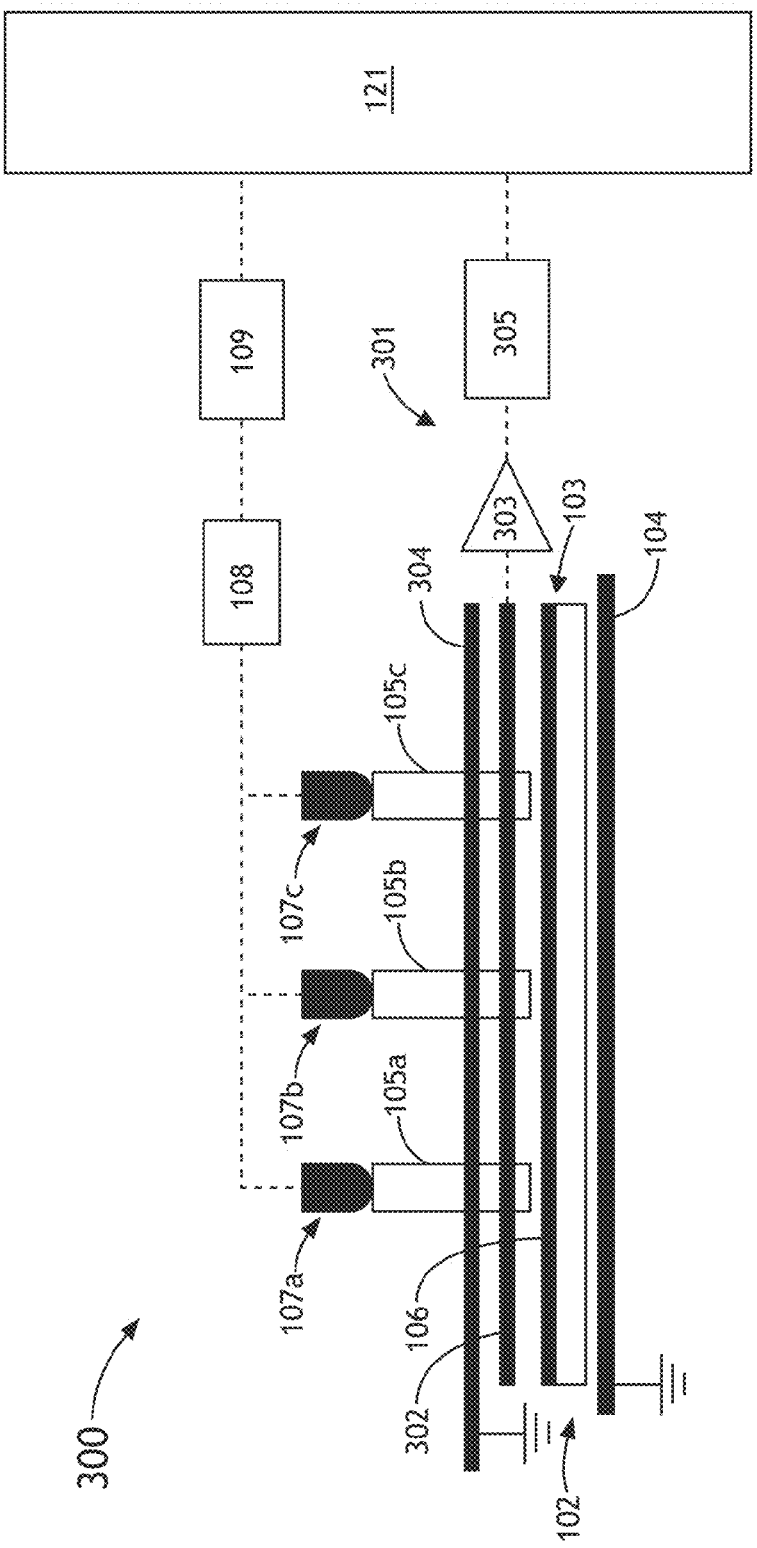
Figure 31:
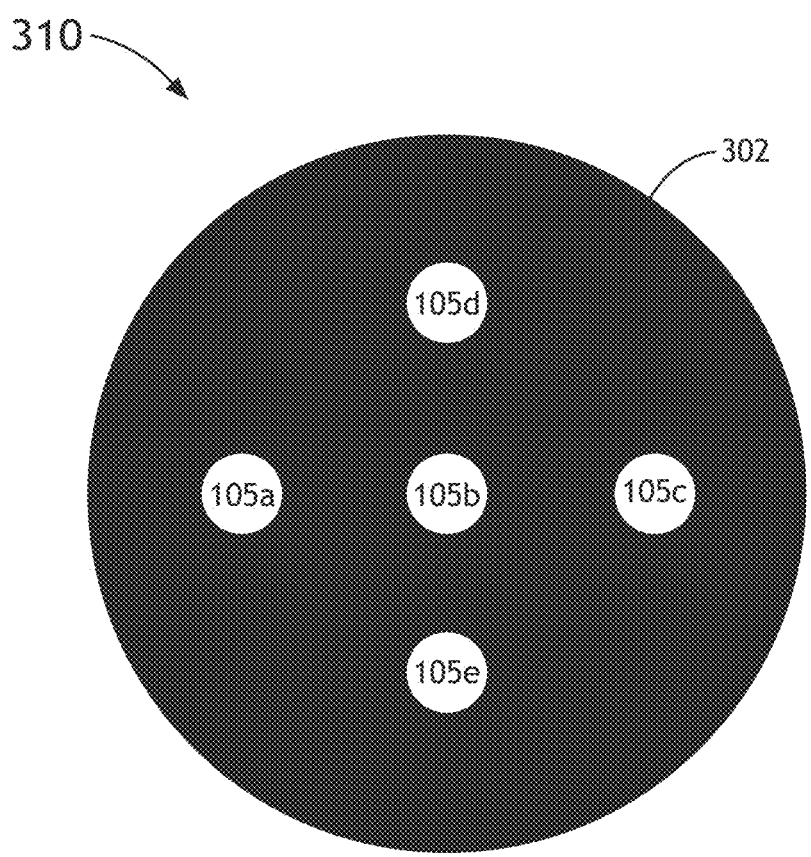

FIG. 3H illustrates the system 300 for non-contact measurement of one or more characteristics of one or more p-n junctions including a large opaque electrode 302 with a set of optical fiber pass throughs 105a-105c, in accordance with one or more embodiments of the present invention. In one embodiment, the opaque electrode 302 is larger electrode diameter is larger than the wafer diameter. For example, the opaque electrode 302 may take on any shape known in the art, such as, but not limited to, a disk-shape, a square-shape, a rectangle-shape, an oval-shape, a polygon-shape and the like. In another embodiment, the system 300 includes a set of optical fibers 105a-105c, where each of the set of optical fibers is couple to one of the set of illumination sources 107a-107c (e.g., set of LED, laser diodes and the like). Further, the output of each of the set of optical fibers 107a-107c is coupled to the semiconductor structure 102. It is noted herein that the configuration of FIG. 3H may provide measurement of p-n junction conductance at multiple points (e.g., 5 or more) on the wafer 102 by switching the illumination sources 107a-107c.

FIG. 3I depicts a top view of the opaque electrode 302 with five optical fibers 105a-105e. It is noted herein that it is contemplated that the embodiment depicted in FIG. 3H may include 5 or more optical fibers and 5 or more illumination sources. It is noted herein that the sideview of FIG. 3H depicts only 3 fibers and sources for purposes of clarity. In another embodiment, the system 300 may include an additional opaque electrode 304 for diminishing parasitic electrical signals.

The basis of the measurement of the p-n junction conductance or shunt resistance is the use of photo-excitation of excess carriers in the p-n junction 103 of wafer 102 and the subsequent monitoring of the JPV signals V(f) at least at two light modulating frequencies $f=f_1$ and $f=f_2$, or the JPV transient responsive to pulsed light, V(t), with a large transparent electrode 302 (e.g., see FIG. 3A).

Using equations (1-8) the magnitudes of JPV signal from transparent electrode 302 as a function of frequency f for a electrode with radius $R_{EL}$ smaller than wafer radius, $R_W$, is given by:

$$V(f, R_S, C_{pn}, G_{pn}) = \qquad (75)$$

$$C\frac{q(1-R)\Phi_0 R_S}{k^2}\left\{1 - 2\frac{R_{EL}}{r_0}I_1(kr_0)\left[K_1(kR_{EL}) - \frac{K_1(kR_W)}{I_1(kR_W)}I_1(kR_{EL})\right]\right\}$$

Where $$\Phi_0 = \int\int_S \phi_0(x, y)dxdy \qquad (76)$$

Where $I_0(z)$, $I_1(z)$, are again the modified Bessel function of the first kind; $K_0(z)$, $K_1(z)$ are the modified Bessel function of the second kind; $\Phi_0$ is the total light flux.

If $Abs(k^{-1}) \ll R_W$ the signal may be determined using the simplified relationship:

$$V(f, R_S, C_{pn}, G_{pn}) = C \frac{q(1-R)\Phi_0 R_S}{k^2} \left[1 - 2\frac{R_{EL}}{r_0} I_1(kr_0) K_1(kR_{EL})\right] \quad (77)$$

The p-n junction conductance can be determined using JPV signals $V_{f1}$ and $V_{f2}$ measured at different frequencies $f_1$ and $f_2$, the sheet resistance Rs, substrate (absorber) doping Na, formulas (75) or (77) and equations:

$$\frac{V(f_1, R_S, C_{pn}, G_{pn})}{V(f_2, R_S, C_{pn}, G_{pn})} = \frac{V_{f1}}{V_{f2}} \quad (78)$$

$$C_{pn} = \sqrt{\frac{q^2 \varepsilon_0 \varepsilon_s N_A}{2\left(E_g - kT\ln\left(\frac{N_V}{N_A}\right)\right)}} \quad (79)$$

Where Na represents substrate doping, Nv is the density of states in the conduction band, $E_g$ band gap, and $\epsilon_s$, $\epsilon_0$ are again the permittivity of vacuum and the semiconductor. In the case of p-i-n structures (e.g., GaN LED structures), $C_{pn} = \epsilon_s \epsilon_0 / d$ where d is the thickness of i active layer.

In the case where the electrode is large and $kR_{EL} \gg 1$, when the electrode is covering the JPV area (or $R_{EL} > R_W$), the formulas (9) and (11) will be similar to the one dimensional case:

$$V(f, C_{pn}, G_{pn}) = \frac{q(1-R)\Phi_0}{G_{pn} + 2\pi i f C_{pn}} \quad (80)$$

$$|V(f, C_{pn}, G_{pn})| = \frac{q(1-R)\Phi_0}{G_{pn}\sqrt{1 + 4\pi^2 f^2 C_{pn}^2 / G_{pn}^2}} \quad (81)$$

In this case, the frequency dependence V(f) is similar to the dimensional case and can be described using a cut off frequency $f_C = G_{pn}/(2\pi C_{pn})$. As shown in FIG. 2A, (curves 221, 222 and 223) an increase of the electrode radius leads to an increase in the dependence of JPV V(f) on the light modulating frequency and the appearance of a clear cut-off frequency fc, 224. When $R_{EL} > R_W$ this behavior is similar to one dimensional case described by formulas (14) and (15) above. If $R_{EL} < R_W$ the formulas (80) or (81) may be used for calculation of Rsh.

When $R_{EL} > R_W$, the p-n junction conductance can be calculated using formula JPV signals $V_1$ and $V_2$ at frequencies $f_1$ and $f_2$ and formula:

$$R_{SH} = \frac{1}{2\pi C_{pn}} \sqrt{\frac{V_1^2 - V_2^2}{f_2^2 V_2^2 - f_1^2 V_1^2}} \quad (82)$$

Junction conductance, and thus shunt resistance, may be determined using the system 300 and measurements of the JPV transient through the application of the light impulse defined by: $\Phi = 0$ if $t < 0$ and $t > t_0$ and $\Phi = \Phi_0$ if $0 < t < t_0$. Where $t_0$ is the duration of impulse.

In the event the electrode covers the JPV area, an entire p-n junction or wafer, then based on the Ostrogradski-Gauss theorem and equation (1):

$$\int\int_S \left(\frac{\partial^2 v_0}{\partial x^2} + \frac{\partial^2 v_0}{\partial y^2}\right) dxdy = \oint_l \frac{\partial v_0}{\partial n} dl = 0 \quad (83)$$

$$C_{pn} \frac{\partial V}{\partial t} + G_{pn} V - q(1-R)\eta\Phi = 0$$

(84)
Where $$V(t) = \int\int_S v(x, y, t) dxdy, \quad (85)$$

Where S and l are the area and perimeter respectively, of electrode, and n is the vector perpendicular to the perimeter of electrode.

The solution of equation (84) provides:

$$V(t) = V_0\left[1 - \exp\left(-\frac{t}{\tau}\right)\right] \text{ if } 0 < t < t_0 \quad (86)$$

$$V(t) = V_0\left[1 - \exp\left(-\frac{t_0}{\tau}\right)\right] \exp\left(-\frac{t-t_0}{\tau}\right) \text{ if } t < t_0 \quad (87)$$

Where $\tau = C_{pn}/G_{pn}$, $V_0 = q(1-R)\eta\Phi_0 G_{pn}$, $t_0$ is the duration of the light impulse.

As shown at FIG. 2E, in the case where the diameter of the electrode is larger than the diameter of the wafer, the JPV decay is in the logarithmic scale 229 and is determined by the one-dimensional solution (87). If $R_{EL} < R_W$ (e.g., curves 227, 228) then the initial part of decay (at low $t < t_M$) is determined by the one dimensional solution (87) and $R_{SH}$, but if $t > t_M$ then the decay also depends the sheet resistance $R_S$. If diameter of electrode is lower than diameter of wafer JPV the $R_{SH}$ can be determined from the slope B of the tangent 229 Tan(t)=A+B(t-$t_0$) to curves JPV(t) 227 and 228 crossing the initial value JPV(t=0):

$$R_{SH} = \frac{1}{BC_{pn}} \quad (88)$$

Figure 3J:
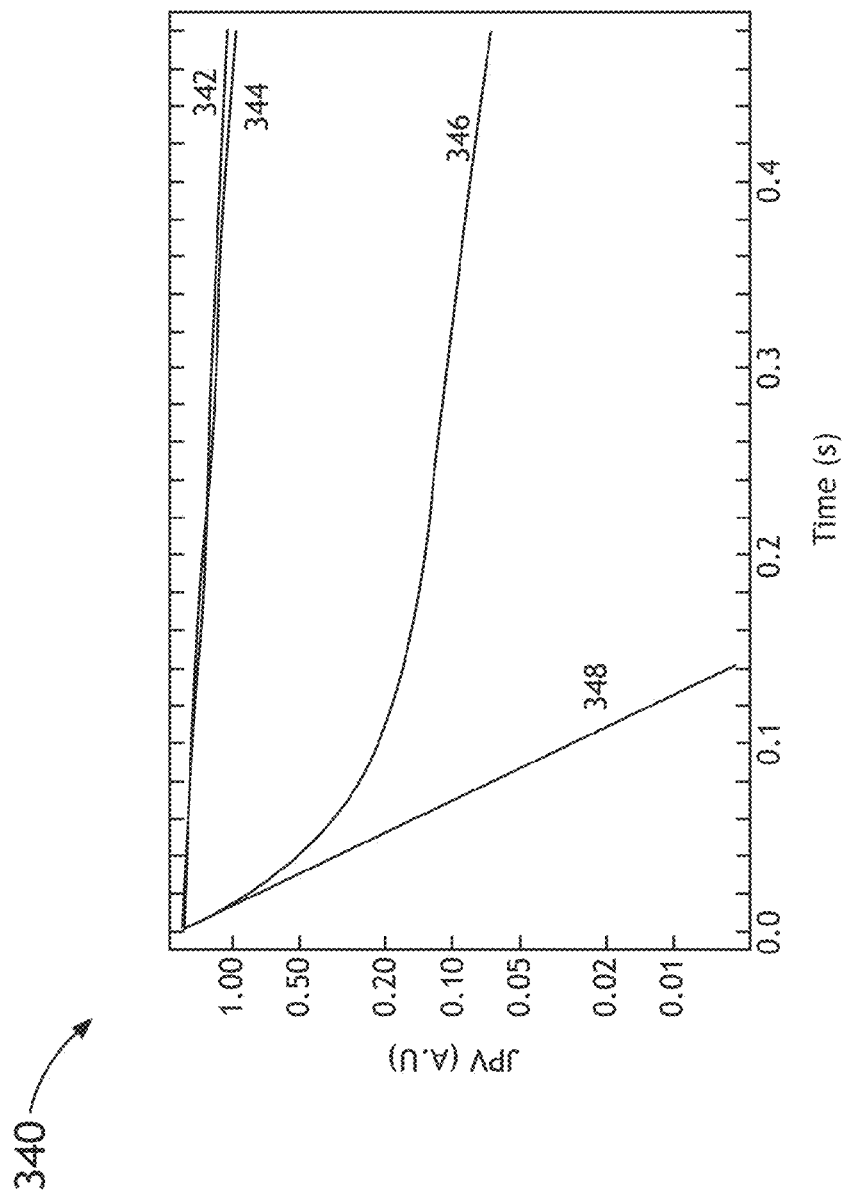
FIG. 3J illustrates a graph depicting a series of simulated JPV signals as a function of time, in accordance with one or more embodiments of the present disclosure.

This tangent method and formula (87) may also be used for mapping the p-n junction conductance with spatial resolution not limited by the electrode dimensions. For example, as shown in FIG. 3J, for $R_{EL}$=7 cm the tangent to the 2D simulated equation curve 346 for the wafer with lower shunt resistance in the middle 1 cm area of the wafer coincides with one dimensional decay 348, which corresponds to the local shunt resistance $R_{SH}$=0.25*10$^6$ Ohm*cm$^2$.

Figure 3K:
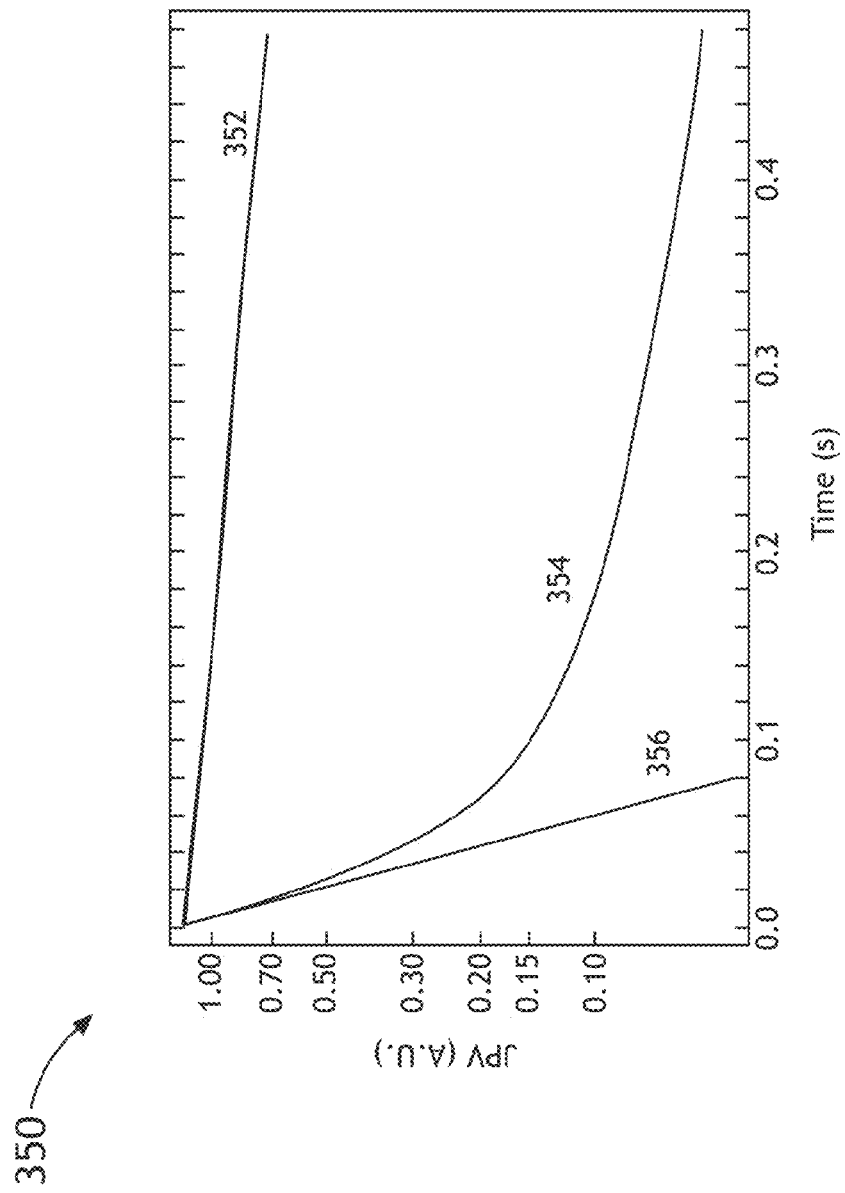
FIG. 3K illustrates a graph depicting a series of simulated JPV signals as a function of time, in accordance with one or more embodiments of the present disclosure, in accordance with one or more embodiments of the present disclosure.

FIG. 3K illustrates a spatial resolution similar to the configurations depicted in FIGS. 3D-3F with small electrode $R_{EL}$=0.35 cm and large illumination area covering wafer $r_0 > R_W$. As shown in FIG. 3K, the tangent to 2D simulated equation (1) curve 354 for the wafer with lower shunt resistance in the middle 1 cm area of the wafer coincides with one dimensional decay 356, which corresponds to the local shunt resistance $R_{SH}$=0.25*10$^6$ Ohm*cm$^2$. A wafer with uniform $R_{SH}=10^7$ Ohm*cm² JPV decay coincides with one the dimensional case, correspond to curve 352.

The sheet resistance of a top p-type Mg doped layer of different GaN LED structures has been measured before and after annealing. Typical values of the sheet resistance of the layer of annealed wafers was found to be in the range 0.2*10⁶ Ohm/sq-10⁶ Ohm/sq and approximately 10⁷ Ohm/sq for unannealed wafers.

Figure 3L:
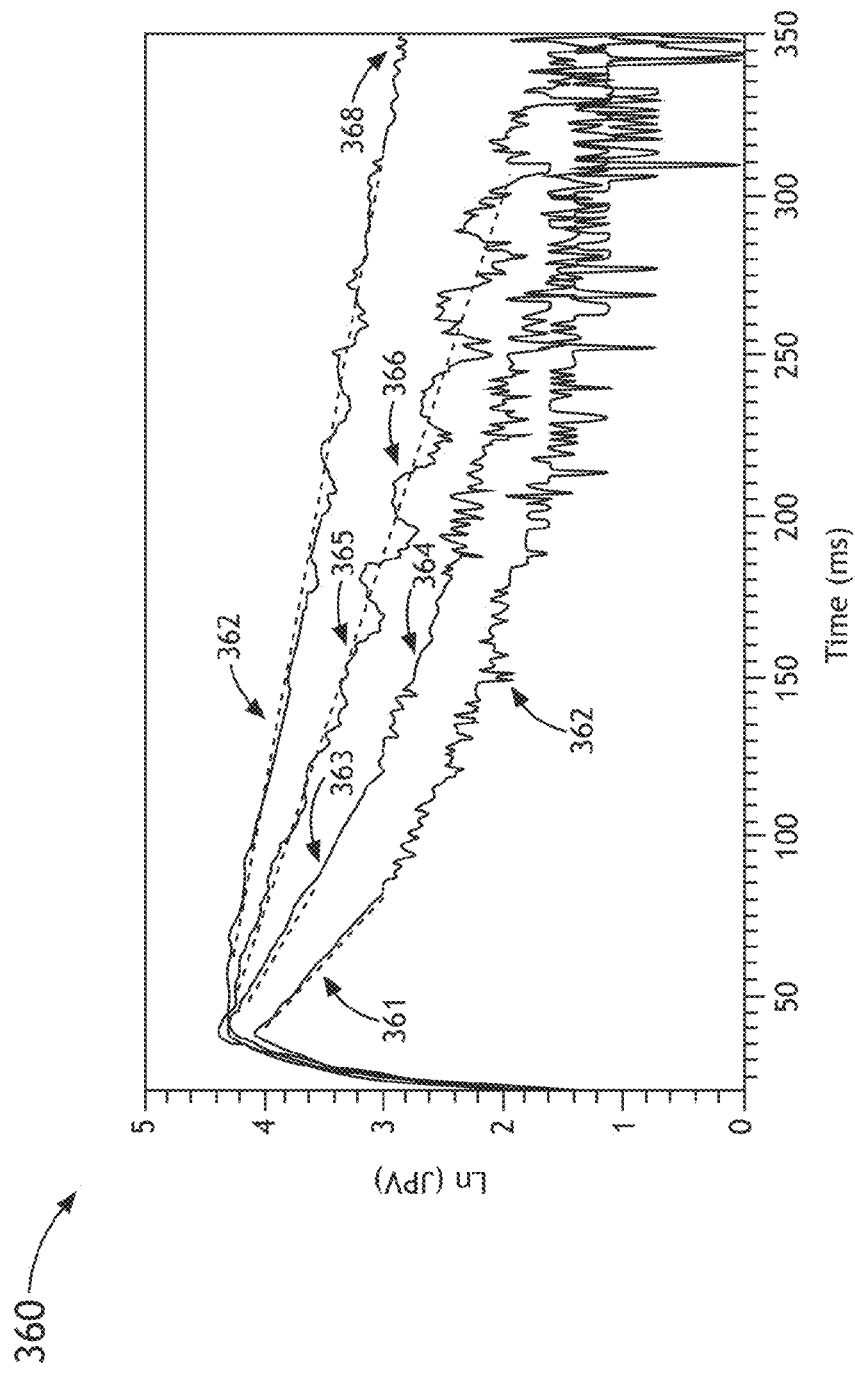
FIG. 3L illustrates a graph depicting a Ln(JPV) curve acquired from a series of electrode configurations as a function of time and corresponding tangent lines, in accordance with one or more embodiments of the present disclosure.

FIG. 3L depicts a graph 360 illustrating examples of experimental JPV ln(V(t)) transient curves 362, 364, 366 and 368 of four GaInN wafers. Utilizing the tangent lines 361, 363, 365, 367 to the curves 362, 364, 366 and 368 as well as an assumed capacitance value of $C_{pn}=10^{-7}$ F/cm² and formula (88), shunt resistance of the wafers was measured, providing the following: $R_{SH}=0.42*10^6$ Ohm*cm² for curve 362, $R_{SH}=0.645*10^6$ Ohm*cm² for curve 364, $R_{SH}=1.14*10^6$ Ohm*cm² for curve 366 and $R_{SH}=1.96*10^6$ Ohm*cm² for curve 368.

Figure 3M:
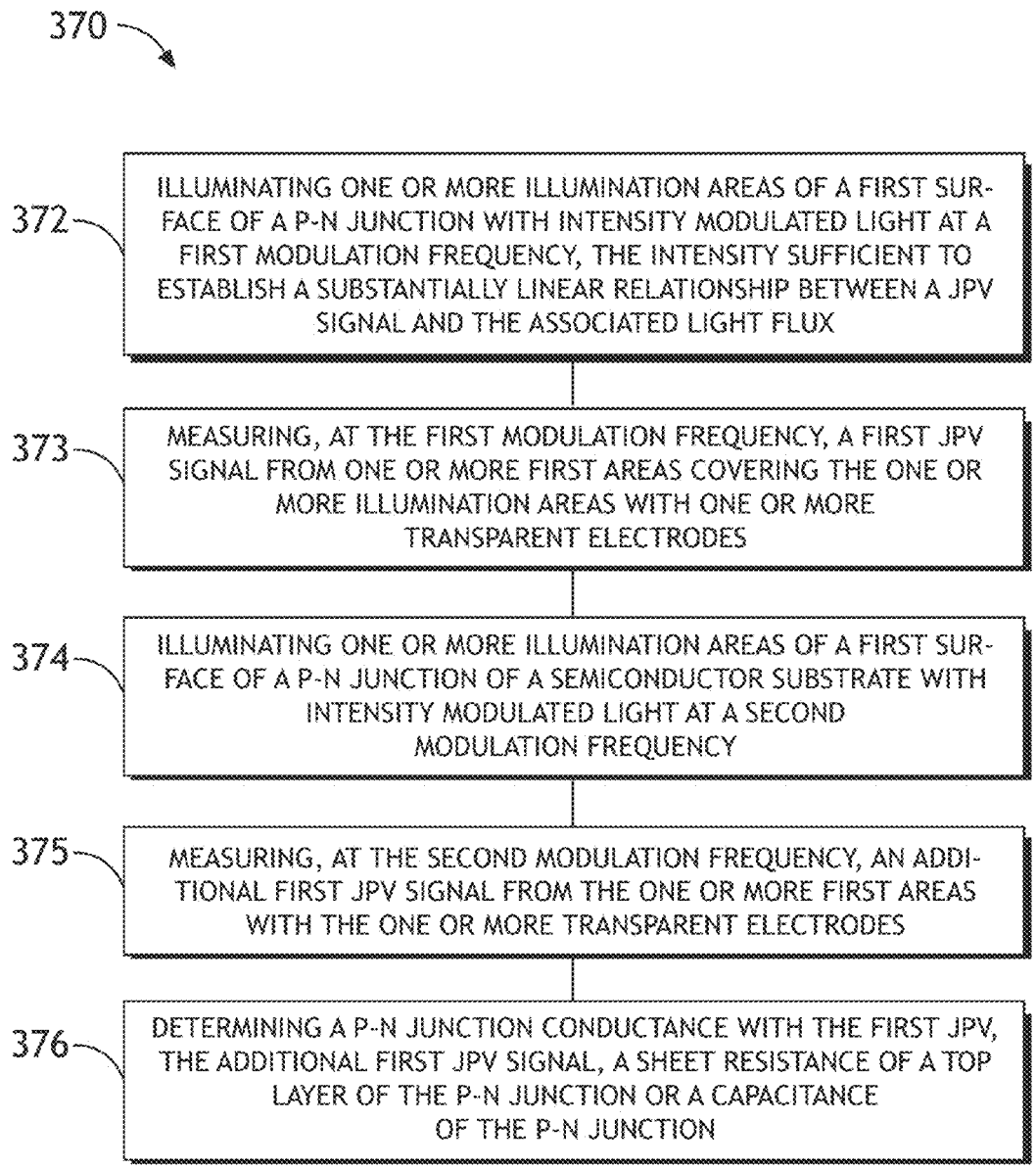
FIGS. 3M-3N illustrate methods for contactless measurement of one or more characteristics of a p-n junction, in accordance with one or more embodiments of the present disclosure.

FIG. 3M illustrates a flow diagram 370 depicting a method for determining conduction in a p-n junction, in accordance with one or more embodiment to the present disclosure. Step 372 includes illuminating one or more illumination areas of a first surface of a p-n junction with intensity modulated light at a first modulation frequency, the intensity sufficient to establish a substantially linear relationship between a junction photovoltage signal and the associated light flux. Step 373 includes measuring, at the first modulation frequency, a first junction photovoltage signal from one or more first areas covering the one or more illumination areas with one or more transparent electrodes. Step 374 includes illuminating one or more illumination areas of a first surface of a p-n junction of a semiconductor substrate with intensity modulated light at a second modulation frequency. Step 375 includes measuring, at the second modulation frequency, an additional first junction photovoltage signal from the one or more first areas with the one or more transparent electrodes. Step 376 includes determining a p-n junction conductance with the first junction photovoltage signal, the additional first junction photovoltage signal, a sheet resistance of a top layer of the p-n junction or a capacitance of the p-n junction.

Figure 3N:
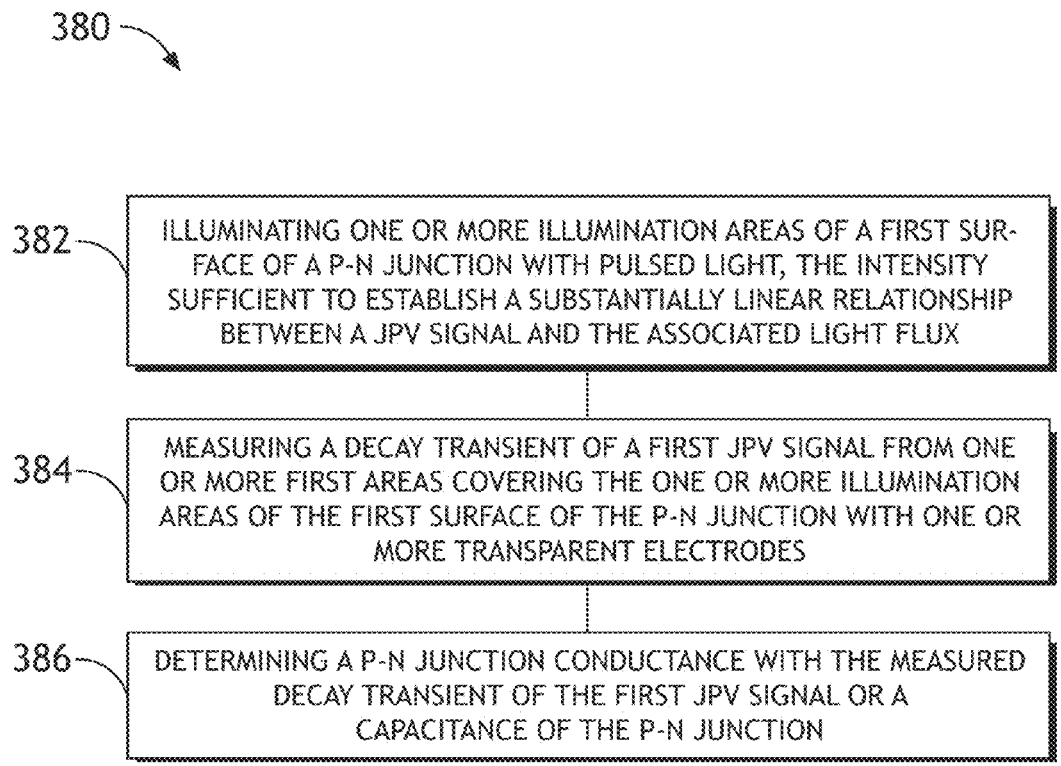

FIG. 3N illustrates a flow diagram 380 depicting a method for determining conduction in a p-n junction, in accordance with one or more embodiment to the present disclosure. Step 380 includes illuminating one or more illumination areas of a first surface of a p-n junction with pulsed light, the intensity sufficient to establish a substantially linear relationship between a junction photovoltage signal and the associated light flux. Step 382 includes measuring a decay transient of a first junction photovoltage signal from one or more first areas covering the one or more illumination areas of the first surface of the p-n junction with one or more transparent electrodes. Step 386 includes determining a p-n junction conductance with the measured decay transient of the first junction photovoltage signal or a capacitance of the p-n junction.

It is further recognized that the controller 121 may execute one or more steps of any of the various methods described throughout the present disclosure. In this regard, the methods disclosed may be implemented as a set of program instructions. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented In one embodiment, the controller 121 includes one or more processors and memory (e.g., non-transitory memory). The one or more processors of controller 121 may include any one or more processing elements known in the art. In general, the term "processor" may be broadly defined to encompass any device having one or more processing elements, which execute program instructions from a non-transitory memory medium. The one or more processors may include any microprocessor-type device configured to execute software algorithms and/or program instructions. In one embodiment, the one or more processors may include any one of a desktop computer, mainframe computer system, workstation, image computer, parallel processor, or other computer system (e.g., networked computer) configured to execute a set of program instructions configured to operate the systems 100 and/or 600, as described throughout the present disclosure. It should be recognized that the steps described throughout the present disclosure may be carried out by a single controller or, alternatively, multiple controllers. The memory may include any storage medium known in the art suitable for storing program instructions executable by the associated one or more processors of controller 121. For example, the memory may include, but is not limited to, a read-only memory, a random access memory, a magnetic or optical memory device (e.g., disk), a magnetic tape, a solid state drive and the like. In another embodiment, it is noted herein that the memory is configured to store one or more results from the one or more of the various subsystems of system 100 and/or system 600. In another embodiment, the memory may be located remotely with respect to the physical location of the processors and controller 121. For instance, the one or more processors of controller 121 may access a remote memory (e.g., server), accessible through a network (e.g., internet, intranet and the like).

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus for contactless measurement of one or more characteristics of one or more p-n junction layers of a semiconductor substrate comprising:
   an illumination unit including an illumination source for illuminating an illumination area of a first surface of semiconductor substrate including a p-n junction with light including at least one of intensity modulated light or pulsed light;
   a first junction photovoltage measurement unit including at least a first electrode positioned proximate to the first surface of the p-n junction, the first electrode position within the illumination area or at least laterally proximate to the illumination area;
   a second junction photovoltage measurement unit including at least a second electrode positioned proximate to the first surface of the p-n junction, the second electrode laterally positioned proximate to the first electrode;
   a third junction photovoltage measurement unit including at least a reference electrode positioned proximate to the first surface of the p-n junction, the reference electrode laterally positioned outside of the illumination area;
   a controller communicatively coupled to at least one of the first junction photovoltage measurement unit, the second junction photovoltage measurement unit or the third junction photovoltage unit, the controller configured to:
   receive a first junction photovoltage signal for the p-n junction and a first calibration junction photovoltage signal for a calibration p-n junction from the first junction photovoltage measurement unit;
   receive a second junction photovoltage signal for the p-n junction and a second calibration junction photovoltage signal for the calibration p-n junction from the second junction photovoltage measurement unit;
   receive a third junction photovoltage signal for the p-n junction and a third calibration junction photovoltage signal for the calibration p-n junction from the third junction photovoltage measurement unit;
   determine at least one of a corrected first junction photovoltage signal or a corrected second junction photovoltage signal with at least one of the received first junction photovoltage signal, the received second junction photovoltage signal or the received third junction photovoltage signal from the reference electrode, wherein the corrected first junction photovoltage signal is determined as a function of the first junction photovoltage signal from the first electrode and the third junction photovoltage from the reference electrode, wherein the corrected second junction photovoltage signal is determined as a function of the second photovoltage from the second electrode and the third junction photovoltage from the reference electrode;
   determine at least one of a corrected first calibration junction photovoltage signal or a corrected second calibration junction photovoltage signal with at least one of the received first calibration junction photovoltage signal, the received second calibration junction photovoltage signal or the received third calibration junction photovoltage signal; and
   determine a sheet resistance of the p-n junction of the semiconductor substrate with at least one of the corrected first junction photovoltage signal, the corrected second junction photovoltage signal, the corrected first calibration junction photovoltage signal, the corrected second calibration junction photovoltage signal or the known sheet resistance of the calibration p-n junction.

2. The apparatus of claim 1, wherein the first electrode is a transparent electrode positioned within the illumination area, wherein the first electrode is configured to transmit illumination from the illumination source to the first surface of the p-n junction.

3. The apparatus of claim 2, wherein the first electrode comprises:
   a transparent conducting oxide (TCO) coating disposed on a transparent substrate.

4. The apparatus of claim 3, wherein the transparent substrate comprises:
   at least one of a quartz, sapphire or glass substrate.

5. The apparatus of claim 1, wherein the first electrode is an opaque electrode positioned outside and proximate to the illumination area.

6. The apparatus of claim 5, wherein the first electrode is arranged concentrically with the illumination area.

7. The apparatus of claim 1, wherein the second electrode is an opaque electrode positioned outside of the illumination area and proximate to the first electrode.

8. The apparatus of claim 7, wherein the second electrode is arranged concentrically with the first electrode.

9. The apparatus of claim 1, further comprising:
   a grounded electrode surrounding at least one of the first electrode or the second electrode.

10. The apparatus of claim 1, wherein the reference electrode is an opaque electrode positioned outside the illumination area, the reference electrode at a greater distance from the illumination area than at least one of the first electrode or the second electrode.

11. The apparatus of claim 10, further comprising:
    a grounded electrode surrounding the reference electrode.

12. The apparatus of claim 1, wherein the first surface of the p-n junction comprises:
    a front surface of the p-n junction.

13. The apparatus of claim 1, further comprising:
    a fourth junction photovoltage measurement unit including a fourth electrode coextensive with a fourth area of the first surface of the p-n junction, the fourth electrode surrounding at least one of the first electrode or the second electrode.

14. The apparatus of claim 13, wherein the controller is further configured to:
receive a fourth junction photovoltage signal for the fourth area of the surface of p-n junction from the fourth electrode encompassing at least one of first electrode or the second electrode; and
summing the first junction photovoltage, the second junction photovoltage and the fourth junction photovoltage to form a summed junction photovoltage signal.

15. The apparatus of claim 14, wherein the controller is further configured to:
determine a shunt resistance of the p-n junction based on the frequency dependence of the summed junction photovoltage signal.

16. The apparatus of claim 14, wherein the controller is further configured to:
determine a shunt resistance of the p-n junction based on the decay of the summed junction photovoltage signal generated via pulsed light.

17. The apparatus of claim 13, wherein at least one of the first junction photovoltage measurement unit, the second junction photovoltage measurement unit, the third junction photovoltage measurement unit or the fourth junction photovoltage measurement unit further includes:
one or more signal processing elements.

18. The apparatus of claim 1, wherein the illumination source comprises:
an illumination source configured to emit light modulated at a selected modulation frequency.

19. The apparatus of claim 1, wherein the illumination source comprises:
an illumination source configured to emit pulsed light of a selected magnitude and pulse duration.

20. The apparatus of claim 1, wherein the illumination source comprises:
at least one of a light emitting diode, a laser, a flash lamp or a shuttered lamp.

21. The apparatus of claim 1, wherein the illumination unit includes one or more optical fiber bundles arranged to optically couple the output of the illumination source to the illumination area of the first surface of the p-n junction.

* * * * *